United States Patent [19]

Tamura et al.

[11] Patent Number: 5,633,184

[45] Date of Patent: May 27, 1997

[54] METHOD OF MAKING SEMICONDUCTOR DEVICE WITH FLOATING BATE

[75] Inventors: Katsuhiko Tamura; Yukari Imai; Naoko Otani, all of Hyogo-ken, Japan

[73] Assignee: Mitsubishi Denki Kabushiki Kaisha, Tokyo, Japan

[21] Appl. No.: 386,367

[22] Filed: Feb. 9, 1995

Related U.S. Application Data

[62] Division of Ser. No. 114,274, Aug. 31, 1993, Pat. No. 5,434,813.

[30] Foreign Application Priority Data

Sep. 2, 1992 [JP] Japan .................... 4-234757
Aug. 5, 1993 [JP] Japan .................... 5-194881

[51] Int. Cl.[6] ............... H01C 21/8247; H01C 21/265
[52] U.S. Cl. ................... 438/264; 438/594; 438/981
[58] Field of Search ....................... 437/43, 48, 52; 257/316; 148/DIG. 163

[56] References Cited

U.S. PATENT DOCUMENTS

| | | |
|---|---|---|
| 4,868,619 | 9/1989 | Mukherjee et al. . |
| 4,945,068 | 7/1990 | Sugaya ............................. 437/52 |
| 5,081,054 | 1/1992 | Wu et al. ............................. 437/43 |
| 5,138,410 | 8/1992 | Takebuchi . |
| 5,215,934 | 6/1993 | Tzeng ............................. 437/43 |
| 5,278,440 | 1/1994 | Shimoji . |
| 5,359,218 | 10/1994 | Taneda ............................. 257/321 |

FOREIGN PATENT DOCUMENTS

| | | |
|---|---|---|
| 0366423 | 5/1990 | European Pat. Off. . |
| 0368097 | 5/1990 | European Pat. Off. . |
| 4115185A1 | 7/1992 | Germany . |
| 3-129774 | 6/1991 | Japan . |
| 4-133475 | 5/1992 | Japan . |
| 4-188878 | 7/1992 | Japan . |
| 4-208573 | 7/1992 | Japan . |
| 5-13776 | 1/1993 | Japan . |
| 2239347 | 6/1991 | United Kingdom . |

*Primary Examiner*—John Niebling
*Assistant Examiner*—Richard A. Booth
*Attorney, Agent, or Firm*—Lowe, Price, LeBlanc & Becker

[57] ABSTRACT

A semiconductor memory device effectively prevents formation of a gate bird's beak oxide film at a region through which electrons move in data writing and erasing operations. In the semiconductor memory device, nitride films having a thickness larger than that of a first gate oxide film are formed on a drain impurity diffusion layer and a source impurity diffusion layer to surround the first gate oxide film. A floating gate electrode has opposite ends protruded over the nitride films.

20 Claims, 54 Drawing Sheets

METHOD OF MAKING SEMICONDUCTOR DEVICE WITH FLOATING BATE

This application is a division of application Ser. No. 08/114,274 filed Aug. 31, 1993, now U.S. Pat. No. 5,434,813.

BACKGROUND OF THE INVENTION

1. Field of the Invention

The invention relates to a semiconductor memory device and a manufacturing method of the same, and in particular, relates to a semiconductor memory device capable of electrical writing and erasing information and a manufacturing method of the same.

2. Description of the Background Art

EEPROMs (Electrically Erasable Programmable Read Only Memories) have been known as one type of nonvolatile memory semiconductor devices capable of electrically writing and erasing information. The Flash EEPROM is advantageous in that both writing and erasure can be done electrically. However, since two transistors are necessary in the memory cell, it is difficult to realize higher degree of integration. Therefore, a Flash EEPROM has been proposed in which the memory cell includes one transistor, and information charges written therein can be collectively erased electrically. Such a Flash EEPROM is disclosed, for example, in U.S. Pat. No. 4,868,619.

FIG. 106 is a block diagram showing a general structure of a conventional Flash EEPROM. Referring to FIG. 106, the Flash EEPROM includes a memory cell array 330 including a plurality of memory cells (not shown) for storing data arranged in a matrix, a X decoder 331 and a Y decoder 332 for selecting a row and a column of the memory cell array 330 by decoding an external address signal, a Y gate 333, an input/output circuit 335 connected to Y gate 333 for inputting and outputting data, and a control circuit 334 connected to Y gate 333 and to input/output circuit 335 for controlling operation of the Flash EEPROM based on external control signals. X decoder 331, Y decoder 332, Y gate 333 control circuit 334, input/output circuit 335 and memory cell array 330 are formed on the same substrate of a semiconductor chip 336. The semiconductor chip 336 is further provided with a power supply input terminal Vcc 337 and a high voltage input terminal Vpp 338.

FIG. 107 is an equivalent circuit diagram showing the schematic structure of the memory cell array 330 shown in FIG. 106. Referring to FIG. 107, in memory cell array 330 a plurality of word lines $WL_1$, $WL_2$, ..., $WL_i$ extended in the row direction and a plurality of bit lines $BL_1$, $BL_2$, ..., $BL_i$ extending in the column direction are arranged crossing orthogonally with each other. Memory cell transistors $Q_{11}$, $Q_{12}$, ... $Q_{ii}$ each having a floating gate are arranged at crossing points of the word lines and the bit lines. Each memory transistor has its drain connected to each bit line. The memory cell transistor has its control gate connected to each word line. The memory cell transistor has its source connected to the source lines $SL_1$, $SL_2$, ..., respectively. The source lines $SL_1$, $SL_2$, ... are connected to source lines $S_1$, $S_2$, ... arranged on both sides.

FIG. 108 is a cross section showing a construction of a memory cell portion of a conventional Flash EEPROM. Referring to FIG. 108, the conventional Flash EEPROM includes a semiconductor substrate 201 as well as a drain impurity diffusion layer 206 and a source impurity diffusion layer 207 which are formed on a main surface of the semiconductor substrate 201 and are spaced from each other by a predetermined distance with a channel region therebetween. The conventional Flash EEPROM further includes a floating gate electrode 203 formed on the channel region with a first gate oxide film 202 therebetween, a control gate electrode 205 formed on the floating gate electrode 203 with an insulating film 204 therebetween, an interlayer thermal oxide film 208 covering the semiconductor substrate 201, floating gate electrode 203 and control gate electrode 205, and an interlayer insulating film 209 covering the interlayer thermal oxide film 208. Gate bird's beak oxide films 210 are formed at opposite ends of the first gate oxide film 202 and opposite ends of the insulating film 204.

The first gate oxide film 202, floating gate electrode 203, insulating film 204, control gate electrode 205, drain impurity diffusion layer 206 and source impurity diffusion layer 207 form basic components of the two-layer gate Flash EEPROM. The interlayer insulating film 209 contains impurity such as boron or phosphorus. The purpose of the interlayer thermal oxide film 208 is to prevent the movement of the impurity such as boron or phosphorus of the interlayer insulating film 209 into the semiconductor substrate 201, control gate electrode 205 or floating gate electrode 203 and thus to prevent change of the electrical characteristics thereof.

Referring to FIG. 108, an operation of the Flash EEPROM will be described below. The Flash EEPROM operates in a write/erase mode for electrically writing or erasing information and also operates in a read mode for reading information. The write/erase mode includes a write mode for electrically writing the information and an erase mode for erasing the information.

In the erase mode, for example, the drain electrode formed of the drain impurity diffusion layer 206 is set in the floating state, and the control gate electrode 205 is set in the grounded state. A high voltage of about 12 V is applied to a source electrode formed of the source impurity diffusion layer 207. Thereby, a Fowler-Nordheim tunnel current flows from the source impurity diffusion layer 207 to the floating gate electrode 203 through the gate bird's beak oxide film 210 at the source side located under the end of the floating gate electrode 203 near the source impurity diffusion layer 207. This Fowler-Nordheim tunnel current is used to draw the electrons from the floating gate electrode 203, whereby the information is erased.

In the write mode, the source impurity diffusion layer 207, i.e., source electrode is grounded. A voltage, e.g., of about 7 V is applied to the drain electrode, i.e., drain impurity diffusion layer 206, and a voltage, e.g., of about 12 V is applied to the control gate electrode 205. In this state, the avalanche phenomenon occurs in the vicinity of the drain impurity diffusion layer 206 under the end of the floating gate electrode 203. Hot electrons, which are generated by the avalanche phenomenon, are implanted into the floating gate electrode 203 through the gate bird's beak oxide film 210 at the drain side from the semiconductor substrate 201, whereby the information is written.

In the read mode, the source impurity diffusion layer 207, i.e., source electrode is grounded. A voltage, e.g., of 1 V is applied to the drain impurity diffusion layer 206, i.e., drain electrode, and a voltage, e.g., of about 3 V is applied to the control gate electrode 205. In this condition, the state of "1" or "0" is determined by the flow or stop of the current from the drain impurity diffusion layer 206 to the source impurity diffusion layer 207. In this manner, the information is read. If electrons exist in the floating gate electrode 203, the current does not flow from the drain impurity diffusion layer 206 to the source impurity diffusion layer 207. As a result, the written state is read. If the electrons have been drawn from the floating gate electrode 203, the current flows from the drain impurity diffusion layer 206 to the source impurity diffusion layer 207, and consequently the erased state is read.

FIGS. 109–118 are cross sections showing a manufacturing process of the conventional Flash EEPROM shown in FIG. 108. Referring to FIGS. 109–118, a manufacturing process of the conventional Flash EEPROM will be described below.

The semiconductor substrate 201 formed of silicon shown in FIG. 109 is subjected to thermal oxidation to form a first gate oxide film layer 202a of about 120 Å in thickness as shown in FIG. 110.

Then, as shown in FIG. 111, a floating gate electrode layer 203a of about 2000 Å in thickness is formed from polysilicon on the first gate oxide film layer 202a.

As shown in FIG. 112, an insulating film layer 204a is formed to a thickness of about 300 Å on the floating gate electrode layer 203a.

As shown in FIG. 113, a control gate electrode layer 205a of polysilicon is formed to a thickness of about 3000 Å on the insulating film layer 204a.

As shown in FIG. 114, photolithography and etching are used to pattern the first gate oxide film layer 202a, floating gate electrode layer 203a, insulating film layer 204a and control gate electrode layer 205a. Thereby, the first gate oxide film 202, floating gate electrode 203, insulating film 204 and control gate electrode 205 are formed.

As shown in FIG. 115, the first gate oxide film 202, floating gate electrode 203, insulating film 204 and control gate electrode 205 are used as a mask, and As (arsenic) ion is implanted into the semiconductor substrate 201 under the condition of about $3 \times 10^{15}/cm^2$. Thereafter, the thermal diffusion technique is used to diffuse the implanted ion, whereby the drain impurity diffusion layer 206 and the source impurity diffusion layer 207 are formed.

As shown in FIG. 116, the interlayer thermal oxide film 208 is formed to cover the semiconductor substrate 201, floating gate electrode 203 and control gate electrode 205.

As shown in FIG. 117, the interlayer insulating film 209 is formed to cover the interlayer thermal oxide film 208. Finally, as shown in FIG. 118, heat treatment by a reflow method is carried out to flatten the interlayer insulating film 209. During this treatment, oxidizer ($H_2O$) moves into the interlayer insulating film 209 and interlayer thermal oxide film 208, whereby the gate bird's beak oxide films 210 are formed.

The conventional Flash EEPROM is formed in this manner.

As described above, in the conventional Flash EEPROM, the oxidizer ($H_2O$) penetrates the interlayer insulating film 209 and interlayer thermal oxide film 208 during the heat treatment for flattening the interlayer insulating film 209. This causes further oxidization between the semiconductor substrate 201 and the ends of floating gate electrode 203, and between the control gate electrode 205 and the floating gate electrode 203. As a result, the gate bird's beak oxide films 210 are formed. In this manner, the lower end of the floating gate electrode 203 contacts the gate bird's beak oxide films 210, so that the lower end of the floating gate electrode 203 is oxidized to a larger extent as compared with the other portions. If the gate bird's beak oxide films 210 are formed at the lower end of the floating gate 203 near the source impurity diffusion layer 207, the electron is excessively drawn from the floating gate electrode 203 in the data erasing operation, resulting in an over-erased state. If the gate bird's beak oxide films 210 are formed at the end of the floating gate electrode 203 near the drain impurity diffusion layer 206, there is caused a so-called drain disturb phenomenon, in which the electrons are drawn from the floating gate electrode 203 of the unselected memory cell in the data writing operation.

The over-erase phenomenon and drain disturb phenomenon will be described in detail. First, the over-erase phenomenon will be described. In a Flash EEPROM, erasure of all memory cells are carried out at one time and therefore if there is a memory cell through which tunneling current tends to flow easier exists locally, that memory cell is erased earlier than other memory cells. This memory cell which has been erased earlier has electrons therein excessively extracted through the floating gate electrode 203, so that the threshold of the memory cell after erasure becomes negative. This is the so called over-erase phenomenon.

The drain disturbed phenomenon will be described. FIG. 119 is an equivalent circuit diagram explaining the drain disturb phenomenon. Referring to FIG. 119, in a conventional Flash EEPROM, one memory cell includes one transistor, and therefore unlike the conventional EEPROM, there is not a selecting transistor. Therefore, in writing information, write voltage of 7 V is applied to the drain regions of all memory cell transistors connected to same bit line.

More specifically, in the cell selected for writing information, 7 V is applied to the drain region through the bit line $BL_1$, and 12 V is applied to the control gate through the word line $WL_1$. At this time, 7 V is applied also to the drain regions of non-selected cells through the bit line $BL_1$. The non-selected cells with 7 V applied to the drain regions receives 0 V applied to the control gates. At this time, if the non-selected cell is in the written state, electrons have been introduced to the floating gate. More specifically, the potential of the floating gate is at about –3 V. If 7 V is applied to the drain region and 0 V (non-selected state) is applied to the control gate of the non-selected cell in this state, there is generated an electric field as high as 10 MV/cm between the floating gate and the drain region. This causes drain disturb. FIG. 120 is a cross section showing the drain disturb caused by FN tunneling, and FIG. 121 is a cross section showing the drain disturb caused by tunneling between bands.

Referring to FIG. 120, if a high electric field as high as 10 MV/cm is generated between the floating gate electrode 203 and the drain impurity diffusion layer 206, the electrons which have been introduced to the floating gate electrode 203 are extracted to the drain impurity diffused layer 206 because of FN tunneling phenomenon. Consequently, the memory cell is erroneously erased. This is the so called drain disturb caused by FN tunneling.

Referring to FIG. 121, when a high electric field is generated between the floating gate electrode 203 and the drain impurity diffused layer 206, tunneling is generated between bands, resulting in holes. As the generated holes are introduced to the floating gate electrode 203, the same condition as extraction of electrons results. Consequently, the non-selected cell is erroneously erased. This is the so called drain disturb caused by tunneling between bands.

The possible cause of the drain disturb phenomenon and the over-erase phenomenon described above when gate bird's beak oxide films 210 are formed at the lower end portions of the floating gate electrode 203 is as follows. The floating gate electrode 203 is formed of polycrystalline silicon layer. Since the polycrystalline silicon is liable to be oxidized along the grain boundary of the crystal, the shape of the crystal changes from round shape to sharp shape as oxidation proceeds. When the crystal has sharper shape, concentration of electric field tends to occur at the protruding portion. More specifically, at the lower end portions of the floating gate electrode 203 of the prior art, concentration of electric field tends to occur as the gate bird's beak oxide films 210 are formed. Such concentration of electric fields leads to over-erased phenomenon and the drain disturb phenomenon described above.

As described above, if the gate bird's beak oxide films 210 are formed under the lower opposite ends of the floating gate electrode 203, various disadvantages arise.

SUMMARY OF THE INVENTION

An object of the invention is to provide a semiconductor memory device which effectively prevents formation of a gate bird's beak oxide film at a region through which the electron moves in the data erasing and writing operations.

Another object of the invention is to provide a semiconductor memory device having good data writing and erasing characteristics.

Still another object of the invention is to provide a manufacturing method of a semiconductor memory device which suppresses formation of a gate bird's beak oxide film at a region through which the electron moves in the data erasing and writing operations.

According to one aspect of the invention, a semiconductor memory device capable of electrically writing and erasing information includes a semiconductor substrate of a first conductivity type having a main surface, one pair of impurity regions of a second conductivity type which are formed on the main surface of the semiconductor substrate and are spaced from each other by a predetermined distance with a channel region therebetween, a first insulating film formed at least on the channel region and having a first thickness, a second insulating film formed at least on a predetermined region of one of the impurity regions and having a second thickness larger than the first thickness, a charge accumulating electrode formed on the first insulating film and the second insulating film, and a control electrode formed on the charge accumulating electrode with a third insulating film therebetween.

The second insulating film having the second thickness, which is larger than the first thickness of the first insulating film formed on the channel region, is formed at least on the predetermined region of one of the impurity regions, a charge accumulating electrode is formed on the first and second insulating films. Therefore, a gate bird's beak oxide film is formed on a portion of the charge accumulating electrode which is located over the second insulating film, and formation of the gate bird's beak oxide film is effectively prevented at a region in the charge accumulating electrode located above the first insulating film. Thereby, the formation of the gate bird's beak oxide film is effectively prevented at the region in the first insulating film, through which the electrons move in the data erasing and writing operations.

The second insulating film may have a tapered shape such that its thickness gradually decreases as the position moves toward the channel region. This relieves the field concentration, which may occur between the charge accumulating electrode and a pair of the impurity regions, at a stepped portion of a boundary region between the first and second insulating films.

Further, the second insulating film may be formed of a first film for preventing entry of oxidizer and a second film for improving the adherence between the first film and at least one of the charge accumulating electrode and the semiconductor substrate. This effectively prevents the entry of the oxidizer passing between the first film and the charge accumulating electrode, or between the first film and the impurity region.

According to another aspect of the invention, a semiconductor memory device capable of electrically writing and erasing information includes a semiconductor substrate of a first conductivity type having a main surface, one pair of impurity regions of a second conductivity type which are formed on the main surface of the semiconductor substrate and are spaced from each other by a predetermined distance with a channel region therebetween, a first insulating film formed at least on the channel region, an oxidizer entry preventing film formed at least on a predetermined region of one of the impurity regions, for intercepting passage of electrons between a charge storage electrode and a pair of impurity regions at the time of writing and erasing information and for preventing entrance of oxidizer, a charge accumulating electrode formed on the first insulating film and the oxidizer entry preventing film, and a control electrode formed on the charge accumulating electrode with a second insulating film therebetween.

The oxidizer entry preventing film for intercepting passage of electrons between a charge storage electrode and a pair of impurity regions at the time of writing and erasing information and for preventing entrance of oxidizer is formed at least on the predetermined region of one of the impurity regions, and the charge accumulating electrode is formed on the first insulating film, which is formed on the channel region, and the oxidizer entry preventing film. Therefore, the oxidizer entry preventing film effectively prevents the entry of the oxidizer between the first insulating film and the semiconductor substrate, or between the first insulating film and the charge accumulating electrode in a later heat treatment step. This effectively prevents the formation of the gate bird's beak oxide film at the region of the first insulating film through which the electrons move in the data writing and erasing operations.

According to still another aspect of the invention, a manufacturing method of a semiconductor memory device, which has a semiconductor substrate of a first conductivity type having a main surface, a pair of impurity regions of a second conductivity type formed on the semiconductor substrate and spaced from each other with a channel region therebetween, a charge accumulating electrode and a control electrode, includes the steps of forming a first insulating layer having a first thickness at least on a region of the main surface of the semiconductor substrate bearing the channel region, forming a second insulating layer which has a second thickness larger than the first thickness at least on a predetermined region of that region on which one of the impurity regions is formed, of the main surface of the semiconductor substrate, forming a charge accumulating electrode layer on the first and second insulating layers, forming a control electrode layer on the charge accumulating electrode layer with a third insulating layer therebetween, forming the control electrode and the charge accumulating electrode by patterning the control electrode layer, the third insulating layer, the charge accumulating electrode layer and the second insulating layer, and forming a pair of the impurity regions of the second conductivity type by introducing impurity into the semiconductor substrate, using the control electrode and the charge accumulating electrode as a mask.

The first insulating layer having the first thickness is formed at least on the region bearing the channel region, the second insulating layer, which has the second thickness larger than the first thickness, is formed at least on the predetermined region of the region bearing one of the impurity regions, the charge accumulating electrode layer is formed on the first and second insulating layers, the control electrode layer is formed on the charge accumulating electrode layer with the third insulating layer therebetween, and the control electrode and the charge accumulating electrode are formed by patterning the control electrode layer, third insulating layer, charge accumulating electrode layer and second insulating layer. Therefore, the gate bird's beak oxide film is formed between the charge accumulating electrode and the second insulating layer in the later heat treatment process. This effectively prevents formation of the gate bird's beak oxide film at the region of the first insulating layer through which the electrons move in the data writing and erasing operations. Further, since the impurity regions are formed in self-alignment using the control electrode and charge accumulating electrode as a mask, the impurity regions are easily formed.

According to yet another aspect of the invention, a manufacturing method of a semiconductor memory device, which has a semiconductor substrate of a first conductivity type having a main surface, a pair of impurity regions of a second conductivity type formed on the semiconductor substrate and spaced from each other with a channel region therebetween, a charge accumulating electrode and a control electrode, includes the steps of forming a first insulating layer at least on a region of the main surface of the semiconductor substrate bearing the channel region, forming an oxidizer entry preventing layer for intercepting passage of electrons between a charge storage electrode and a pair of impurity regions at the time of writing and erasing information and for preventing entrance of oxidizer, at least on a predetermined region in that region on which one of the impurity regions is formed of the main surface of the semiconductor substrate, forming a charge accumulating electrode layer on the first insulating layer and the oxidizer entry preventing layer, forming a control electrode layer on the charge accumulating electrode layer with a second insulating layer therebetween, forming the control electrode and the charge accumulating electrode by patterning the control electrode layer, the second insulating layer, the charge accumulating electrode layer and the oxidizer entry preventing layer, and forming a pair of impurity regions of the second conductivity type by introducing impurity into the semiconductor substrate, using the control electrode and the charge accumulating electrode as a mask.

The first insulating layer is formed at least on the region of the main surface of the semiconductor substrate bearing the channel region, the oxidizer entry preventing layer for intercepting passage of electrons between a charge storage electrode and a pair of impurity regions at the time of writing and erasing information and for preventing entrance of oxidizer, is formed at least on the predetermined region in that region on which one of the impurity regions is formed, of the main surface of the semiconductor substrate, the charge accumulating electrode layer is formed on the first insulating layer and the oxidizer entry preventing layer, the control electrode layer is formed on the charge accumulating electrode layer with the second insulating layer therebetween, and the control electrode and the charge accumulating electrode are formed by patterning the control electrode layer, the second insulating layer, the charge accumulating electrode layer and the oxidizer entry preventing layer. Therefore, the gate bird's beak oxide film is formed between the charge accumulating electrode and the oxidizer entry preventing layer in the later heat treatment process. This effectively prevents the formation of the gate bird's beak oxide film at the region of the first insulating layer through which the electrons move in the data erasing and writing operations. Further, since the impurity regions are formed in a self-alignment manner using the control electrode and the charge accumulating electrode as a mask, the impurity regions are easily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the accompanying drawings.

Figure 1:
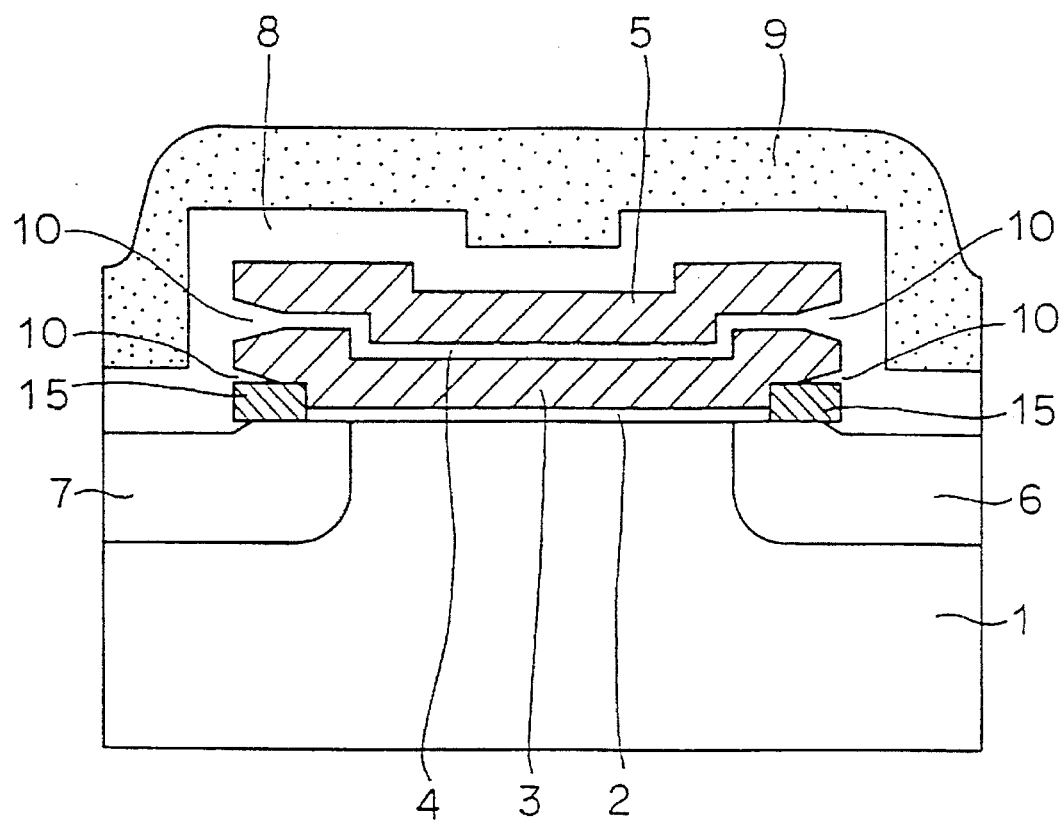
FIG. 1 is a cross section of a Flash EEPROM of a first embodiment of the invention.

Referring to FIG. 1, a Flash EEPROM of a first embodiment includes a semiconductor substrate 1 formed of silicon, as well as a drain impurity diffusion layer 6 and a source impurity diffusion layer 7, which are formed on the semiconductor substrate 1 and are spaced from each other by a predetermined distance with a channel region therebetween. The Flash EEPROM also includes a first gate oxide film 2 which is formed of silicon oxide film having a thickness of about 120 Å and located on the channel region, a predetermined region of the drain impurity diffusion layer 6 and a predetermined region of the source impurity diffusion layer 7, and nitride films 15 which are formed on the drain impurity diffusion layer 6 and the source impurity diffusion layer 7, respectively, and are spaced with the first gate oxide film 2 therebetween. The nitride film 15 has a thickness (of about 1000 Å) larger than that of the first gate oxide film 2. The Flash EEPROM further includes a floating gate electrode 3 formed on the first gate oxide film 2 and the nitride films 15, a control gate electrode 5 formed on the floating gate electrode 3 with an insulating film 4 therebetween, an interlayer thermal oxide film 8 covering the semiconductor substrate 1, floating gate electrode 3 and control gate electrode 5, and an interlayer insulating film 9 covering the interlayer thermal oxide film 8. The basic components of the Flash EEPROM, which is a nonvolatile memory semiconductor device of a two-layer gate type, are formed of the first gate oxide film 2, floating gate electrode 3, insulating film 4, control gate electrode 5, drain impurity diffusion layer 6 and source impurity diffusion layer 7. The purpose of the interlayer thermal oxide film 8 is to prevent impurity such as phosphorus and/or boron in the interlayer insulating film 9 from moving into the semiconductor substrate 1, control gate electrode 5 and floating gate electrode 3. The nitride films 15 have a thickness enough to prevent passage of electrons through the nitride film 16 in data erasing and writing operations.

In this embodiment, the nitride films 15 having the thickness larger than that of the first gate oxide film 2 is formed to surround the first gate oxide film 2, as described before, so that the gate bird's beak oxide films 10, which are generated by the heat treatment during the formation of the interlayer insulating film 9, are formed between the upper surfaces of the nitride films 15 and the lower ends of the floating gate electrode 3. Thereby, it is possible to suppress the formation of the gate bird's beak oxide film 10 in a region of the first gate oxide film 2 (i.e., opposite ends of the first gate oxide film 2) through which the electrons move in the data erasing and writing operations. By suppressing the formation of the gate bird's beak oxide film 10 between the source impurity diffusion layer 7 and the floating gate electrode 3 in this manner, it is possible to prevent the excessive draw of the electron from the floating gate electrode 3 to the source impurity diffusion layer 7 in the data erasing operation, and thus the over-erased state can be prevented. Further, by suppressing the formation of the gate bird's beak oxide film 10 between the drain impurity diffusion layer 6 and the floating gate electrode 3, it is possible to prevent a so-called drain disturb phenomenon, i.e., erased state caused by the draw of the electron from the floating gate in the unselected cell due to the high voltage applied to the drain region of the unselected cell in the data writing operation. Thereby, good writing and erasing characteristics can be obtained. Since the nitride film 15 functions to prevent entry of the oxidizer during the heat treatment of the interlayer insulating film 9, it is possible to further improve the effect for preventing the entry of the oxidizer between the first gate oxide film 2 and the floating gate electrode 3, or between the first gate oxide film 2 and the semiconductor substrate 1. As a result, it is possible to effectively suppress the formation of the gate bird's beak oxide films 10 at the opposite ends of the first gate oxide film 2.

Referring now to FIGS. 2–13, a manufacturing process of the Flash EEPROM of the first embodiment will be described below.

Figure 2:
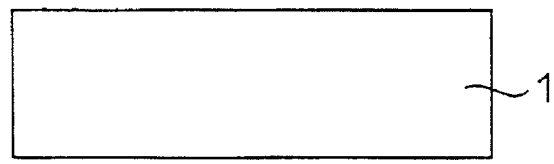
FIGS. 2–13 are cross sections showing first to twelfth steps of a manufacturing process of a Flash EEPROM of a first embodiment shown in FIG. 1, respectively.
Figure 3:
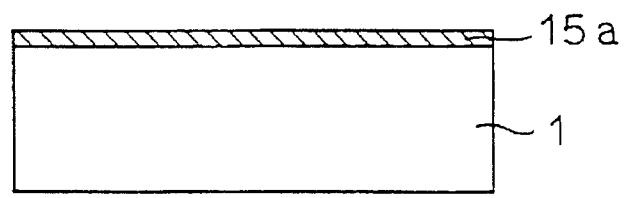
Figure 4:

The process starts from the state shown in FIG. 2, and a nitride film layer 15a of about 1000 Å in thickness is formed on the semiconductor substrate 1 of silicon by a CVD method, as shown in FIG. 3. The photolithography and dry etching are used to pattern the nitride film layer 15a, whereby the nitride film layers 15a having the configuration shown in FIG. 4 are obtained.

Figure 5:
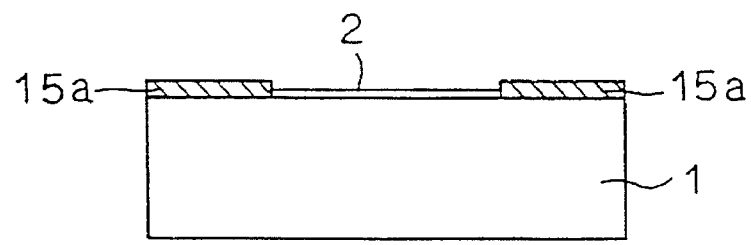

Then, as shown in FIG. 5, the first gate oxide film 2 of about 120 Å in thickness is formed on a region of the semiconductor substrate 1, on which the nitride film layers 15a are not formed, by a thermal oxidation method.

Figure 6:
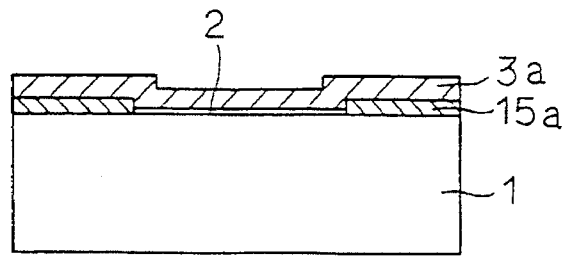
Figure 7:
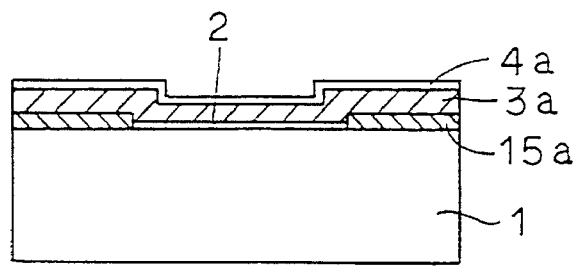
Figure 8:
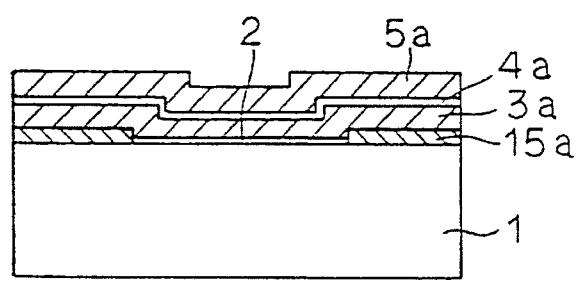
Figure 9:
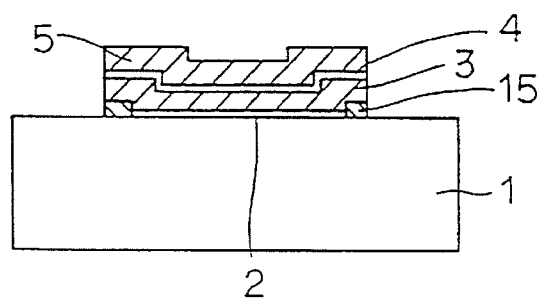

As shown in FIG. 6, a polysilicon layer, i.e., floating gate electrode layer 3a is formed to a thickness of about 2000 Å. As shown in FIG. 7, an insulating film layer 4a of about 300 Å in thickness is formed on the floating gate electrode layer 3a. As shown in FIG. 8, a control gate electrode layer 5a of polysilicon is formed to a thickness of about 300 Å on the insulating film layer 4a. The photolithography and etching are used to pattern the nitride film layers 15a, floating gate electrode layer 3a, insulating film layer 4a and control gate electrode layer 5a, whereby the nitride films 15, floating gate electrode 3, insulating film 4 and control gate electrode 5 are formed, as shown in FIG. 9.

Figure 10:
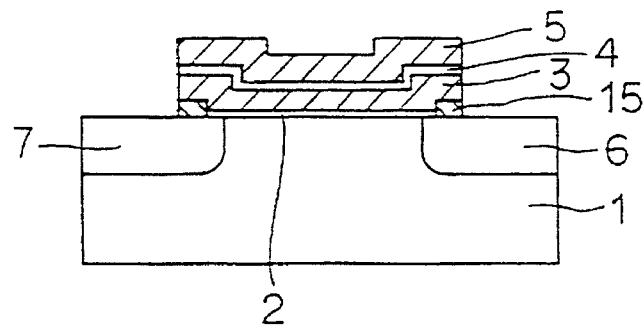

As shown in FIG. 10, using the floating gate electrode 3 and control gate electrode 5 as a mask, impurity such as As is ion-implanted into the semiconductor substrate 1 at the implanting condition of about $3 \times 10^{15}/cm^2$ in a self-alignment manner. Thereafter, the thermal diffusion technique is used to diffuse the impurity, whereby the drain impurity diffusion layer 6 and the source impurity diffusion layer 7 are formed.

Figure 11:
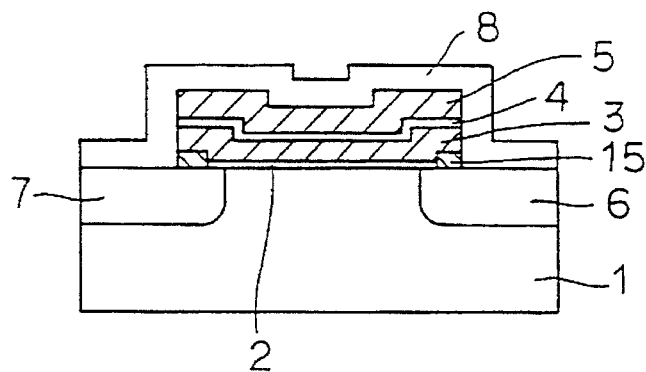
Figure 12:
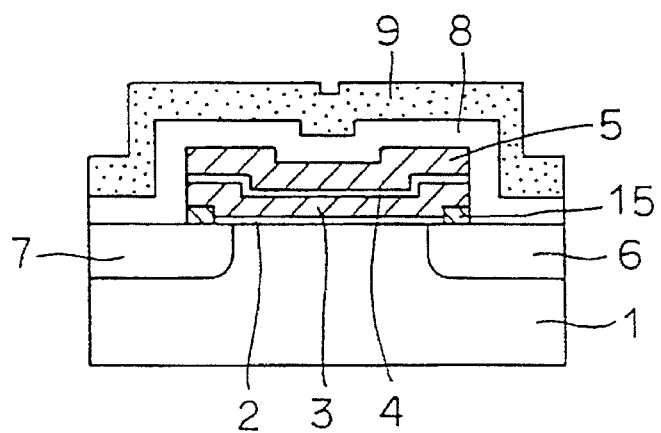
Figure 13:
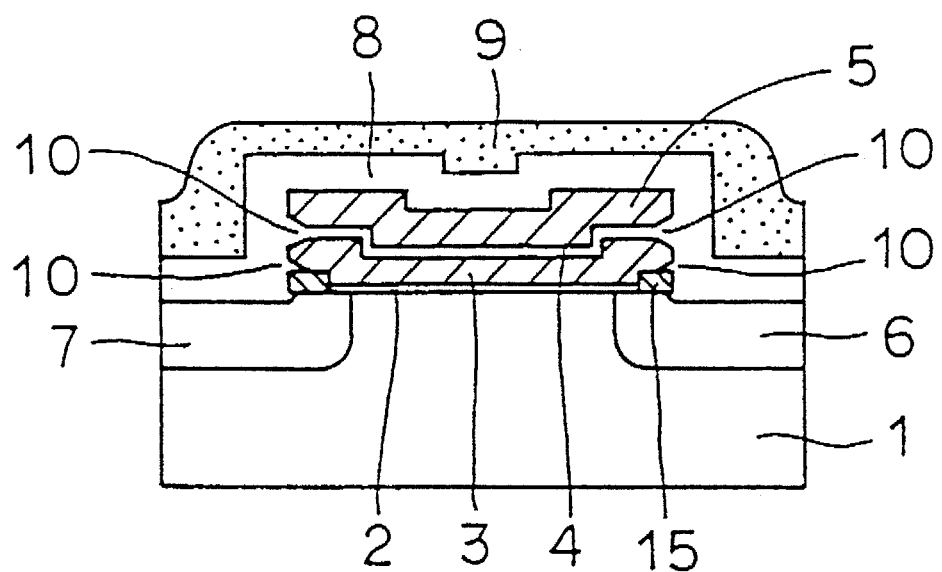

As shown in FIG. 11, the interlayer thermal oxide film 8 is formed to cover the semiconductor substrate 1, floating gate electrode 3 and control gate electrode 5. Then, the interlayer thermal oxide film 8 is covered with the interlayer insulating film 9, as shown in FIG. 12. The heat treatment is applied to the interlayer insulating film 9 to improve flatness of the interlayer insulating film 9. FIG. 13 shows the flattened interlayer insulating film 9. The heat treatment of the interlayer insulating film 9 causes further oxidization of the interlayer thermal oxide film 8, so that the film thickness of the interlayer thermal oxide film 8 increases. Simultaneously, the gate bird's beak oxide films 10 are formed between the floating gate electrode 3 and the nitride films 15 as well as between the floating gate electrode 3 and the control gate electrode 5 due to the entry of the oxidizer ($H_2O$) during the heat treatment of the interlayer insulating film 9. The gate bird's beak oxide films 10 formed between the nitride films 15 and the floating gate electrode 3 hardly reach the first gate oxide film 2, so that the formation of the gate bird's beak oxide film 10 at the first gate oxide film 2 can be effectively prevented.

As described above, according to the manufacturing process of the Flash EEPROM of this embodiment, the nitride film 15, floating gate electrode 3 and control gate electrode 5 are simultaneously and collectively patterned, and then are used as a mask for forming the drain impurity diffusion layer 6 and source impurity diffusion layer 7 in a self-alignment manner. Therefore, the Flash EEPROM having good writing and erasing characteristics can be easily manufactured.

Figure 14:
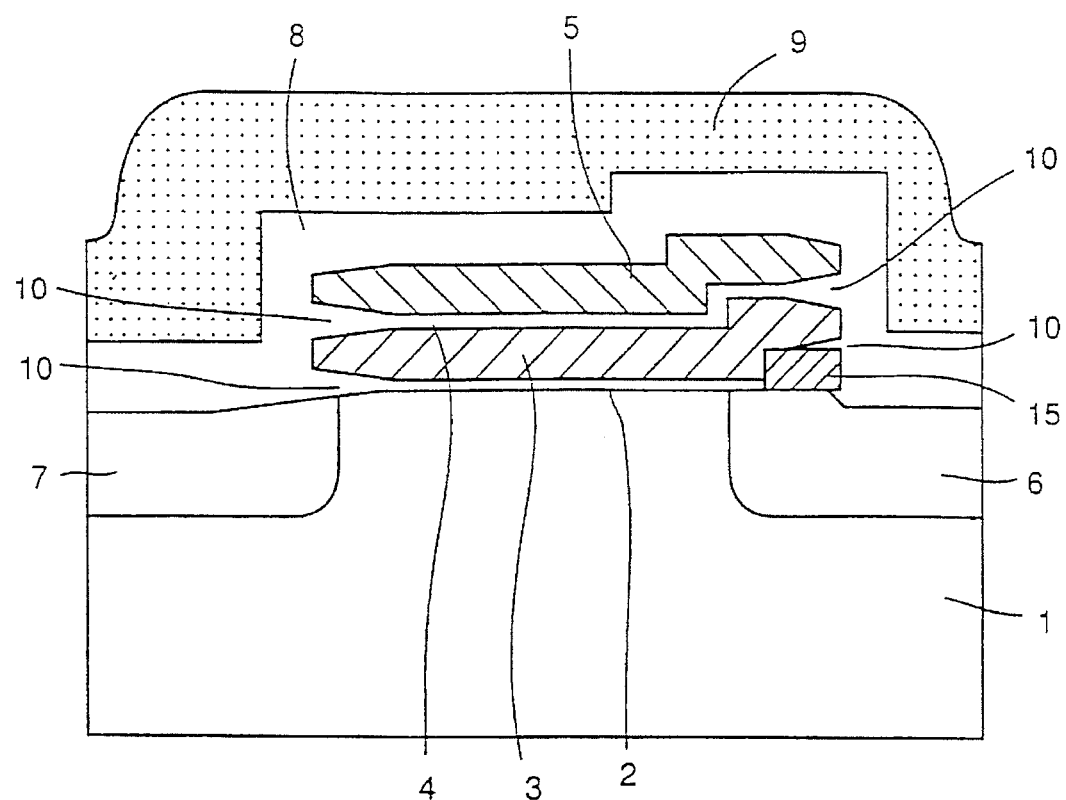
FIG. 14 is a cross section showing a structure in which a nitride film is provided only on the drain impurity diffusion layer in the Flash EEPROM of the first embodiment.

FIG. 14 is a cross section showing a structure in which a nitride film 15 is provided only on the drain impurity diffused layer 6 of the Flash EEPROM of the first embodiment shown in FIG. 1. Referring to FIG. 14, only the drain disturb phenomenon can be prevented when nitride film 15 is formed only on the drain impurity diffusion layer 6. When the drain disturb phenomenon occurs frequently but the over-erased phenomenon is not much generated, than provision of the nitride film 15 only on the drain impurity diffusion layer 6 such as shown in FIG. 14 is a good measure.

Figure 15:
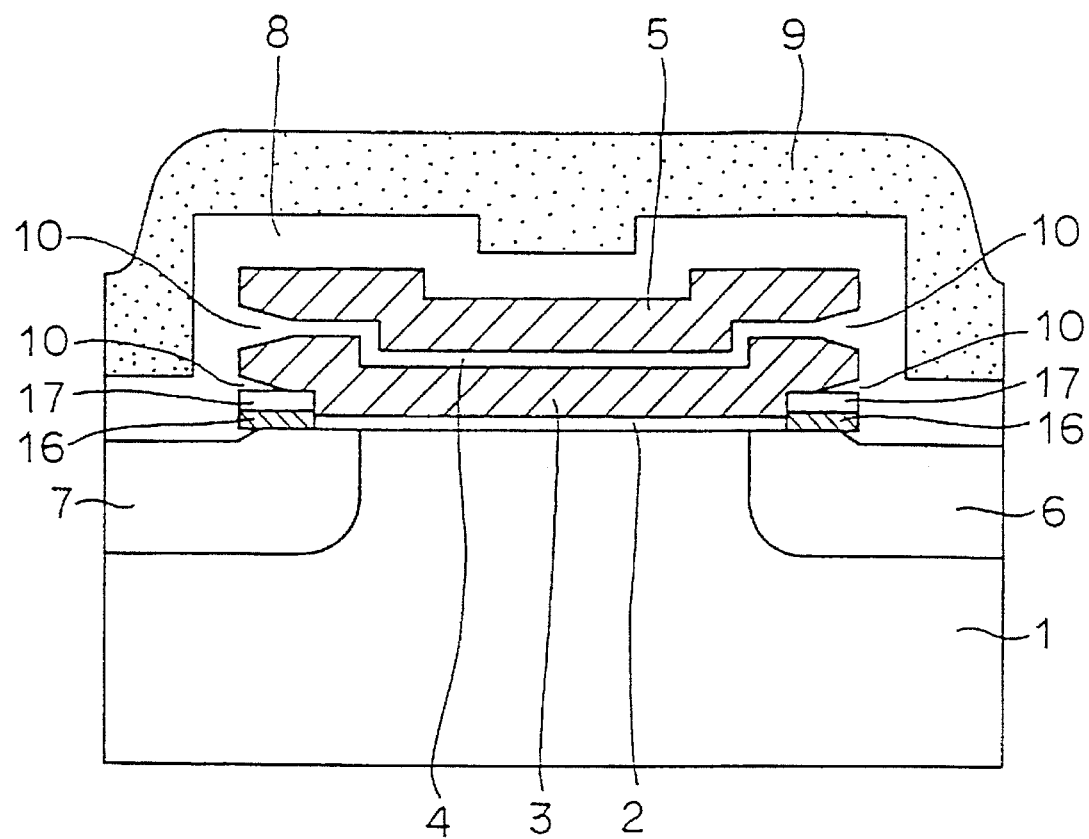
FIG. 15 is a cross section of a Flash EEPROM of a second embodiment of the invention.

Referring to FIG. 15, the Flash EEPROM of a second embodiment includes the semiconductor substrate 1 folded of silicon, as well as the drain impurity diffusion layer 6 and the source impurity diffusion layer 7, which are formed on the main surface of the semiconductor substrate 1 and are spaced from each other by a predetermined distance with the channel region therebetween. The Flash EEPROM also includes a first gate oxide film 2 which is formed at a thickness of about 120 Å on the channel region, a predetermined region of the drain impurity diffusion layer 6 and a predetermined region of the source impurity diffusion layer 7, nitride films 16 which surround opposite ends of the first gate oxide film 2 and are formed on the predetermined regions of the drain impurity diffusion layer 6 and the predetermined regions of the source impurity diffusion layer 7. The nitride films 16 have a thickness of about 500 Å. The Flash EEPROM further includes oxide films 17 formed on the nitride films 16 to a thickness of about 500 Å, the floating gate electrode 3 formed on the first gate oxide film 2 and the oxide films 17, the control gate electrode 5 formed on the floating gate electrode 3 with the insulating film 4 therebetween, the interlayer thermal oxide film 8 covering the semiconductor substrate 1, nitride films 16, oxide films 17, floating gate electrode 3 and control gate electrode 5, and the interlayer insulating film 9 covering the interlayer thermal oxide film 8.

The Flash EEPROM of the second embodiment is different from the first embodiment shown in FIG. 1 in that the first gate oxide film 2 is surrounded by the two-layered films, i.e., the nitride films 16 and oxide films 17. The total thickness of the nitride film 16 and oxide film 17 is larger than that of the first gate oxide film 2. More specifically, the nitride film 16 and oxide film 17 have the total thickness which can prevent passage of electrons through them in the data erasing and writing operations. Owing to this construction, the electrons pass through the regions of the first gate oxide film 2 located above the drain impurity diffusion layer 6 and source impurity diffusion layer 7, i.e., opposite end portions of the first gate oxide film 2 in the data erasing and writing operations. In this embodiment, the gate bird's beak oxide films 10 are formed between the oxide films 17 and the floating gate electrode 3, and the gate bird's beak oxide film is not formed at the opposite ends of the first gate oxide film 2, so that the over-erased phenomenon and the drain disturb phenomenon can be suppressed. The nitride films 16 function to prevent entry of the oxidizer ($H_2O$) during the heat treatment of the interlayer insulating film 9. The oxide films 17 serve to improve the adherence between the nitride films 16 and the floating gate electrode 3.

Referring to FIGS. 16-22, a manufacturing process of the Flash EEPROM of the second embodiment will be described below.

Figure 16:
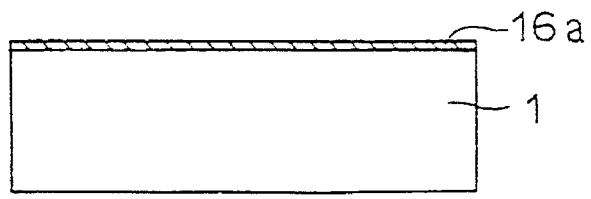
FIGS. 16–22 are cross sections showing first to seventh steps of a manufacturing process of a Flash EEPROM of a second embodiment shown in FIG. 15, respectively.
Figure 17:
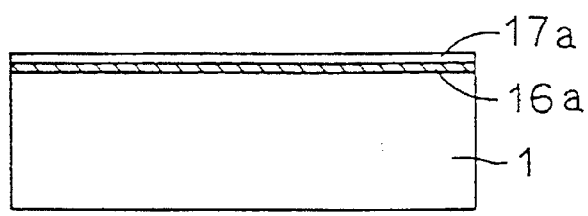
Figure 18:
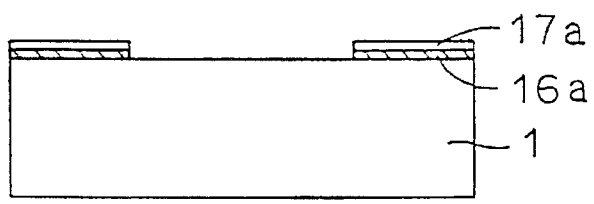

As shown in FIG. 16, a nitride film layer 16a of about 500 Å in thickness is formed on the semiconductor substrate 1 of silicon by the CVD method. As shown in FIG. 17, an oxide film layer 17a is formed at a thickness of about 500 Å on the nitride film layer 16a by the CVD method. The photolithography and dry etching are used to pattern the oxide film layer 17a and nitride film layer 16a to form the pattern shown in FIG. 18.

Then, the first gate oxide film 2 is formed at the thickness of about 120 Å on the region of the surface of the semiconductor substrate 1 on which the nitride film layer 16a and oxide film layer 17a are not formed. The whole surface is covered with a floating gate electrode layer (not shown) of polysilicon which is formed at a thickness of about 2000 Å, and then an insulating film layer (not shown) of about 300

Figure 19:
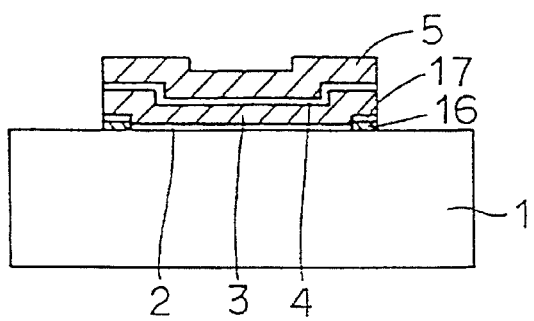
Figure 20:
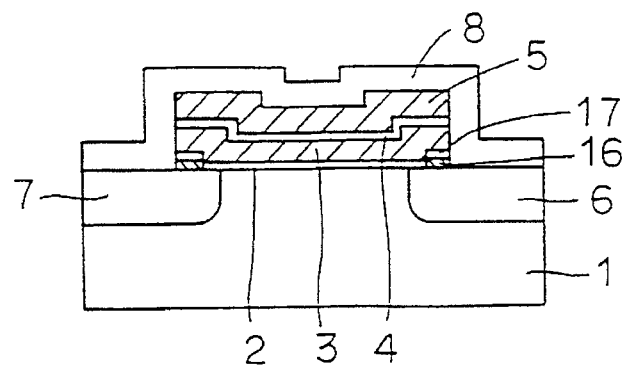

Å in thickness is formed thereon. A control gate electrode layer (not shown) of polysilicon having the thickness of about 3000 Å is formed on the insulating film layer. The photolithography and dry etching are used to pattern them to form the first gate oxide film 2, floating gate electrode 3, insulating film 4, control gate electrode 5, nitride films 16 and oxide films 17, as shown in FIG. 19. Thereafter, the nitride film 16, oxide film 17, floating gate electrode 3 and control gate electrode 5 are used as a mask for implanting As ion into the semiconductor substrate 1 in the self-alignment manner under the implantation condition of $3 \times 10^{15}/cm^2$. The impurity is diffused by the thermal diffusion technique. Thereby, the drain impurity diffusion layer 6 and source impurity diffusion layer 7 are formed, as shown in FIG. 20. Then, the whole surface is covered with the interlayer thermal oxide film 8.

Figure 21:
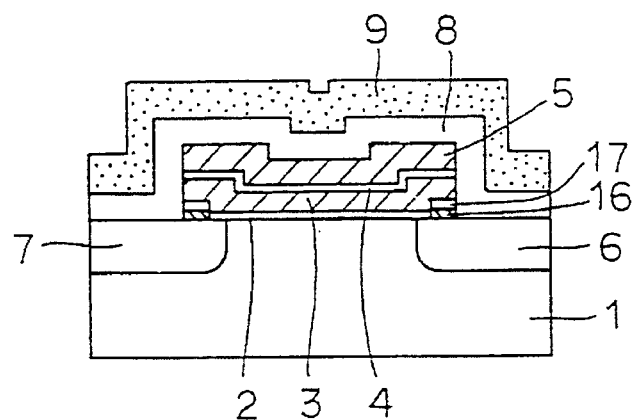

As shown in FIG. 21, the interlayer insulating film 9 containing phosphorus or the like is formed to cover the interlayer thermal oxide film 8.

Figure 22:
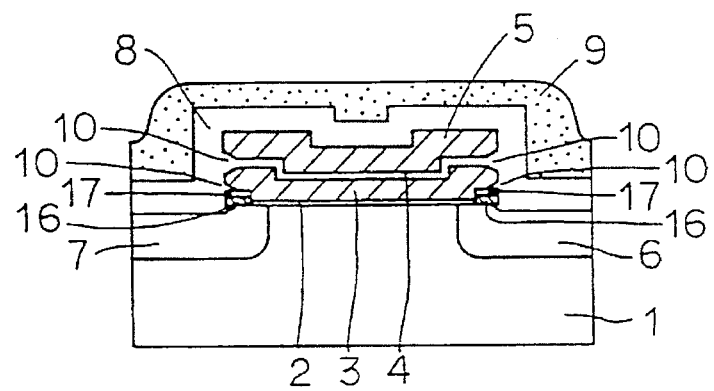

Finally, as shown in FIG. 22, the interlayer insulating film 9 is flattened by the heat treatment in the reflow method. This heat treatment further oxidizes the interlayer thermal oxide film 8 and thus increases the thickness thereof. Also, the gate bird's beak oxide films 10 are formed between the oxide films 17 and the floating gate electrode 3 as well as between the floating gate electrode 3 and the control gate electrode 5 due to the entry of the oxidizer ($H_2O$) during the heat treatment. The gate bird's beak oxide films 10 between the oxide films 17 and the floating gate electrode 3 do not reach the opposite ends of the first gate oxide film 2. Therefore, the gate bird's beak oxide film is not formed at the opposite ends of the first gate oxide film 2.

Figure 23:
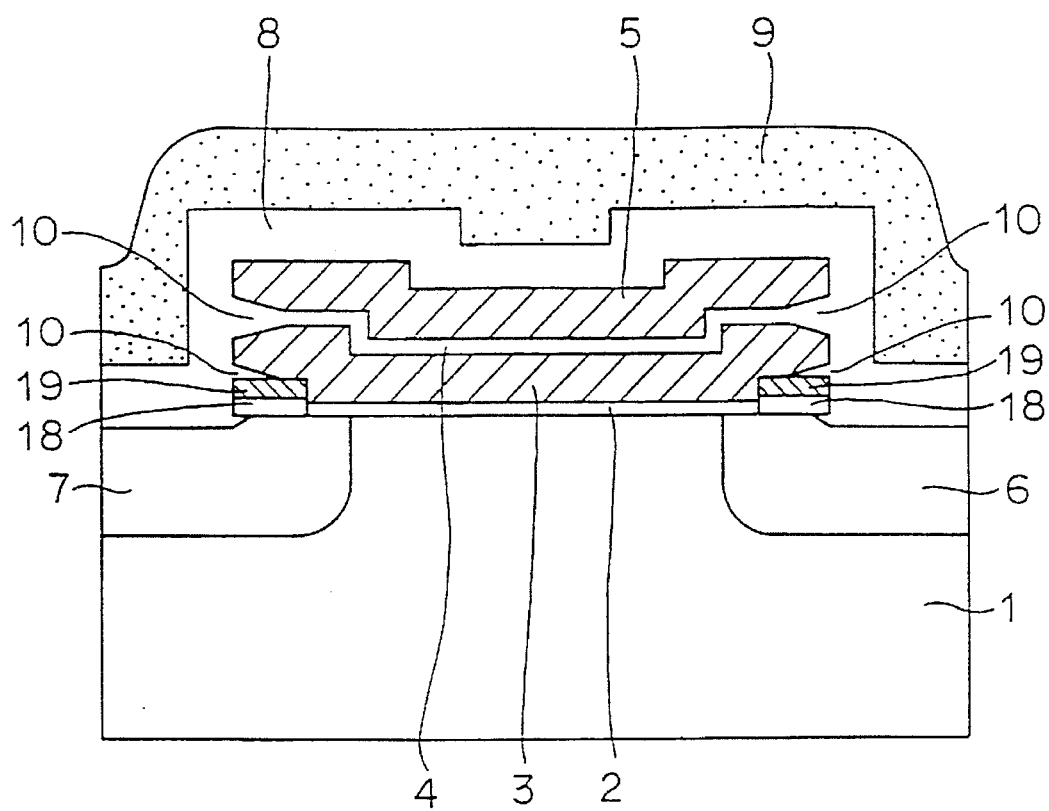
FIG. 23 is a cross section of a Flash EEPROM of a third embodiment of the invention.

Referring to FIG. 23, the Flash EEPROM of a third embodiment includes the semiconductor substrate 1 formed of silicon, as well as the drain impurity diffusion layer 6 and the source impurity diffusion layer 7, which are formed on the main surface of the semiconductor substrate 1 and are spaced from each other by a predetermined distance with the channel region therebetween. The Flash EEPROM also includes the first gate oxide film 2 which is formed to a thickness of about 120 Å on the channel region, a predetermined region of the drain impurity diffusion layer 6 and a predetermined region of the source impurity diffusion layer 7, oxide films 18 which surround opposite ends of the first gate oxide film 2 and are formed on the predetermined regions of the drain impurity diffusion layer 6 and source impurity diffusion layer 7 to a thickness of about 500 Å. The Flash EEPROM further includes nitride films 19 formed on the oxide film 18 to a thickness of 500 Å, the floating gate electrode 3 formed on the first gate oxide film 2 and the nitride films 19, the control gate electrode 5 formed on the floating gate electrode 3 with the insulating film 4 therebetween, the interlayer thermal oxide film 8 covering the floating gate electrode 3 and control gate electrode 5, and the interlayer insulating film 9 covering the interlayer thermal oxide film 8.

In the third embodiment, the oxide films 18 and the nitride films 19 formed thereon surround the first gate oxide film 2. The total thickness of the oxide film 18 and nitride film 19 has a value which prevents passage of the electrons through the oxide film 18 and nitride film 19 in the data erasing and writing operations. The gate bird's beak oxide films 10 located under the opposite ends of the floating gate electrode 3 are located on the nitride films 19. Therefore, the gate bird's beak oxide films 10, which are formed on the nitride films 19 due to the heat treatment of the interlayer insulating film 9, are prevented from reaching the opposite ends of the first gate oxide film 2, so that it is possible to prevent the over-erased phenomenon and the drain disturb phenomenon. Consequently, the Flash EEPROM has the good writing and erasing characteristics. The nitride films 19 function to prevent entry of the oxidizer ($H_2O$) during the heat treatment of the interlayer insulating film 9, so that the oxide films 18 function to improve the between the nitride films 19 and the semiconductor substrate 1.

Referring to FIGS. 24–28, a manufacturing process of the Flash EEPROM of the third embodiment will be described below.

Figure 24:
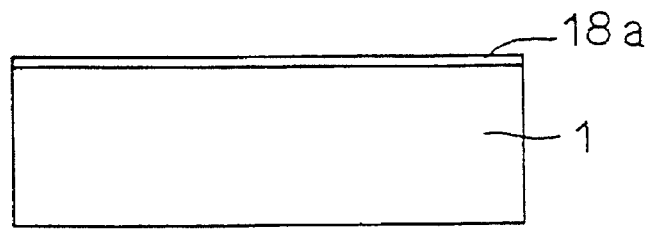
FIGS. 24–28 are cross sections showing first to fifth steps of a manufacturing process of a Flash EEPROM of a third embodiment shown in FIG. 23, respectively.
Figure 25:
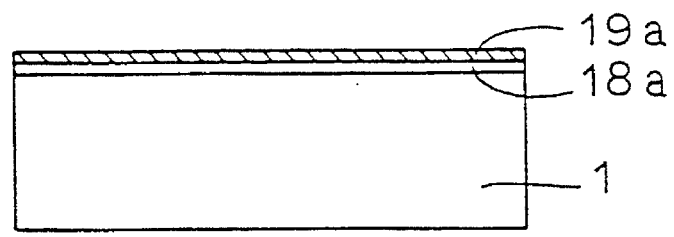
Figure 26:
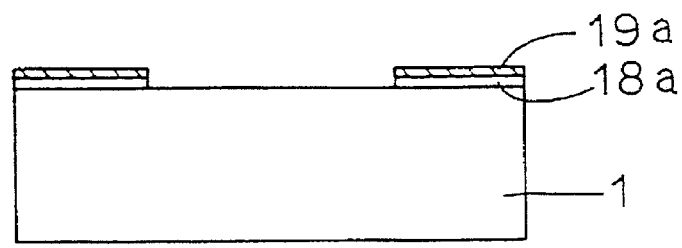
Figure 27:
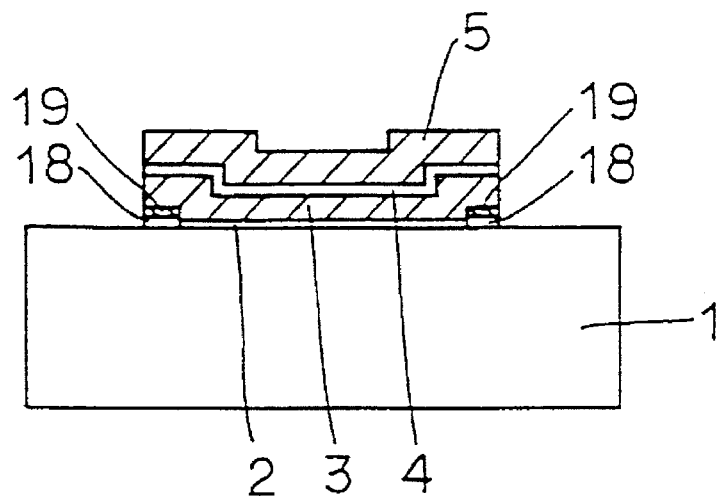
Figure 28:
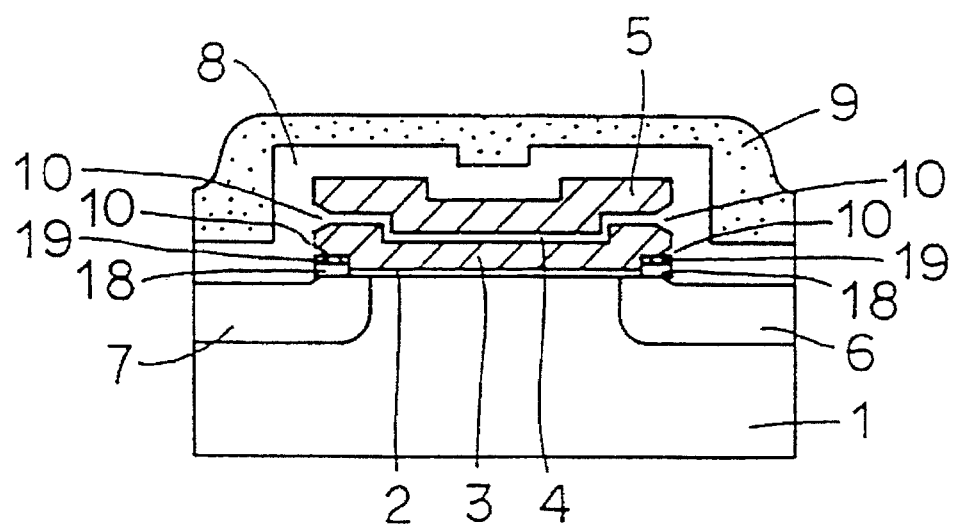

As shown in FIG. 24, an oxide film layer 18a is formed to a thickness of about 500 Å on the semiconductor substrate 1 by the CVD method. As shown in FIG. 25, a nitride film layer 19a is formed to a thickness of about 500 Å on the oxide film layer 18a by the CVD method. The photolithography and dry etching are used to pattern the nitride film layer 19a and oxide film layer 18a to form the pattern shown in FIG. 26. The semiconductor substrate 1 is subjected to the thermal oxidation to form the first gate oxide film (not shown) of about 120 Å in thickness on the surface portion of the semiconductor substrate 1 on which the oxide film layer 18a is not formed. After forming a floating gate electrode layer (not shown) of polysilicon having a thickness of about 2000 Å, an insulating film layer (not shown) of about 300 Å is formed on the floating gate electrode layer. A control gate electrode layer (not shown) of polysilicon is formed on the insulating film layer. The photolithography and etching are used to pattern the control gate electrode layer, insulating film layer, floating gate electrode layer, nitride film layers 19a and oxide film layers 18a. Thereby, as shown in FIG. 27, the first gate oxide film 2, floating gate electrode 3, insulating film 4, control gate electrode 5, oxide films 18 and nitride films 19 are formed. Using the control gate electrode 5 and floating gate electrode 3 as a mask, the As ion is implanted into the semiconductor substrate 1 in the self-alignment manner under the implantation condition of $3 \times 10^{15}/cm^2$. Thereafter, the thermal diffusion technique is used to diffuse the impurity, so that the drain impurity diffusion layer 6 and source impurity diffusion layer 7 are formed, as shown in FIG. 28. After covering the whole surface with the interlayer thermal oxide film 8, the interlayer insulating film 9 containing, e.g., phosphorus is formed on the interlayer thermal oxide film 8. Finally, the interlayer insulating film 9 is subjected to the heat treatment by the reflow method to flatten the same. This heat treatment further oxidizes the interlayer thermal oxide film 8, so that the thickness thereof increases. Also, this heat treatment forms the gate bird's beak oxide films 10. The gate bird's beak oxide films 10 are formed between the floating gate electrode 3 and the nitride film 19, so that the formation of the gate bird's beak oxide film 10 at the opposite ends of the first gate oxide film 2 is effectively prevented.

Figure 29:
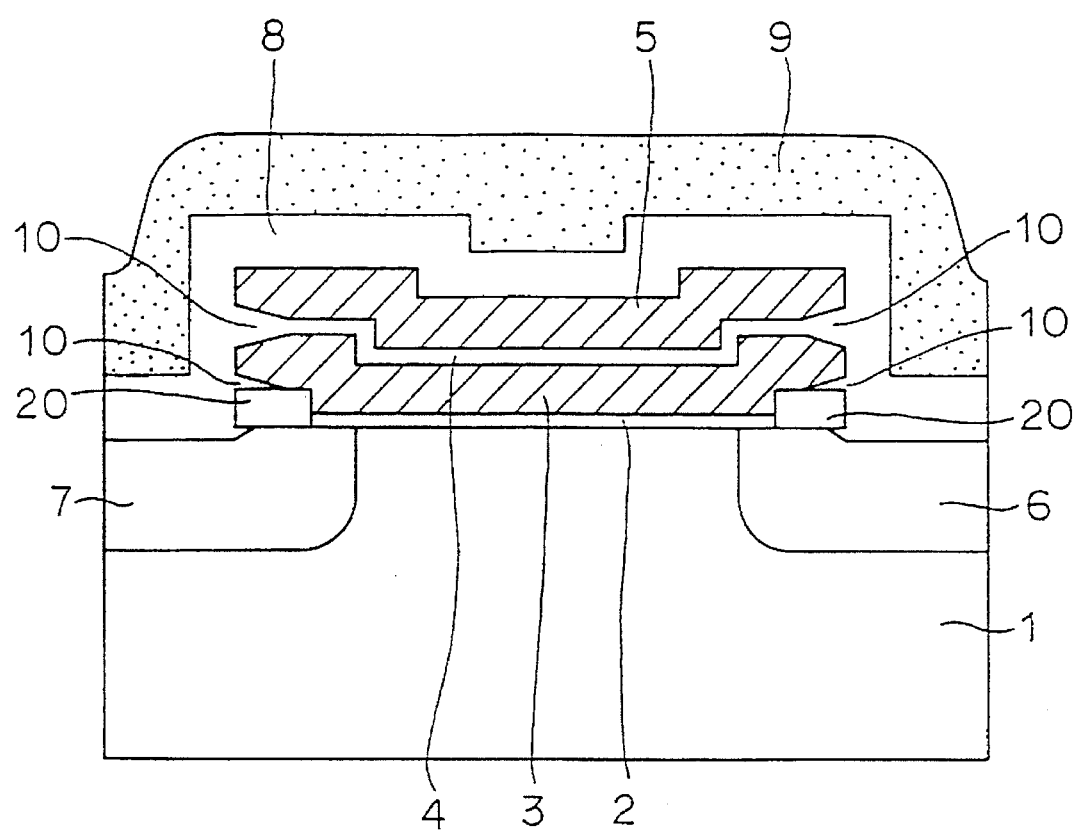
FIG. 29 is a cross section of a Flash EEPROM of a fourth embodiment of the invention.

Referring to FIG. 29, the Flash EEPROM of a fourth embodiment includes the semiconductor substrate 1 formed of silicon, as well as the drain impurity diffusion layer 6 and the source impurity diffusion layer 7, which are formed on the main surface of the semiconductor substrate 1 and are spaced from each other through a predetermined distance with the channel region therebetween. The Flash EEPROM also includes the first gate oxide film 2 which is formed to a thickness of about 120 Å on the channel region, a predetermined region of the drain impurity diffusion layer 6 and a predetermined region of the source impurity diffusion layer 7, oxide films 20 which surround opposite ends of the first gate oxide film 2 and are formed on the drain impurity diffusion layer 6 and source impurity diffusion layer 7 to a thickness of about 1000 Å. The Flash EEPROM further includes the floating gate electrode 3 formed on the first gate oxide film 2 and the oxide films 20, the control gate electrode 5 formed on the floating gate electrode 3 with the insulating film 4 therebetween, the interlayer thermal oxide film 8 covering the floating gate electrode 3 and control gate electrode 5, and the interlayer insulating film 9 covering the interlayer thermal oxide film 8 and containing the impurity such as phosphorus. Between the floating gate electrode 3 and the oxide films 20 and between the floating gate electrode 3 and the control gate 3, there are located the gate bird's beak oxide films 10 which are formed by the entry of the oxidizer during the formation of the interlayer insulating film 9. Also in this fourth embodiment, the opposite ends of the first gate oxide film 2 are surrounded by the thick oxide films 20 having the thickness larger than that of the first gate oxide film 2, so that the gate bird's beak oxide films 10 are formed between the floating gate electrode 3 and the oxide films 20. This effectively prevents the formation of the gate bird's beak oxide film 10 at the opposite ends of the first gate oxide film 2. As a result, it is possible to prevent the over-erased state and the drain disturb phenomenon in the unselected cell. The thickness of the oxide film 20 has a value which can prevent passage of the electrons through the oxide film 20 in the data erasing and writing operations.

Referring to FIGS. 30–33, a manufacturing process of the Flash EEPROM of the fourth embodiment will be described below.

Figure 30:
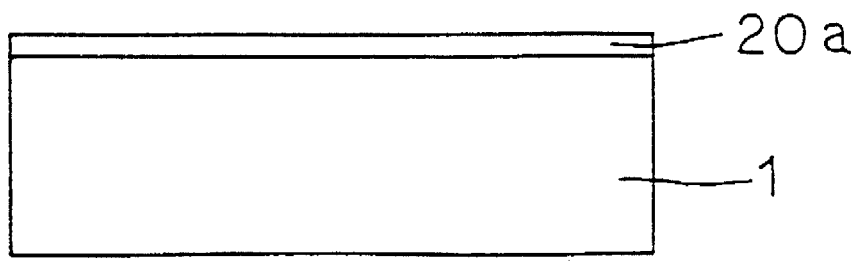
FIGS. 30–33 are cross sections showing first to fourth steps of a manufacturing process of a Flash EEPROM of a fourth embodiment shown in FIG. 29, respectively.
Figure 31:
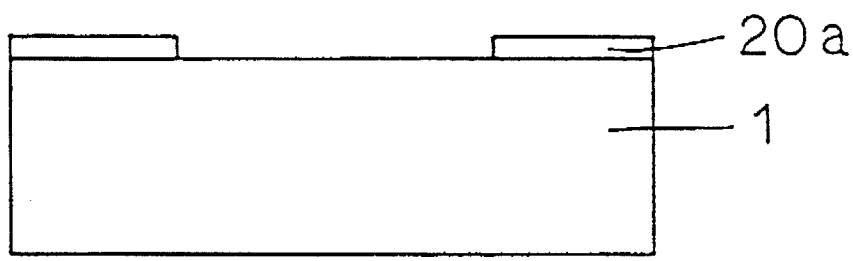
Figure 32:
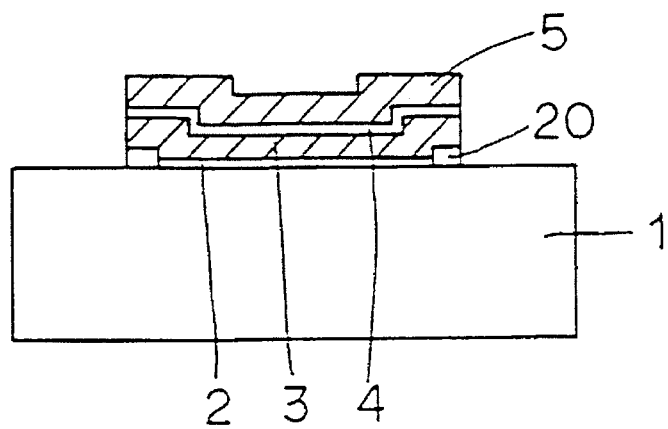
Figure 33:
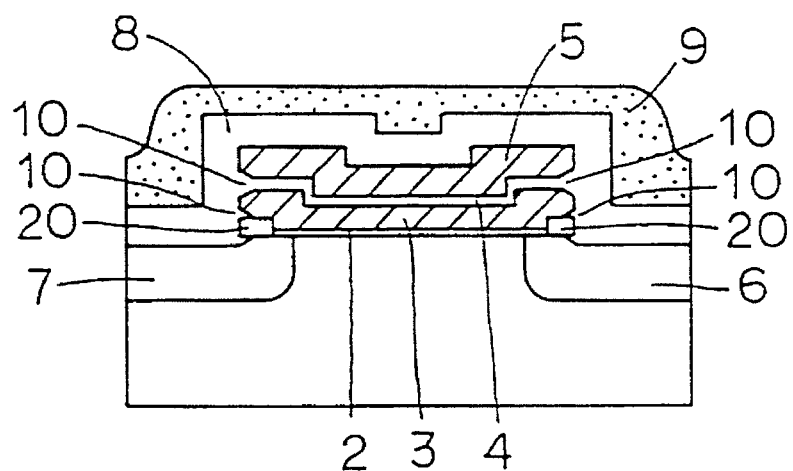

As shown in FIG. 30, an oxide film layer 20a is formed at a thickness of about 1000 Å on the semiconductor substrate 1 of silicon by the CVD method. The photolithography and dry etching are used to pattern the oxide film layer 20a to form the pattern shown in FIG. 31. The first gate oxide film (not shown) of about 120 Å in thickness is formed on the surface portion of the semiconductor substrate 1 on which the oxide film layers 20a are not formed. After forming a floating gate electrode layer (not shown) of polysilicon having a thickness of about 2000 Å, an insulating film layer (not shown) of about 300 Å in thickness is formed on the floating gate electrode layer, and a control gate electrode layer (not shown) of polysilicon is formed at a thickness of about 3000 Å on the insulating film layer. The photolithography and etching are used to pattern them, whereby, as shown in FIG. 32, the first gate oxide film 2, floating gate electrode 3, insulating film 4, control gate electrode 5 and oxide films 20 are formed. Using the floating gate electrode 3 and control gate electrode 5 as a mask, As ion is implanted into the semiconductor substrate 1 in the self-alignment manner under the condition of $3 \times 15^{15}/\text{cm}^2$. Thereafter, the thermal diffusion technique is used to diffuse the impurity, so that the drain impurity diffusion layer 6 and source impurity diffusion layer 7 are formed, as shown in FIG. 33. After covering the whole surface with the interlayer thermal oxide film 8, the interlayer insulating film 9 containing the impurity such as phosphorus is formed to cover the interlayer thermal oxide film 8. The interlayer insulating film 9 is subjected to the heat treatment by the reflow method to flatten the same. The heat treatment of the interlayer insulating film 9 causes the entry of the oxidizer ($H_2O$), whereby the gate bird's beak oxide films 10 are formed between oxide films 20 and the floating gate electrode 3 and between the floating gate electrode 3 and the control gate electrode 5.

Figure 34:
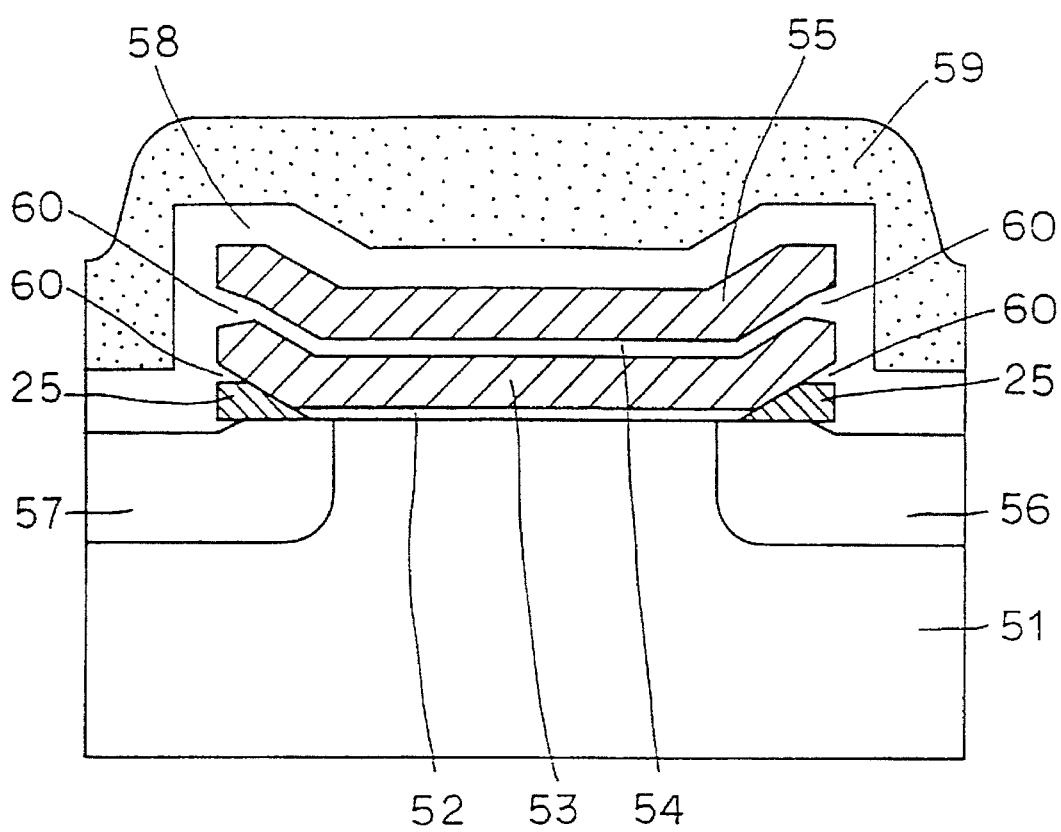
FIG. 34 is a cross section of a Flash EEPROM of a fifth embodiment of the invention.

Referring to FIG. 34, the Flash EEPROM of a fifth embodiment includes a semiconductor substrate 51 formed of silicon, as well as a drain impurity diffusion layer 56 and a source impurity diffusion layer 57, which are formed on the semiconductor substrate 51 and are spaced from each other by a predetermined distance with a channel region therebetween. The Flash EEPROM also includes a first gate oxide film 52 which is formed on the channel region, a predetermined region of the drain impurity diffusion layer 56 and a predetermined region of the source impurity diffusion layer 57, and nitride films 25 which surround the first gate oxide film 52 and have tapered shapes. The Flash EEPROM further includes a floating gate electrode 53 formed on and along the first gate oxide film 52 and the tapered portions of the nitride films 25, a control gate electrode 55 formed on the floating gate electrode 53 with an insulating film 54 therebetween, an interlayer thermal oxide film 58 covering the control gate electrode 55 and floating gate electrode 53, and an interlayer insulating film 59 covering the interlayer thermal oxide film 58. Between the nitride films 25 and the floating gate electrode 53 and between the floating gate electrode 53 and the control gate electrode 55, there are located gate bird's beak oxide films 60 which are formed by the entry of oxidizer ($H_2O$) during the formation of the interlayer insulating film 59. In this fifth embodiment, the tapered nitride films 25 surround the first gate oxide film 52. The tapered shapes of the nitride films 25 prevent the formation of the gate bird's beak oxide film at the opposite ends of the first gate oxide film 52, and further suppress the concentration of field at the boundary between the first gate oxide film 52 and the nitride films 25, as compared with the first to fourth embodiments.

Figure 35:
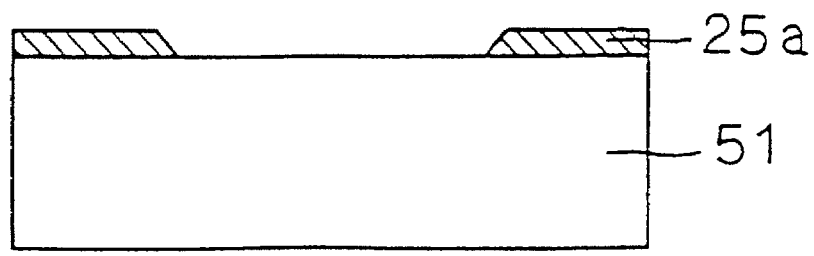
FIGS. 35 and 36 are cross sections showing first and final steps of a manufacturing process of a Flash EEPROM of a fifth embodiment shown in FIG. 34, respectively.
Figure 36:
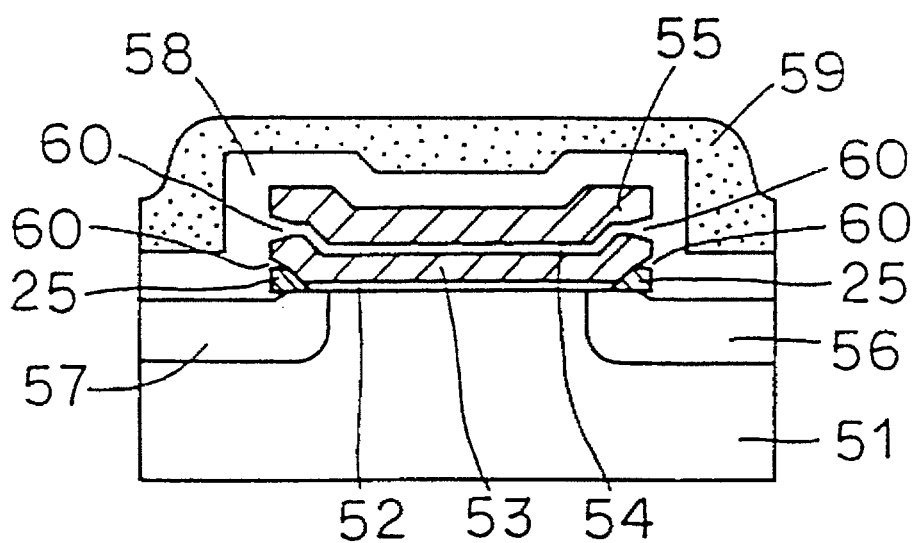

Referring to FIGS. 35 and 36, a manufacturing process of the Flask EEPROM of the fifth embodiment will be described below.

As shown in FIG. 35, a nitride film layer (not shown) is formed at a thickness of about 1000 Å on the whole surface of the semiconductor substrate 1 of silicon by the CVD method. The photolithography and dry etching are used to pattern the nitride film layer (not shown). Then, wet etching is utilized, and more specifically, the inner sides of the nitride films are formed into the tapered shapes by isotropic etching with hot phosphorous acid. Thereby, the nitride film layers 25a of the patterned shaped shown in FIG. 35 are obtained. The semiconductor substrate 1 is subjected to the thermal oxidation to form the first gate oxide film (not shown) of about 120 Å in thickness on the surface portion of the semiconductor substrate 1 on which the nitride film layers 25a are not formed. A floating gate electrode layer (not shown) of polysilicon is formed to a thickness of about 2000 Å on the first gate oxide film 2. An insulating film layer (not shown) of about 300 Å in thickness is formed on the floating gate electrode layer. A control gate electrode layer (not shown) of polysilicon is formed to a thickness of about 3000 Å on the insulating film layer. The photolithography and etching are used to pattern them, whereby the first gate oxide film 52, floating gate electrode 53, insulating film 54, control gate electrode 55 and nitride films 25 are formed as shown in FIG. 36. Using the floating gate electrode 53 and control gate electrode 55 as a mask, As ion is implanted into the semiconductor substrate 51 under the condition of $3 \times 15^{15}/\text{cm}^2$. Thereafter, the thermal diffusion technique is used to diffuse the impurity, so that the drain impurity diffusion layer 56 and source impurity diffusion layer 57 are formed.

After covering the whole surface with the interlayer thermal oxide film 8, the interlayer insulating film 9 containing the impurity such as phosphorus is formed to cover the interlayer thermal oxide film 8. The interlayer insulating film 9 is subjected to the heat treatment by the reflow method to flatten the same. Due to the heat treatment of the interlayer insulating film 9, the gate bird's beak oxide films 10 are formed between the nitride films 25 and the floating gate electrode 53 and between the floating gate electrode 53 and the control gate electrode 55. The nitride films 25 function to prevent movement of the oxidizer into the vicinity of the first gate oxide film 52 during the heat treatment of the interlayer insulating film 9. This effectively prevents the formation of the gate bird's beak oxide film 10 at the opposite ends of the first gate oxide film 52.

Figure 37:
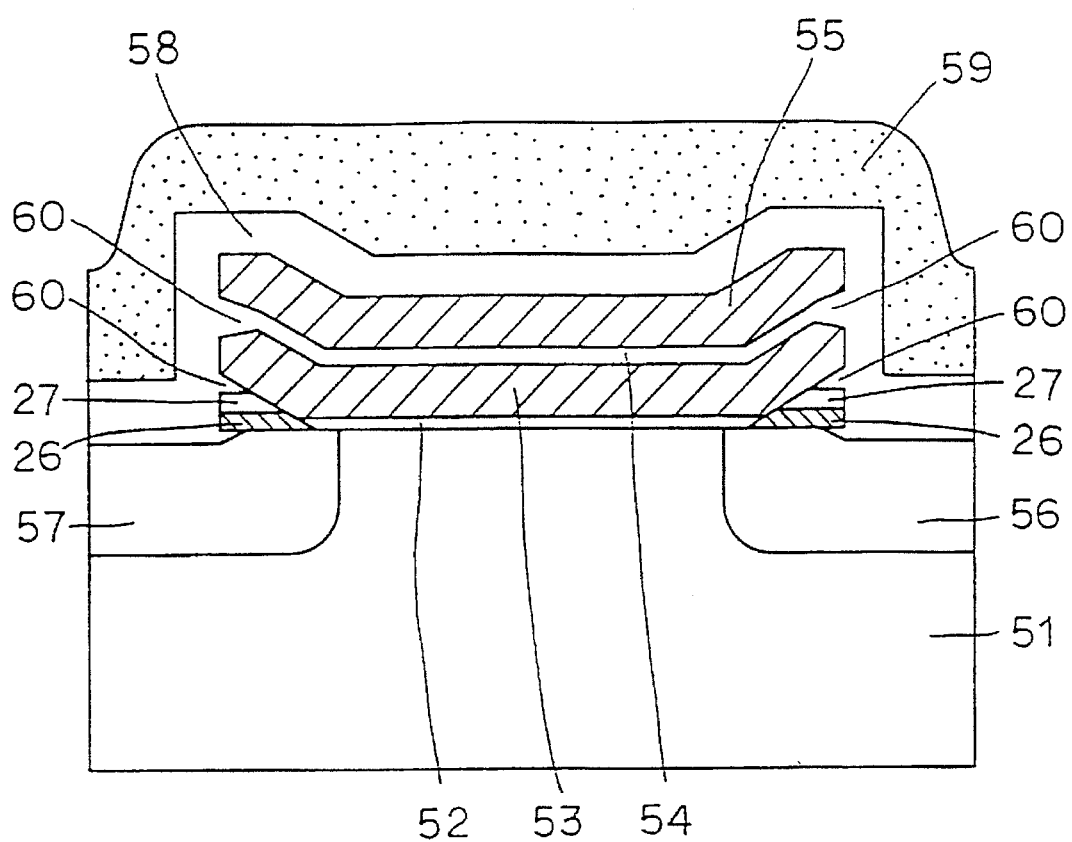
FIG. 37 is a cross section of a Flash EEPROM of a sixth embodiment of the invention.

Referring to FIG. 37, the Flash EEPROM of a sixth embodiment includes the semiconductor substrate 51 formed of silicon, as well as the drain impurity diffusion layer 56 and the source impurity diffusion layer 57, which are formed on the main surface of the semiconductor substrate 51 and are spaced from each other by a predetermined distance with the channel region therebetween. The Flash EEPROM also includes the first gate oxide film 52 which is formed on the channel region, a predetermined region of the drain impurity diffusion layer 56 and a predetermined region of the source impurity diffusion layer 57, nitride films 26 which surround the first gate oxide film 52 and are formed on the impurity diffusion layer 56 and source impurity diffusion layer 57. The nitride films 26 have tapered shapes. The Flash EEPROM further includes oxide films 27 formed on the nitride films 26 and having tapered portions continuing to the tapered portions of the nitride films 26, as well as the first gate oxide film 52, the floating gate electrode 53 formed on and along the nitride films 26 and oxide films 27, the control gate electrode 55 formed on the floating gate electrode 53 with the insulating film 54 therebetween, the interlayer thermal oxide film 58 covering the control gate electrode 55 and floating gate electrode 53, and the interlayer insulating film 59 covering the interlayer thermal oxide film 58 and containing impurity such as phosphorus. Between the oxide films 27 and the floating gate electrode 53 and between the upper ends of the floating gate electrode 53 and the lower ends of the control gate 55, there are located gate bird's beak oxide films 60, respectively.

In this sixth embodiment, the first gate oxide film 52 is surrounded by the two-layered films, i.e., nitride films 26 and oxide films 27 having the commonly tapered portions. Thereby, the gate bird's beak oxide films, which are formed by the entry of the oxidizer ($H_2O$) during the heat treatment of the interlayer insulating film 59, are located between the upper surfaces of the oxide films 27 and the lower ends of the floating gate electrode 3, and the gate bird's beak oxide film is not formed at the opposite ends of the first gate oxide film 52. Therefore, the over-erased phenomenon and the drain disturb phenomenon can be effectively prevented. Consequently, the Flash EEPROM has the good writing and erasing characteristics. The nitride films 26 function to prevent the movement of the oxidizer into the ends of the first gate oxide film 52 during the heat treatment of the interlayer insulating film 59, and the oxide films 27 function to improve the adherence between the nitride films 26 and the floating gate electrode 53. Further, the tapered shapes of the nitride films 26 and oxide films 27 serve to suppress the concentration of field at the boundaries between the nitride films 26 and first gate oxide film 52.

Figure 38:
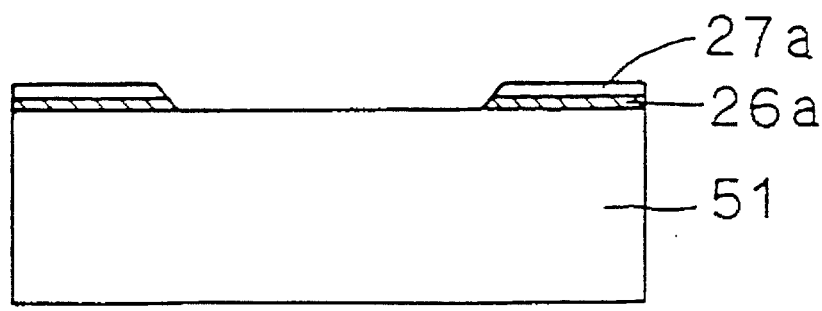
FIGS. 38 and 39 are cross sections showing first and final steps of a manufacturing process of a Flash EEPROM of a sixth embodiment shown in FIG. 37, respectively.
Figure 39:
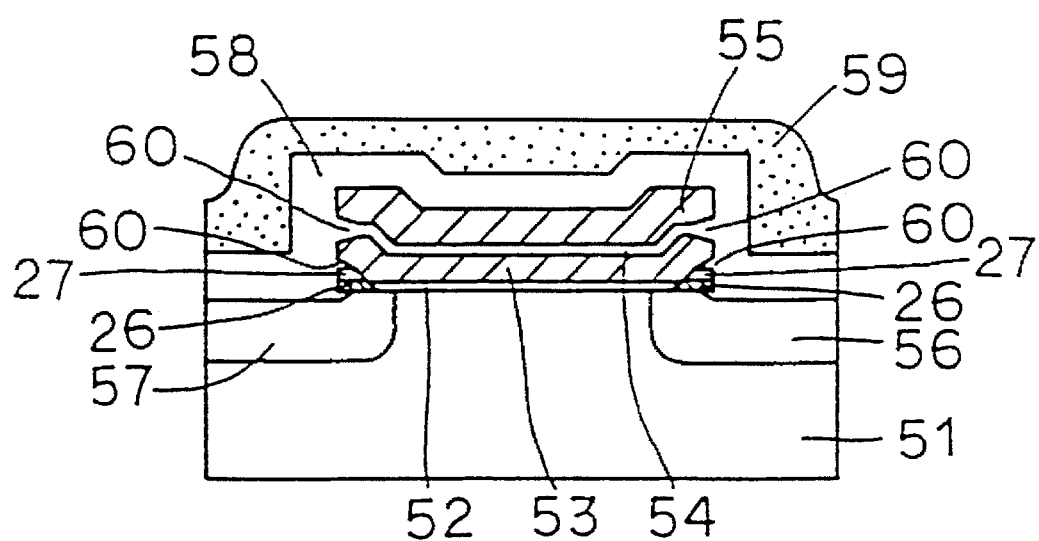

Referring to FIGS. 38 and 39, a manufacturing process of the Flash EEPROM of the sixth embodiment will be described below.

As shown in FIG. 38, a nitride film layer (not shown) is formed at a thickness of about 500 Å on the whole surface of the semiconductor substrate 1 of silicon by the CVD method. An oxide film layer (not shown,) is formed at a thickness of about 500 Å on the nitride film layer by the CVD method. Thereafter, the photolithography and dry etching are used to pattern the nitride film layer and oxide film layer, and then the wet etching is used to form the tapered shapes of the inner sides of the nitride film layers and the oxide film layers, as shown in FIG. 38. More specifically, in order to form the tapered shapes shown in FIG. 38, the oxide film is subjected to an isotropic etching with hydrofluoric acid to a slightly larger extent, using a resist (not shown) as a mask. Thereafter, the isotropic etching is applied to the nitride film layers with the hot phosphoric acid, using the same resist as a mask, whereby the tapered shapes as shown in FIG. 38 are formed. Thereafter, the process similar to the manufacturing process of the fifth embodiment, which has been already described with reference to FIGS. 35 and 36, is used to complete the Flash EEPROM of the sixth embodiment shown in FIG. 39.

Figure 40:
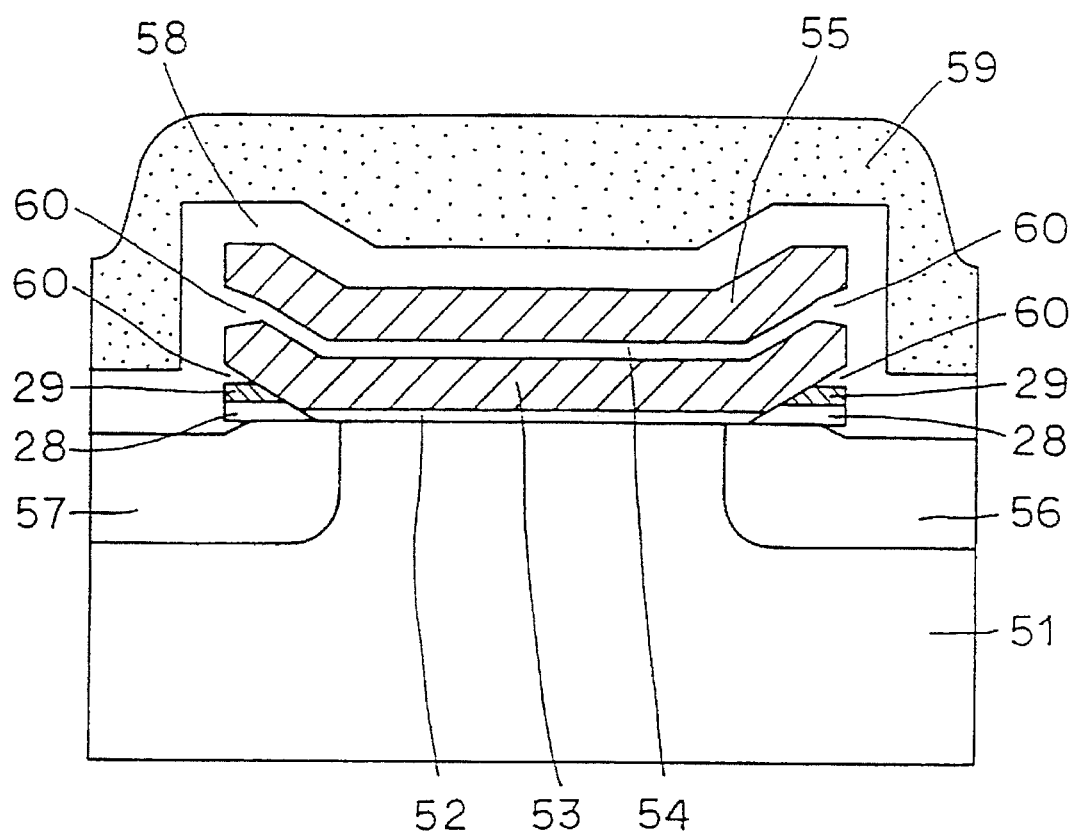
FIG. 40 is a cross section of a Flash EEPROM of a seventh embodiment of the invention.

Referring to FIG. 40, the Flash EEPROM of a seventh embodiment includes the semiconductor substrate 51 formed of silicon, as well as the drain impurity diffusion layer 56 and the source impurity diffusion layer 57, which are formed on the main surface of the semiconductor substrate 51 and are spaced from each other by a predetermined distance with the channel region therebetween. The Flash EEPROM also includes the first gate oxide film 52 which is formed on the channel region, a predetermined region of the drain impurity diffusion layer 56 and a predetermined region of the source impurity diffusion layer 57, oxide films 28 which surround the opposite ends of the first gate oxide film 52 and have tapered shapes. The Flash EEPROM further includes nitride films 29 formed on the oxide films 28 and having tapered shapes similar to the tapered shapes of the oxide films 28, and the floating gate electrode 53, which is formed on and along the first gate oxide film 52, tapered portions of the oxide films 28 and tapered portions of the nitride films 29, as well as the control gate electrode 55 formed on the floating gate electrode 53 with the insulating film 54 therebetween, the interlayer thermal oxide film 58 covering the control gate electrode 55 and floating gate electrode 53, and the interlayer insulating film 59 covering the interlayer thermal oxide film 58 and containing the impurity such as phosphorus. Between the upper surfaces of the nitride films 29 and the lower ends of the floating gate electrode 53 and between the upper ends of the floating gate electrode 53 and lower ends of the control gate 55, there are located gate bird's beak oxide films 60, respectively, which are formed by entry of the oxidizer during the heat treatment of the interlayer insulating film 59. Since the nitride films 29 function to prevent entry of the oxidizer, it is possible to prevent progress of oxidization of the gate bird's beak oxide films 60 located between the nitride films 29 and the floating gate electrode 53. The oxide films 28 function to improve the adherence between the nitride films 29 and the semiconductor substrate 51. In the seventh embodiment, as described above, the gate bird's beak oxide films 60 are not formed at the opposite ends of the first gate oxide film 52. As a result, it is possible to effectively prevent the drain disturb phenomenon in the data writing operation and the over-erased phenomenon in the data erasing operation, which may be caused by the field concentration. Thereby, the Flash EEPROM has the good writing and erasing characteristics. The tapered shapes of the oxide films 28 and nitride films 29 serve to suppress the concentration of field at the boundary portions between the oxide films 28 and the first gate oxide film 52.

Figure 41:
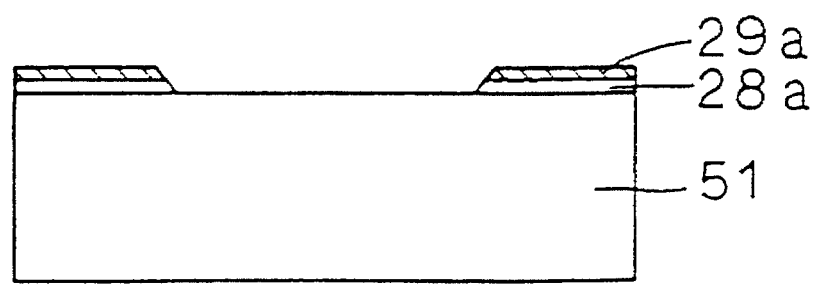
FIGS. 41 and 42 are cross sections showing first and final steps of a manufacturing process of a Flash EEPROM of a seventh embodiment shown in FIG. 40, respectively.
Figure 42:
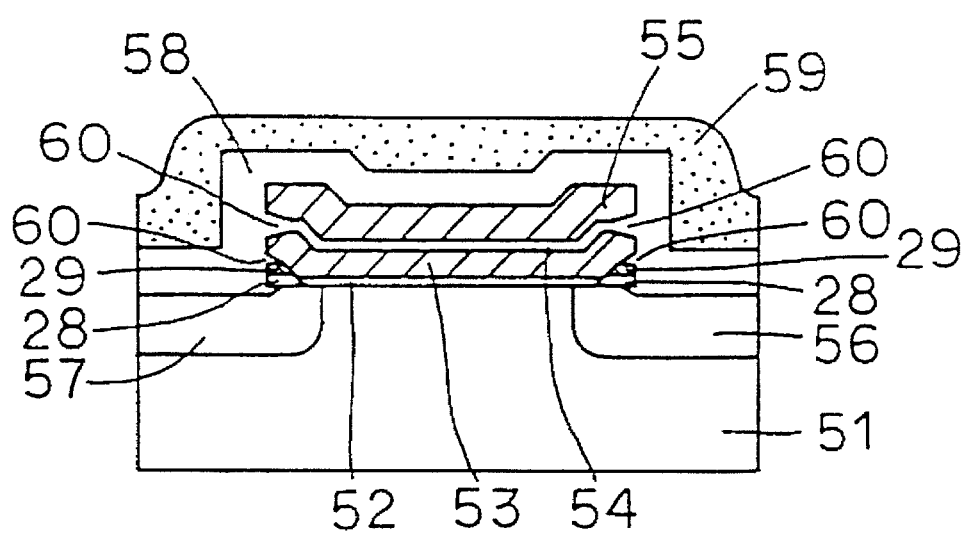

Referring to FIGS. 41 and 42, a manufacturing process of the Flash EEPROM of the seventh embodiment will be described below.

As shown in FIG. 41, an oxide film layer (not shown) is formed to a thickness of about 500 Å on the whole surface of the semiconductor substrate 51 of silicon by the CVD method. A nitride film layer (not shown) is formed to a thickness of about 500 Å on the oxide film layer by the CVD method. Thereafter, the dry etching and photolithography are used to pattern the nitride film layer and oxide film layer, and then the wet etching is used to form oxide film layers 28a and nitride film layers 29a having tapered shapes as shown in FIG. 41. More specifically, a resist (not shown) on the nitride film layers (not shown), which are patterned into vertical forms, is used as a mask, and the isotropic etching is applied to the nitride film layer with the hot phosphoric acid to a slightly larger extent. Thereafter, using the same resist, the isotropic etching is applied to the oxide film layer (not shown) with hydrofluoric acid to a smaller extent. Thereby, the oxide film layers 28a and nitride film layers 29a have the tapered shapes shown in FIG. 41. Thereafter, the process similar to the manufacturing process of the fifth embodiment, which has been already described with reference to FIGS. 35 and 36, is used to complete the Flash EEPROM of the seventh embodiment shown in FIG. 42.

Figure 43:
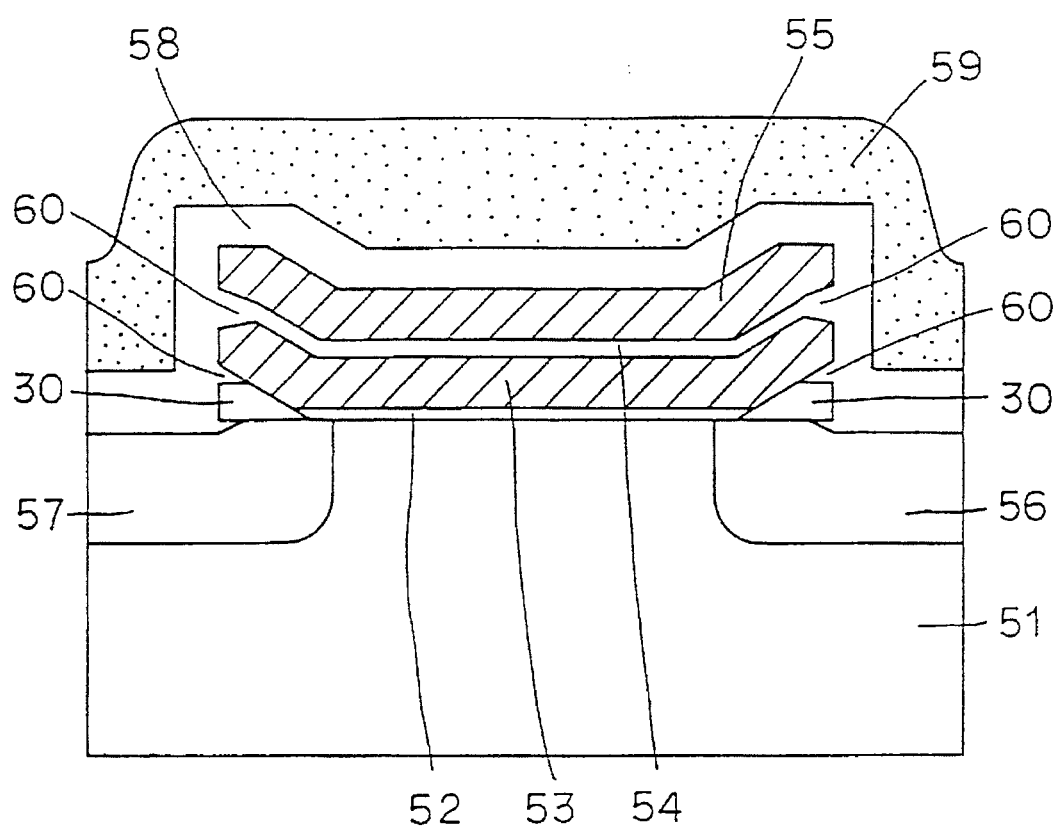
FIG. 43 is a cross section of a Flash EEPROM of an eighth embodiment of the invention.

Referring to FIG. 43, the Flash EEPROM of an eighth embodiment includes the semiconductor substrate 51 formed of silicon, as well as the drain impurity diffusion layer 56 and the source impurity diffusion layer 57, which are formed on the main surface of the semiconductor substrate 51 and are spaced from each other by a predetermined distance with the channel region therebetween. The Flash EEPROM also includes the first gate oxide film 52 which is formed on the channel region, a predetermined region of the drain impurity diffusion layer 56 and a predetermined region of the source impurity diffusion layer 57, oxide films 30 which surround the first gate oxide film 52 and have tapered portions formed on the drain impurity diffusion layer 56 and the source impurity diffusion layer 57. The Flash EEPROM further includes the floating gate electrode 53 formed on the first gate oxide film and the tapered portions of the oxide films 30, as well as the control gate electrode 55 formed on the floating gate electrode 53 with the insulating film 54 therebetween, the interlayer thermal oxide film 58 covering the control gate electrode 55 and floating gate electrode 53, and the interlayer insulating film 59 covering the interlayer thermal oxide film 58 and containing the impurity such as phosphorus.

Between the upper surfaces of the oxide films 30 and the lower ends of the floating gate electrode 53 and between the upper ends of the floating gate electrode 53 and the lower ends of the control gate 55, there are located the gate bird's beak oxide films 60, respectively, which are formed by entry of the oxidizer during the formation of the interlayer insulating film 59. Since the floating gate electrode 53 has the opposite ends obliquely protruded over the oxide films 30, the gate bird's beak oxide films 60 located at the lower ends of the floating gate electrode 53 are formed on the upper surfaces of the oxide films 20. This effectively prevents the formation of the gate bird's beak oxide films 60 at the opposite ends of the first gate oxide film 52. Thereby, it is possible to effectively prevent the over-erased phenomenon in the data erasing operation and the drain disturb phenomenon in the data writing operation. Further, the oxide films 30 have the tapered shapes. Therefore, at the boundary portions between the first gate oxide film 52 and the oxide films 30, it is possible to suppress the field concentration between the floating gate electrode 53 and the drain impurity diffusion layer 56 and between the floating gate electrode 53 and the source impurity diffusion layer 57.

Figure 44:
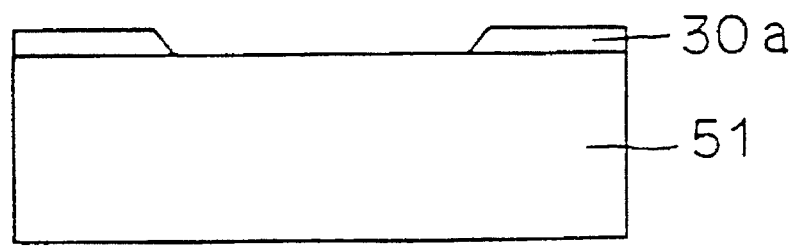
FIGS. 44 and 45 are cross sections showing first and final steps of a manufacturing process of a Flash EEPROM of an eighth embodiment shown in FIG. 43, respectively.
Figure 45:
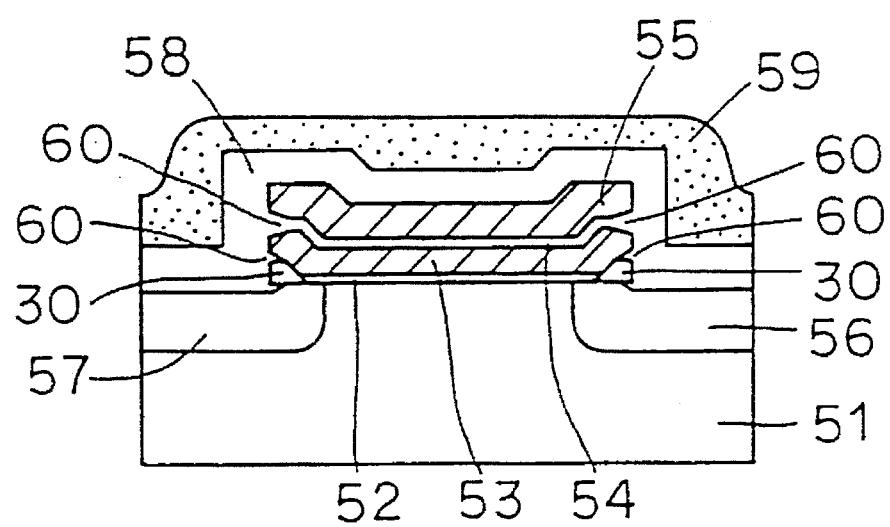

Referring to FIGS. 44 and 45, a manufacturing process of the Flash EEPROM of the eighth embodiment will be described below.

As shown in FIG. 44, the oxide film layer (not shown) is formed to a thickness of about 1000 Å on the whole surface of the semiconductor substrate 51 of silicon by the CVD method. The photolithography and dry etching are used to pattern the oxide film layer. Then, the resist (not shown 1, which was used for the dry etching, is used as a mask, and the wet etching is used to apply the isotropic etching to the inner sides of the oxide film layers (not shown) with the hydrofluoric acid. Thereby, oxide film layers 30a having the tapered shapes shown in FIG. 44 are formed. Thereafter, the process similar to the manufacturing process of the fifth embodiment, which has been already described with reference to FIGS. 35 and 36, is used to complete the Flash EEPROM of the eighth embodiment shown in FIG. 45.

Figure 46:
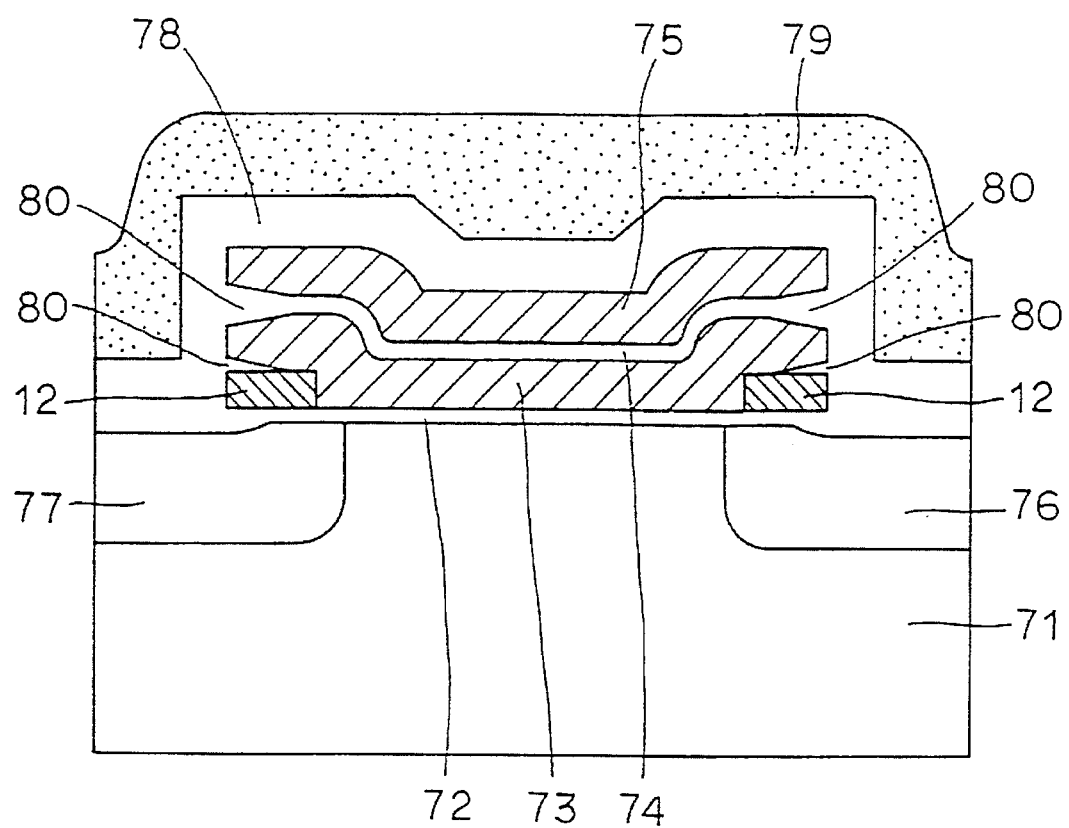
FIG. 46 is a cross section of a Flash EEPROM of a ninth embodiment of the invention.

Referring to FIG. 46, the Flash EEPROM of a ninth embodiment includes a semiconductor substrate 71 formed of silicon, as well as a drain impurity diffusion layer 76 and a source impurity diffusion layer 77, which are formed on the semiconductor substrate 71 and are spaced from each other through a predetermined distance with the channel region therebetween. The Flash EEPROM also includes a first gate oxide film 72 formed at a thickness of about 120 Å on the channel region, drain impurity diffusion layer 76 and source impurity diffusion layer 77, nitride films 12 which are formed at a thickness of about 1000 Å on the first gate oxide film 72 and are located above the drain impurity diffusion layer 76 and source impurity diffusion layer 77, a floating gate electrode 73 which is formed on and along the first gate oxide film 72 as well as side and upper surfaces of the nitride films 12, a control gate electrode 75 formed on the floating gate electrode 73 with an insulating film 74 therebetween, an interlayer thermal oxide film 78 covering the control gate electrode 75 and floating gate electrode 73, and an interlayer insulating film 79 covering the interlayer thermal oxide film 78 and containing phosphorus. Gate bird's beak oxide films 80, which are formed by the entry of the oxidizer during the heat treatment of the interlayer insulating film 79, are located between the upper surfaces of the nitride films 12 and the lower ends of the floating gate electrode 73 and between the upper ends of the floating gate electrode 73 and the lower ends of the control gate electrode 75.

In the ninth embodiment, as described above, the opposite ends of the floating gate electrode 73 are protruded over the nitride films 12. Thereby, the gate bird's beak oxide films 80 formed at the opposite ends of the floating gate electrode 73 are located on the nitride film 12. This construction effectively prevents the formation of the gate bird's beak oxide film 80 at the regions of the first gate oxide film 72, which are located between the drain impurity diffusion layer 76 and the floating gate electrode 73, and between the source impurity diffusion layer 77 and the floating gate electrode 73. Thereby, the drain disturb phenomenon in the data writing operation and the over-erased phenomenon in the data erasing operation are effectively prevented. As a result, the Flash EEPROM has the good writing and erasing characteristics.

Basic components of the two-layered Flash EEPROM are formed of the first gate oxide film 72, floating gate electrode 73, insulating film 74, control gate electrode 75, drain impurity diffusion layer 76 and source impurity diffusion layer 77. The interlayer thermal oxide film 78 serves to prevent the impurity such as phosphorus or boron contained in the interlayer insulating film 79 from moving into the semiconductor substrate 71, control gate electrode 75 and/or floating gate electrode 73.

Referring to FIGS. 47–58, a manufacturing process of the Flash EEPROM of the ninth embodiment will be described below.

Figure 47:
FIGS. 47–58 are cross sections showing first to twelfth steps of a manufacturing process of a Flash EEPROM of a ninth embodiment shown in FIG. 46, respectively.
Figure 48:
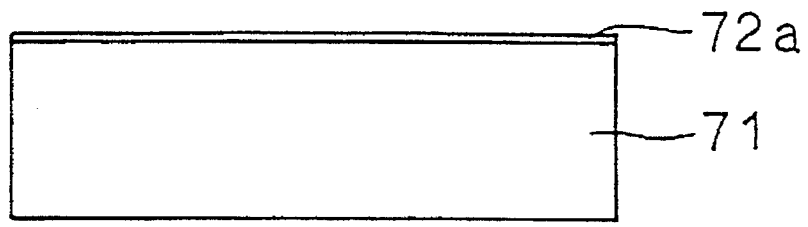

The process starts from the state shown in FIG. 47 and proceeds to the state shown in FIG. 48, in which the first gate oxide film layer 72a is formed to a thickness of about 120 Å on the main surface of the semiconductor substrate 1.

Figure 49:
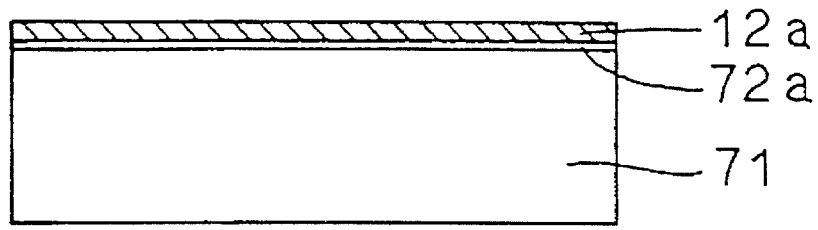
Figure 50:
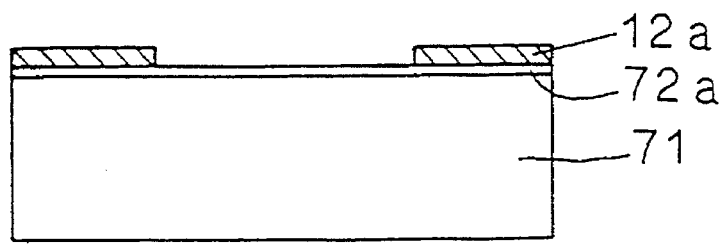

Then, as shown in FIG. 49, a nitride film layer 12a is formed at a thickness of about 1000 Å on the first gate oxide film layer 72a by the CVD method. The photolithography and dry etching are used to pattern the nitride film layer 12a to form the nitride film layers 12a shown in FIG. 50.

Figure 51:
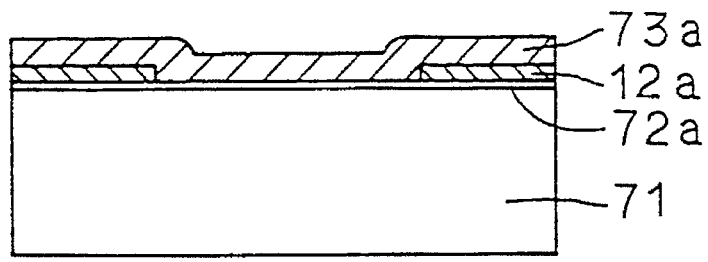
Figure 52:
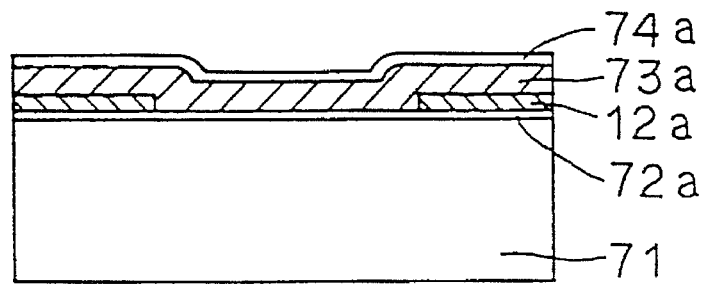
Figure 53:
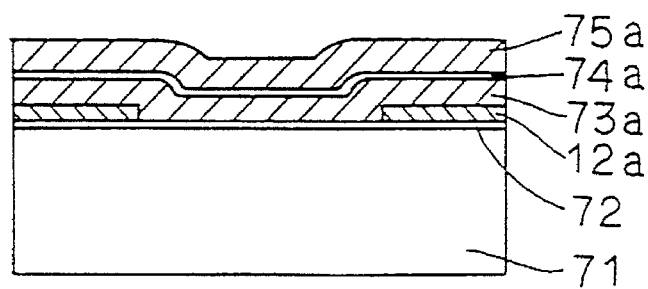
Figure 54:
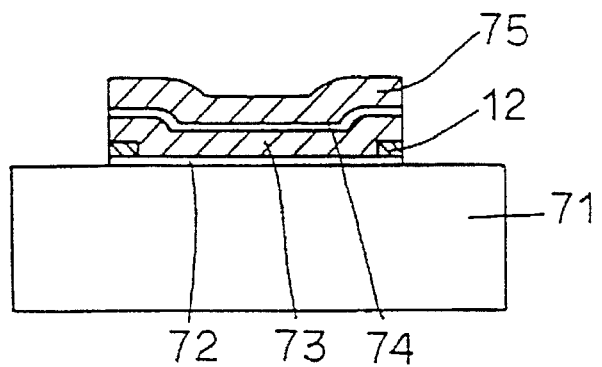

As shown in FIG. 51, a floating gate electrode layer 73a of polysilicon is formed at a thickness of about 2000 Å on the whole surface by the CVD method. As shown in FIG. 52, an insulating film layer 74a having a thickness of about 300 Å is formed on the floating gate electrode layer 73a. Thereafter, as shown in FIG. 53, the control gate electrode layer 75a of polysilicon is formed at a thickness of about 3000 Å on the insulating film layer 74a. The photolithography and dry etching are used to obtain an intended pattern. Thereby, the first gate oxide film 72, floating gate electrode 73, insulating film 74, control gate electrode 75 and nitride films 12 are formed as shown in FIG. 54.

Figure 55:
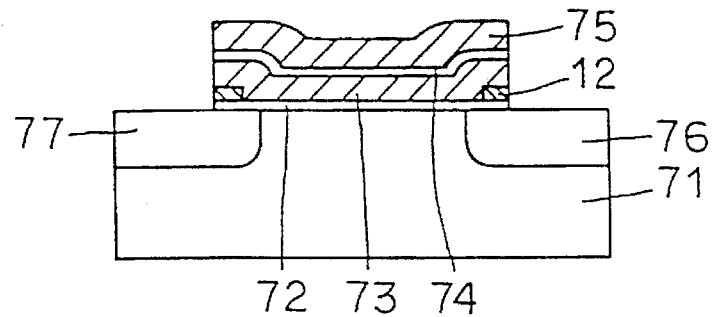

As shown in FIG. 55, the control gate electrode 75 and floating gate electrode 73 are used as a mask, and As ion is implanted into the semiconductor substrate 1 in the self-alignment manner under the condition of $3 \times 10^{15}/cm^2$. The thermal diffusion technique is used to diffuse the impurity, whereby the drain impurity diffusion layer 76 and source impurity diffusion layer 77 are formed.

Figure 56:
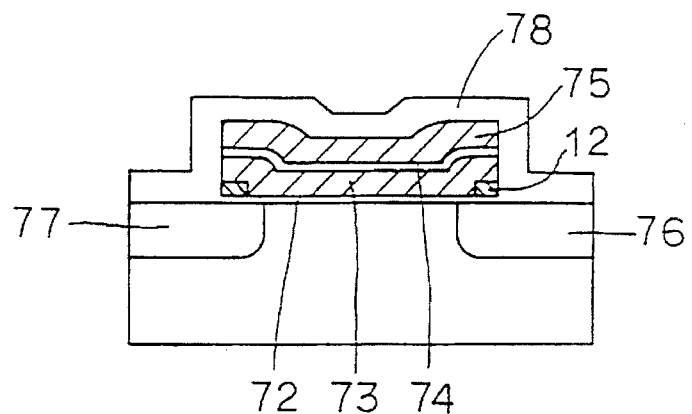
Figure 57:
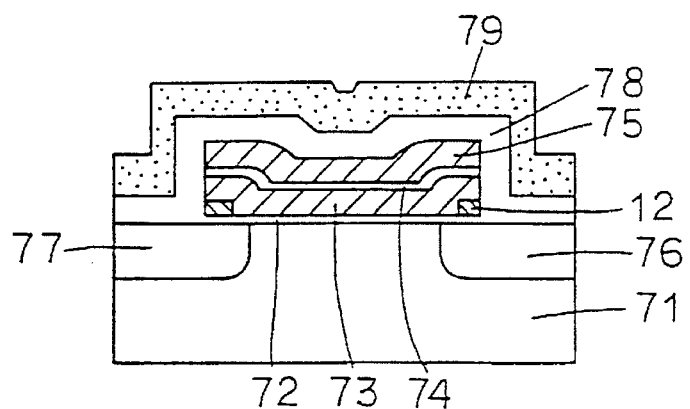
Figure 58:
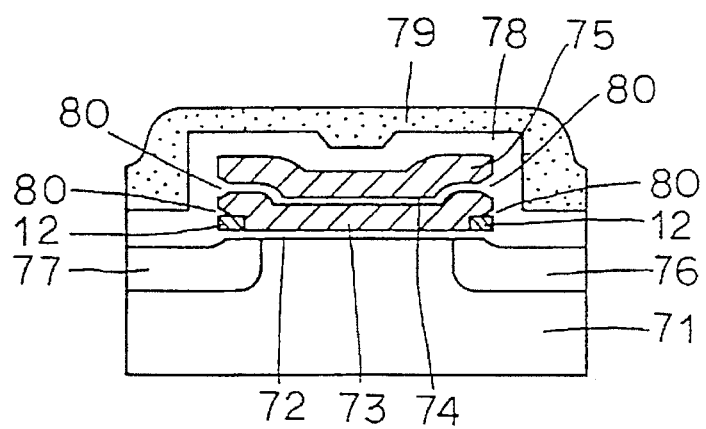

Then, as shown in FIG. 56, the whole surface is covered with the interlayer thermal oxide film 78. As shown in FIG. 57, the interlayer thermal oxide film 78 is covered with the interlayer insulating film 79 containing the impurity such as phosphorus. Finally, as shown in FIG. 58, the interlayer insulating film 79 is flattened by the heat treatment in the reflow method. Due to the entry of the oxidizer ($H_2O$) during the heat treatment of the interlayer insulating film 79, the gate bird's beak oxide films 80 are formed between the nitride films 12 and the ends of the floating gate electrode 73 and between the floating gate electrode 73 and the control gate electrode 75. In this manner, the Flash EEPROM of the ninth embodiment is completed.

Figure 59:
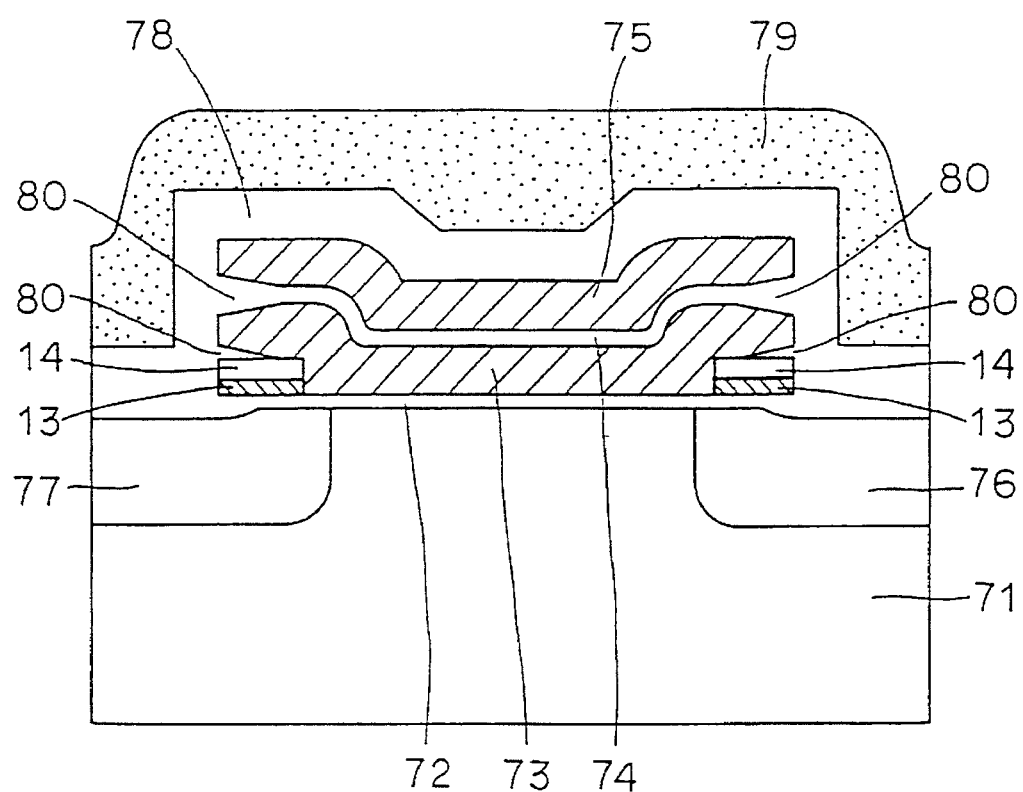
FIG. 59 is a cross section of a Flash EEPROM of a tenth embodiment of the invention.

Referring to FIG. 59, the Flash EEPROM of a tenth embodiment includes the semiconductor substrate 71 formed of silicon, as well as the drain impurity diffusion layer 76 and the source impurity diffusion layer 77, which are formed on the semiconductor substrate 71 and are spaced from each other by a predetermined distance with the channel region therebetween. The Flash EEPROM also includes the first gate oxide film 72 formed at a thickness of about 120 Å on the channel region, a predetermined region of the drain impurity diffusion layer 76 and a predetermined region of the source impurity diffusion layer 77, nitride films 13 which are formed at a thickness of about 500 Å on the first gate oxide film 72 and are located above the drain impurity diffusion layer 76 and source impurity diffusion layer 77, oxide films 14 having a thickness of about 500 Å and formed on the nitride films 13, the floating gate electrode 73 which is formed on and along the first gate oxide film 72 and side surfaces of the nitride films 73 as well as the side and upper surfaces of the oxide films 14, the control gate electrode 75 formed on the floating gate electrode 73 with the insulating film 74 therebetween, the interlayer thermal oxide film 78 covering the control gate electrode 75, floating gate electrode 73 and the semiconductor substrate 71, and the interlayer insulating film 79 covering the interlayer thermal oxide film 78 and containing impurity such as phosphorus. The gate bird's beak oxide films 80, which are formed by the entry of the oxidizer ($H_2O$) during the heat treatment of the interlayer insulating film 79, are located between the upper surfaces of the oxide films 14 and the lower ends of the floating gate electrode 73 and between the upper ends of the floating gate electrode 73 and the lower ends of the control gate electrode 75.

In the Flash EEPROM of the tenth embodiment, as described above, the opposite ends of the floating gate electrode 73 are protruded over the two-layered films, i.e., nitride films 13 and oxide films 14. Owing to this construction, the gate bird's beak oxide films 80, which are formed under the lower ends of the floating gate electrode 72, are located on the oxide films 14. Consequently, the formation of the gate bird's beak oxide films 80 is prevented at the opposite ends of the region, which is in contact with the floating gate electrode 73, of the first gate oxide film 72. Consequently, it is possible to prevent the over-erased state, which may be caused by the excessive draw of the electrons from the floating gate electrode 73 in the data erasing operation, and the drain disturb phenomenon, i.e., the erasure of the data in the unselected cell in the data writing operation. The nitride films 13 serve to prevent the entry of oxidizer during the heat treatment of the interlayer insulating film 79. The oxide films 14 serve to improve the adherence between the nitride films 13 and the floating gate electrode 73.

Referring to FIGS. 60–65, a manufacturing process of the Flash EEPROM of the tenth embodiment will be described below.

Figure 60:
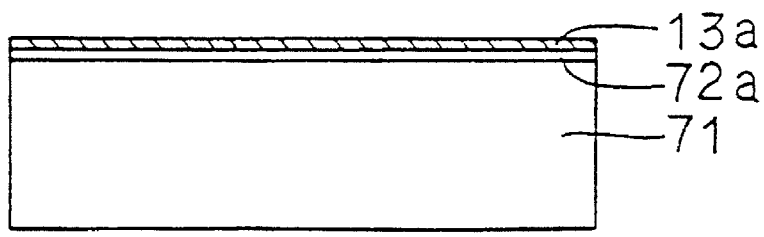
FIGS. 60–65 are cross sections showing first to sixth steps of a manufacturing process of a Flash EEPROM of a tenth embodiment shown in FIG. 59, respectively.
Figure 61:
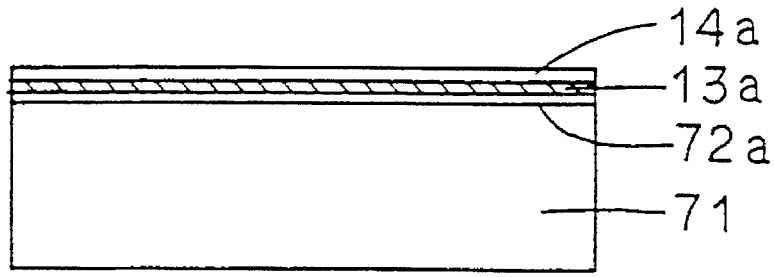
Figure 62:
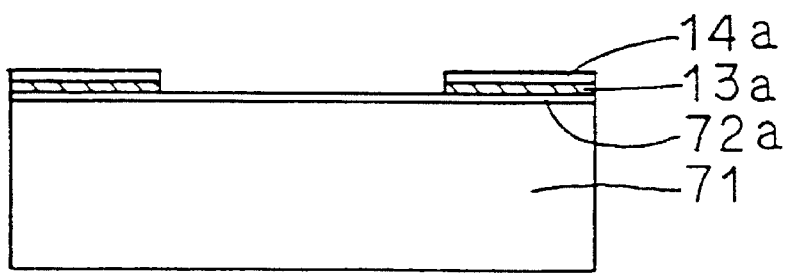
Figure 63:
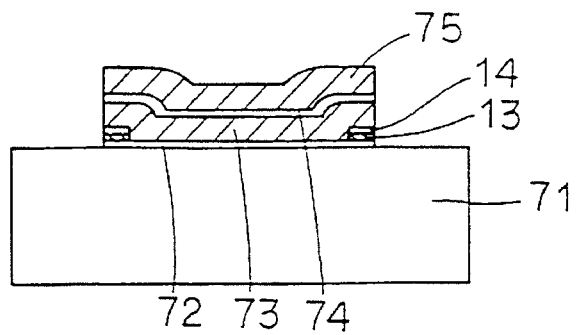

As shown in FIG. 60, the first gate oxide film layer 72a is formed to a thickness of about 120 Å on the semiconductor substrate 1 of silicon. A nitride film layer 13a is formed to a thickness of about 500 Å on the first gate oxide film layer 72a by the CVD method. As shown in FIG. 61 an oxide film layer 14a is formed to a thickness of about 500 Å on the nitride film layer 13a by the CVD method. The photolithography and dry etching are used to pattern the oxide film layer 14a and nitride film layer 13a to form the pattern shown in FIG. 62. A floating gate electrode layer (not shown) of polysilicon is formed to a thickness of about 2000 Å on the whole surface, and the insulating film layer (not shown) having a thickness of about 300 Å is formed on the floating gate electrode layer. The control gate electrode layer of polysilicon is formed at a thickness of about 3000 Å on the insulating film layer. The photolithography and dry etching are used for patterning them. Thereby, the first gate oxide film 72, floating gate electrode 73, insulating film 74, control gate electrode 75, nitride films 13 and oxide films 14 are formed, as shown in FIG. 63.

Figure 64:
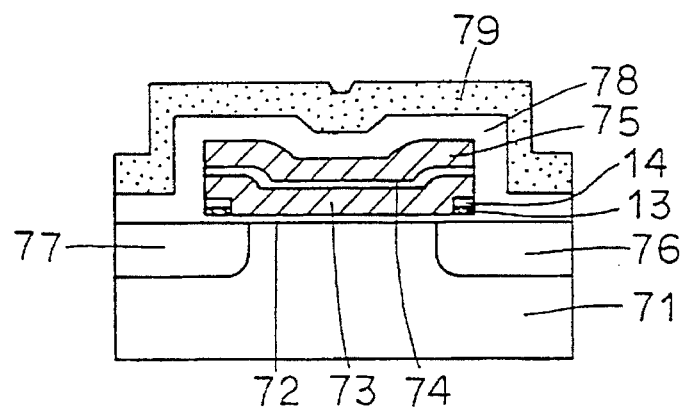

As shown in FIG. 64, after forming the interlayer thermal oxide film 78 covering whole surface, the interlayer thermal oxide film 78 is covered with the interlayer insulating film 79 containing the impurity such as phosphorus.

Figure 65:
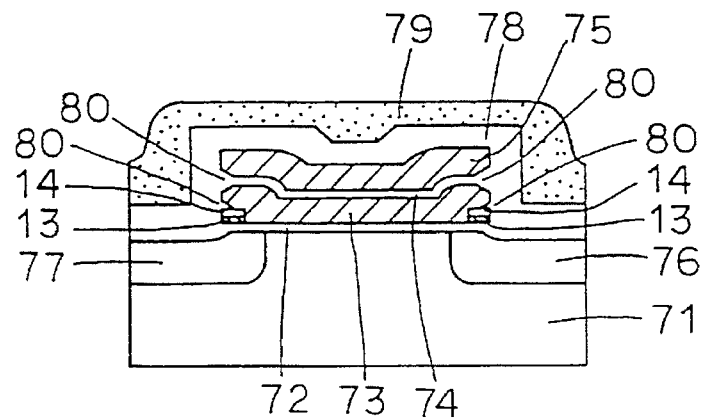

Finally, as shown in FIG. 65, the interlayer insulating film 79 is flattened by the heat treatment in the reflow method. Due to the heat treatment for flattening the interlayer insulating film 79, the oxidizer ($H_2O$) moves through the interlayer insulating film 79 to the vicinities of the semiconductor substrate 1, floating gate electrode 73 and control gate electrode 75. Thereby, the gate bird's beak oxide films 80 are formed between the oxide films 14 and the floating gate electrode 73 and between the floating gate electrode 73 and the control gate electrode 75.

Figure 66:
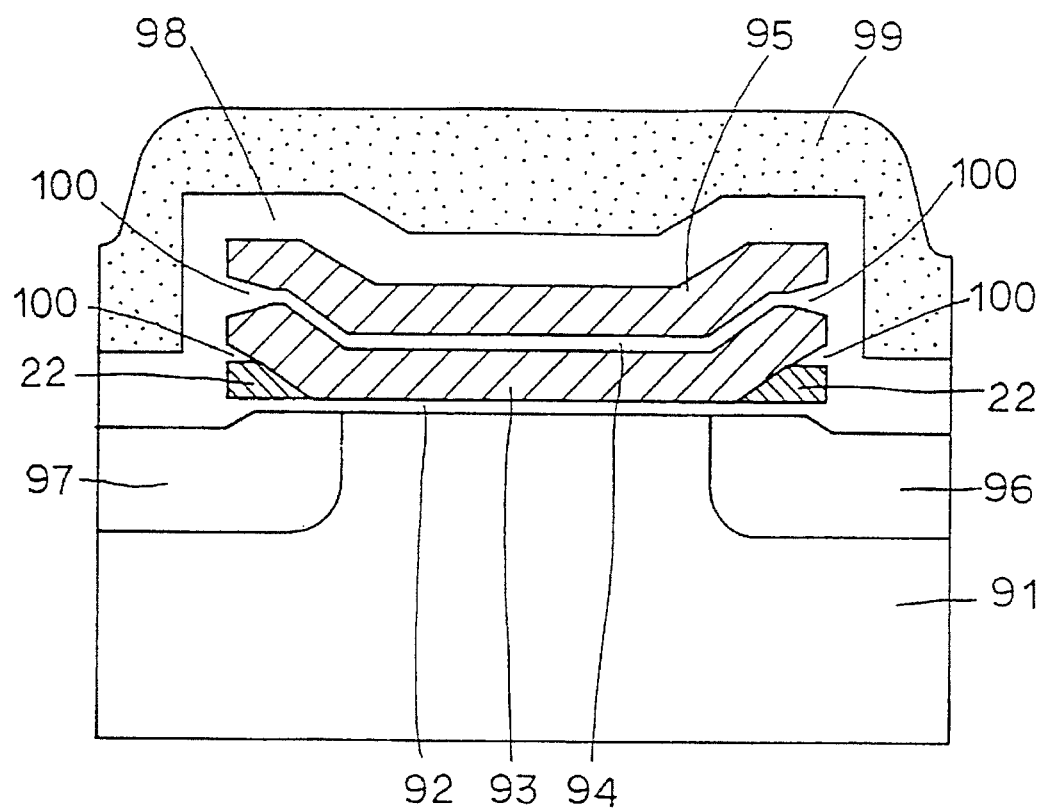
FIG. 66 is a cross section of a Flash EEPROM of an eleventh embodiment of the invention.

Referring to FIG. 66, the Flash EEPROM of the eleventh embodiment includes a semiconductor substrate 91 formed of silicon, as well as a drain impurity diffusion layer 96 and a source impurity diffusion layer 97, which are formed on a main surface of the semiconductor substrate 91 and are spaced from each other by a predetermined distance with a channel region therebetween. The Flash EEPROM also includes a first gate oxide film 92 which is formed on the channel region, a predetermined region of the drain impurity diffusion layer 96 and a predetermined region of the source impurity diffusion layer 97, nitride films 22 having tapered shapes formed on the first gate oxide film 92 and located above the drain impurity diffusion layer 96 and source impurity diffusion layer 97, a floating gate electrode 93 formed on and along the first gate oxide film 92 and tapered portions of the nitride films 22, a control gate electrode 95 formed on the floating gate electrode 93 with an insulating film 94 therebetween, an interlayer thermal oxide film 98 covering the control gate electrode 95 and floating gate electrode 93, an interlayer insulating film 99 covering the interlayer thermal oxide film 98 and containing the impurity such as phosphorus. Gate bird's beak oxide films 100, which are formed by the entry of oxidizer (H$_2$O) during the heat treatment of the interlayer insulating film 99, are located between the upper surfaces of the nitride films 22 and the lower ends of the floating gate electrode 93, and between the upper ends of the floating gate electrode 93 and the lower ends of the control gate electrode 95. The interlayer thermal oxide film 98 serves to prevent the impurity such as phosphorus or boron, which is contained in the interlayer insulating film 99, from moving into the semiconductor substrate 91, floating gate electrode 93 and control gate electrode 95. The nitride films 22 serve to prevent the oxidizer from moving into the first gate oxide film 92 during the heat treatment of the interlayer insulating film 99.

In this embodiment, the floating gate electrode 93 has the opposite ends protruded over the tapered nitride films 22. Owing to this construction, the gate bird's beak oxide films 100, which are formed at the lower ends of the floating gate electrode 93, are located on the upper surfaces of the nitride films 22. Thereby, the gate bird's beak oxide film 100 is not formed at the opposite ends of the region, which is in contact with the floating gate electrode 93, of the first gate oxide film 92. Thereby, the over-erased state, which may be caused by the excessive draw of electrons from the floating gate electrode 93 in the data erasing operation, is prevented. Also the drain disturb phenomenon, which may be caused by the excessive draw of the electrons in the unselected cell in the data writing operation, is suppressed. The tapered shapes of the nitride films 22 serve to suppress the field concentration at the boundary portions between the portions of the floating gate electrode 93 protruded over the nitride films 22 and the portions of the floating gate electrode 93 which are in contact with the first gate oxide film 92.

Figure 67:
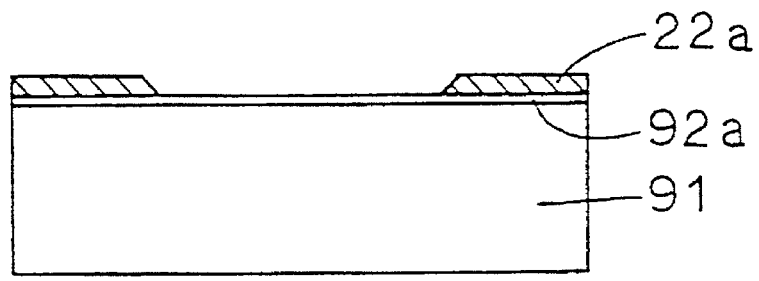
FIGS. 67 and 68 are cross sections showing first and final steps of a manufacturing process of a Flash EEPROM of an eleventh embodiment shown in FIG. 65, respectively.
Figure 68:
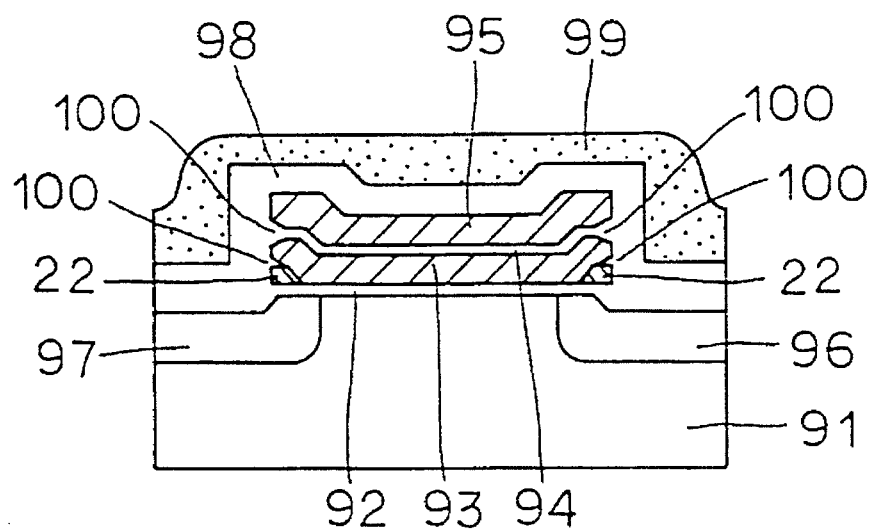

Referring to FIGS. 67 and 68, a manufacturing process of the Flash EEPROM of the eleventh embodiment will be described below.

As shown in FIG. 67, a first gate oxide film layer 92a is formed to a thickness of about 120 Å on the semiconductor substrate 91 of silicon. A nitride film layer (not shown) is formed at a thickness of 1000 Å on the first gate oxide film layer 92a by the CVD method. A resist (not shown) is formed on a predetermined region of the nitride film layer. The resist is used as a mask, and the anisotropic etching is applied to the nitride film layer for patterning the same. Thereafter, the resist is used as a mask, and the wee etching is used for applying the isotropic etching to the inner sides of the nitride film layers. Thereby, the nitride film layers 22a have the tapered shapes shown in FIG. 67. Thereafter, the process similar to the manufacturing process of the ninth embodiment, which has been already described with reference to FIGS. 51–58, is used to complete the Flash EEPROM of the eleventh embodiment shown in FIG. 68.

Figure 69:
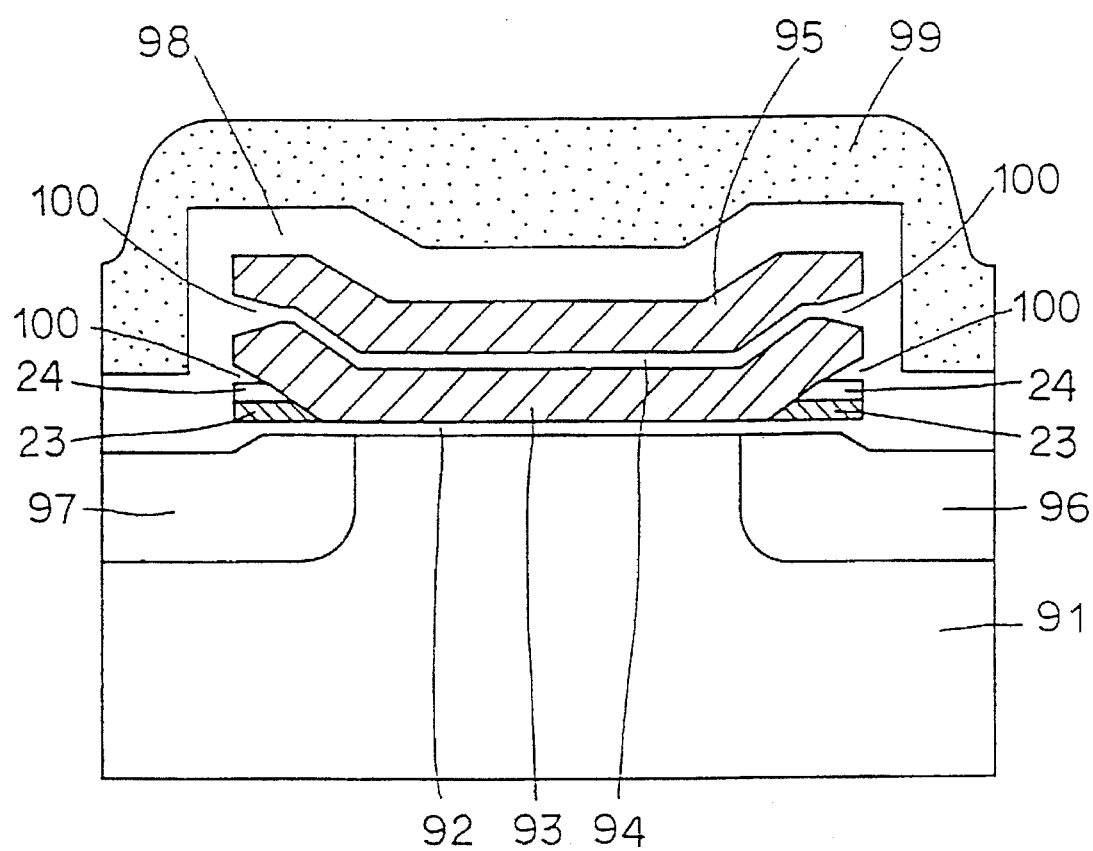
FIG. 69 is a cross section of a Flash EEPROM of a twelfth embodiment of the invention.

Referring to FIG. 69, the Flash EEPROM of the twelfth embodiment includes the semiconductor substrate 91 formed of silicon, as well as the drain impurity diffusion layer 96 and the source impurity diffusion layer 97, which are formed on the main surface of the semiconductor substrate 91 and are spaced from each other through a predetermined distance with a channel region therebetween. The Flash EEPROM also includes the first gate oxide film 92, which is formed on the channel region, a predetermined region of the drain impurity diffusion layer 96 and a predetermined region of the source impurity diffusion layer 97, nitride films 23 having tapered shapes formed on the first gate oxide film 92 and located above the drain impurity diffusion layer 96 and source impurity diffusion layer 97, oxide films 24 formed on the nitride films 23 and having tapered shapes similar to those of the nitride films 23, the floating gate electrode 93 formed on and along the first gate oxide film 92, tapered portions of the nitride films 23 and tapered portions of the oxide films 24, the control gate electrode 95 formed on the floating gate electrode 93 with the insulating film 94 therebetween, the interlayer thermal oxide film 98 covering the control gate electrode 95 and floating gate electrode 93, and the interlayer insulating film 99 covering the interlayer thermal oxide film 98 and containing the impurity such as phosphorus. The gate bird's beak oxide films 100, which are formed by the entry of oxidizer (H$_2$O) during the heat treatment of the interlayer insulating film 99, are located between the lower ends of the floating gate electrode 93 and the upper surfaces of the oxide films 24, and between the upper ends of the floating gate electrode 93 and the lower ends of the control gate electrode 95.

In this twelfth embodiment, the floating gate electrode 93 has the opposite ends protruded over the tapered nitride films 23 and oxide films 24. Owing to this construction, the gate bird's beak oxide films 100, which are formed at the lower ends of the floating gate electrode 92, are located on the oxide films 24. This construction effectively prevents the formation of the gate bird's beak oxide film 100 at the opposite ends of the region, which is in contact with the floating gate electrode 93, of the first gate oxide film 92. Therefore, it is possible to prevent the over-erased state, in which the electrons are excessively drawn from the floating gate electrode 93 to the source impurity diffusion layer 97 in the data erasing operation, and to prevent the drain disturb phenomenon, in which the electrons are drawn from the floating gate electrode 93 in the unselected cell toward the drain impurity diffusion layer 96 in the data writing operation. Thereby, the Flash EEPROM has the good writing and erasing characteristics. The nitride films 23 serve to prevent the entry of the oxidizer during the heat treatment of the interlayer insulating film 99. The oxide films 24 serve to improve the adherence between the nitride films 23 and floating gate electrode 93. The tapered shapes of the nitride films 23 and oxide films 24 serve to suppress the field concentration at the regions of the lower surface of the floating gate electrode 93 which are in contact with the nitride films 23.

Figure 70:
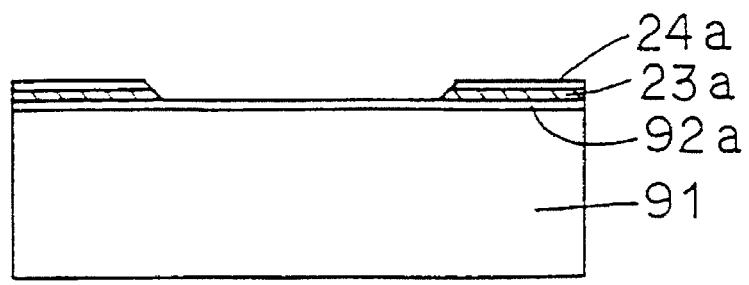
FIGS. 70 and 71 are cross sections showing first and final steps of a manufacturing process of a Flash EEPROM of a twelfth embodiment shown in FIG. 69, respectively.
Figure 71:
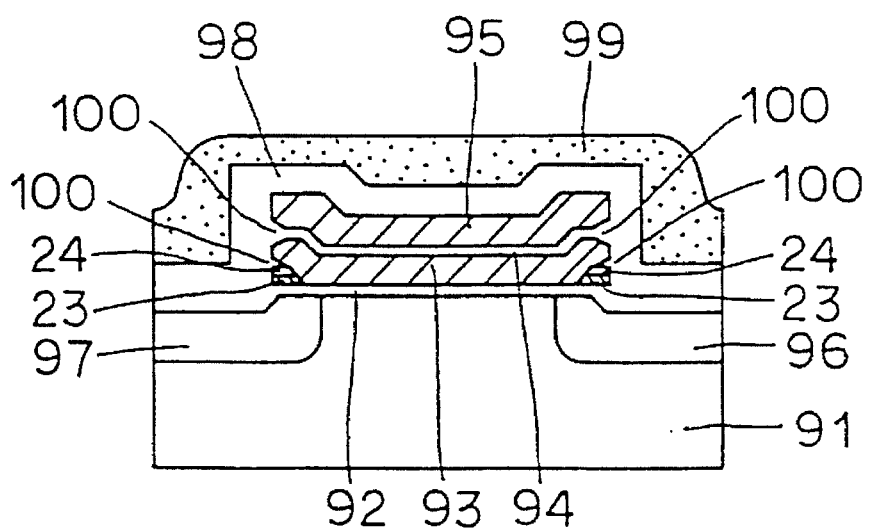

Referring to FIGS. 70 and 71, a manufacturing process of the Flash EEPROM of the twelfth embodiment will be described below.

As shown in FIG. 70, a first gate oxide film layer 92a of silicon having a thickness of about 120 Å is formed on the semiconductor substrate 91. After forming a nitride film layer (not shown) of 500 Å in thickness on the whole surface of the first gate oxide film layer 92a by the CVD method, an oxide film layer (not shown) having a thickness of about 500 Å is formed on the nitride film layer by the CVD method. After forming a resist on a predetermined region of the oxide film layer, the resist is used as a mask, and the anisotropic etching is applied to the oxide film layer and nitride film layer. Then, using the resist as a mask, the isotropic etching is applied to the oxide film layer with hydrofluoric acid to a slightly larger extent. Thereafter, the isotropic etching is applied to the nitride film layer with hot phosphoric acid to a slightly smaller extent. Thereby, the nitride film layers 23a and oxide film layers 24a having the tapered shapes shown in FIG. 70 are formed. Thereafter, the process similar to the manufacturing process of the Flash EEPROM of the ninth embodiment shown in FIGS. 51–58 is executed, and the Flash EEPROM of the twelfth embodiment shown in FIG. 71 is completed.

Figure 72:
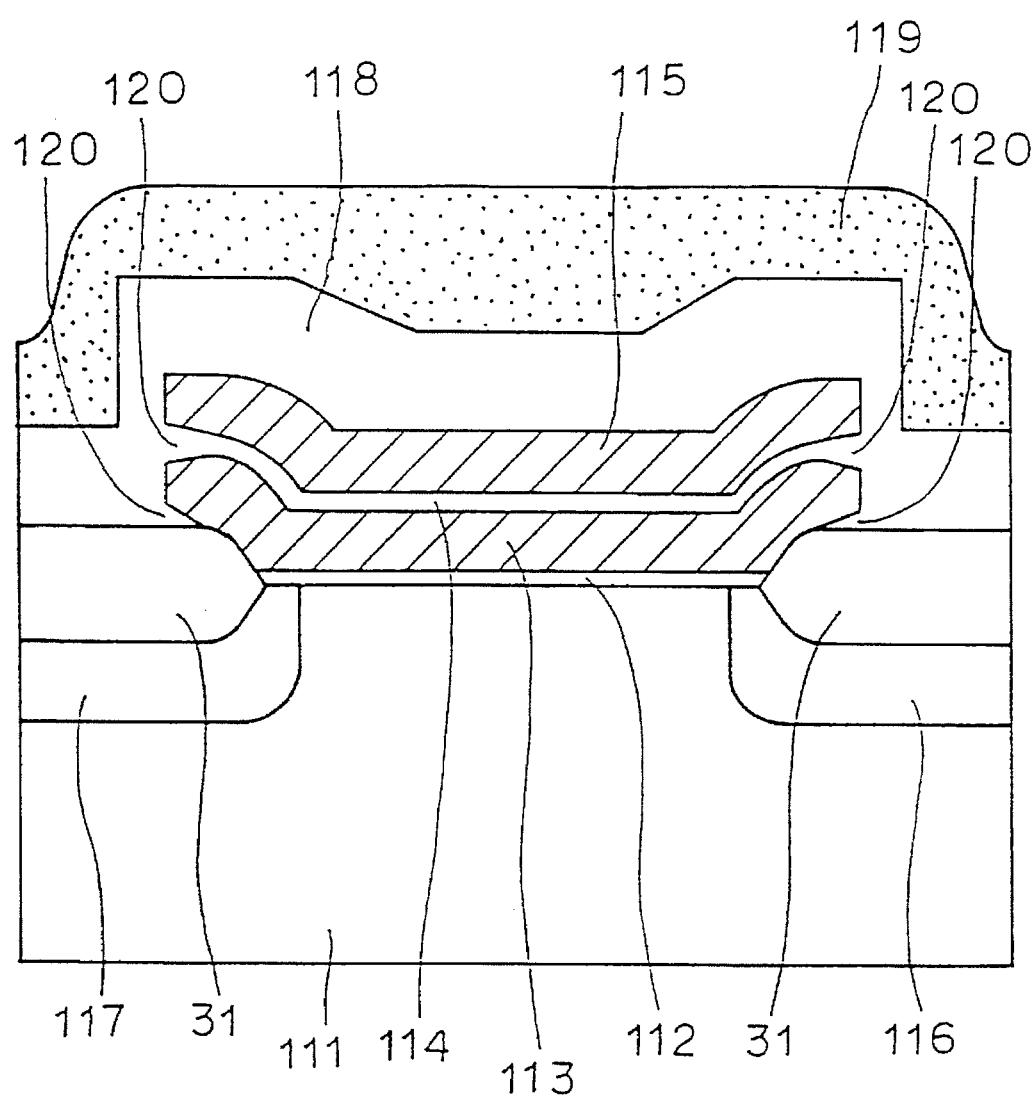
FIG. 72 is a cross section of a Flash EEPROM of a thirteenth embodiment of the invention.

Referring to FIG. 72, the Flash EEPROM of the thirteenth embodiment includes a semiconductor substrate 111 formed of silicon, as well as a drain impurity diffusion layer 116 and a source impurity diffusion layer 117, which are formed on a main surface of the semiconductor substrate 111 and are spaced from each other by a predetermined distance with a channel region therebetween. The Flash EEPROM also includes a first gate oxide film 112, which is formed at a thickness of about 120 Å on the channel region, a predetermined region of the drain impurity diffusion layer 116 and a predetermined region of the source impurity diffusion layer 117, as well as thermal oxide films 31, which surround the first gate oxide film 112 and have a thickness of about 2000 Å. The Flash EEPROM further includes a floating gate electrode 113 formed on the first gate oxide film 112 and thermal oxide films 31, a control gate electrode 115 formed on the floating gate electrode 113 with an insulating film 114 therebetween, an interlayer thermal oxide film 118 covering the thermal oxide films 31, floating gate electrode 113 and control gate electrode 115, and an interlayer insulating film 119 covering the interlayer thermal oxide film 118 and containing the impurity such as phosphorus. Gate bird's beak oxide films 120, which are formed by the entry of oxidizer ($H_2O$) during the heat treatment of the interlayer insulating film 119, are located between the upper surfaces of the thermal oxide films 31 and the lower ends of the floating gate electrode 113, and between the upper ends of the floating gate electrode 113 and the lower ends of the control gate electrode 115.

In this embodiment, there is provided the thick thermal oxide films 31 which surround the first gate oxide film 112, and the ends of the floating gate electrode 113 are protruded over the thermal oxide films 31. Owing to this construction, gate bird's beak oxide film layers 120, which are formed at the lower ends of the floating gate electrode 113, are located on the oxide films 31. This effectively prevents the formation of the gate bird's beak oxide film 120 at the regions of the first gate oxide film 112, which are located above the drain impurity diffusion layer 116 and source impurity diffusion layer 117. Consequently, the over-erased phenomenon and drain disturb phenomenon can be effectively prevented. Therefore, the Flash EEPROM has the good writing and erasing characteristics. The thermal oxide films 31 have the molecular density and inter-molecular force higher than those of a conventional CVD oxide film, and thus have a property that the oxidizer cannot easily pass therethrough. Therefore, the thermal oxide films 31 can effectively prevent oxidizer ($H_2O$) from moving into the first gate oxide film 112 during the heat treatment of the interlayer insulating film 119. Consequently, it is possible to effectively prevent the formation of the gate bird's beak oxide films 120 at the opposite ends of the first gate oxide film 112.

Referring to FIGS. 73–90, a manufacturing process of the Flash EEPROM of the thirteenth embodiment will be described below.

Figure 73:
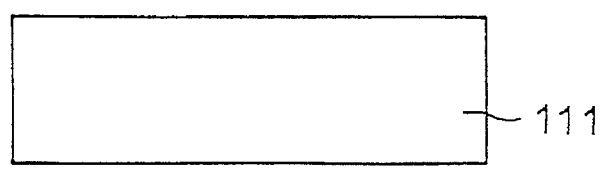
FIGS. 73–90 are cross sections showing first to eighteenth steps of a manufacturing process of a Flash EEPROM of a thirteenth embodiment shown in FIG. 72, respectively.
Figure 74:
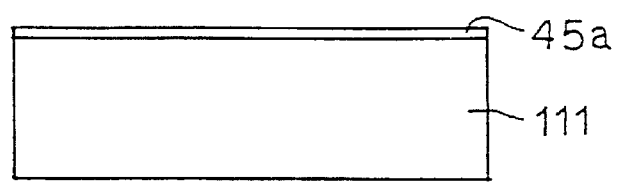
Figure 75:
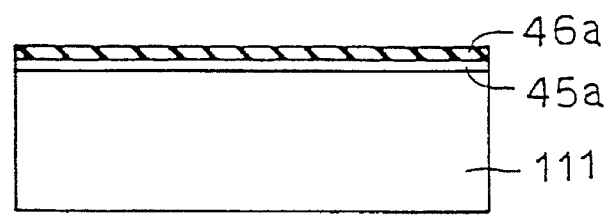
Figure 76:
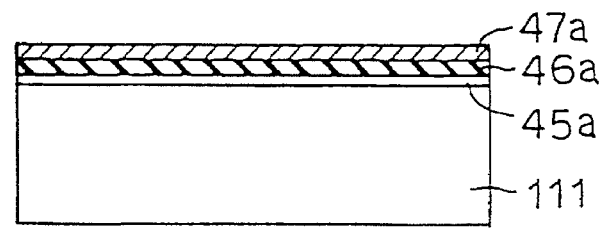
Figure 77:
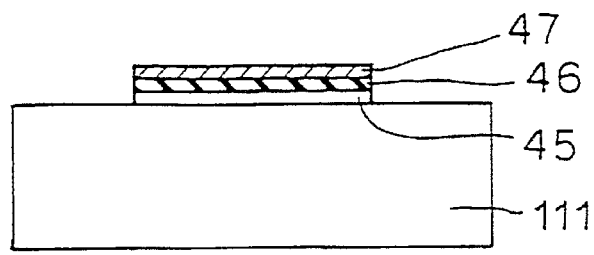
Figure 78:
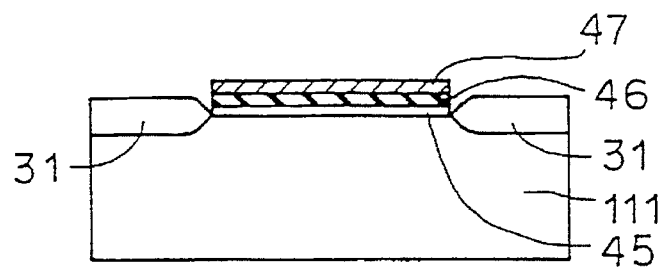
Figure 79:

The process starts from the state shown in FIG. 73, and a base oxide film layer 45a is formed at a thickness of about 300 Å on the semiconductor substrate 111 of silicon, using the thermal oxidation method, as shown in FIG. 74. Then, as shown in FIG. 75, a polysilicon layer 46a having a thickness of about 1000 Å is formed on the base oxide film layer 45a. As shown in FIG. 76, a silicon nitride layer 47a having a thickness of about 1000 Å is formed on the polysilicon layer 46a. After forming a resist (not shown) on a predetermined region of the silicon nitride layer 47a, the resist is used as a mask, and the silicon nitride layer 47a, polysilicon layer 46a and base oxide film layer 45a are patterned. Thereby, the base oxide film 45, polysilicon film 46 and silicon nitride film 47 are formed, as shown in FIG. 77. Using these films as a mask, the thermal oxidation technique is used to form the thermal oxide films 31 of about 2000 Å in thickness as shown in FIG. 78. Thereafter, the silicon nitride film 47, polysilicon film 46 and base oxide film 45 are removed. Thereby, the thermal oxide films 31 shown in FIG. 77 is completed.

Figure 80:
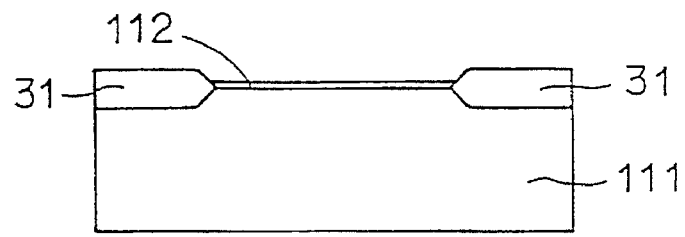

Then, as shown in FIG. 80, the surface of the semiconductor substrate 111 is subjected to the thermal oxidation, whereby the first gate oxide film 112 of about 120 Å in thickness is formed.

Figure 81:
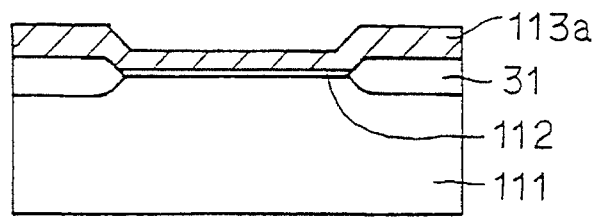
Figure 82:
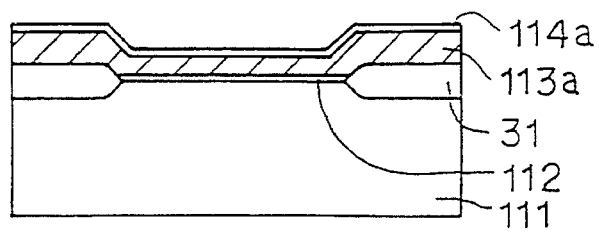
Figure 83:
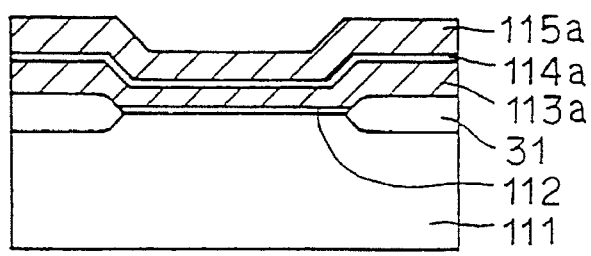

As shown in FIG. 81, a floating gate electrode layer 113a of poiysilicon is formed at a thickness of about 2000 Å on the whole surface. As shown in FIG. 82, an insulating film layer 114a of about 300 Å in thickness is formed on the floating gate electrode layer 113a. As shown in FIG. 83, a control gate electrode layer 115a of polysilicon is formed at a thickness of about 3000 Å on the insulating film layer 114a.

Figure 84:
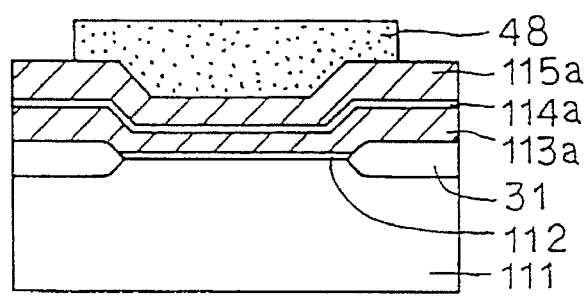
Figure 85:
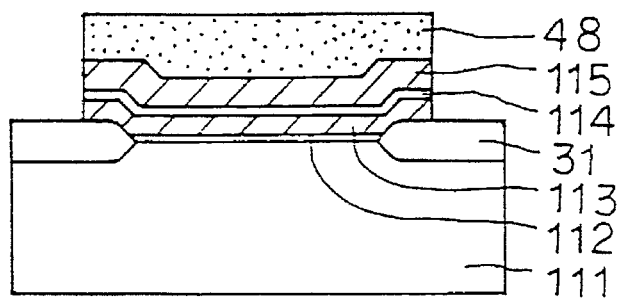

As shown in FIG. 84, a resist 48 is formed on a predetermined region of the control gate electrode layer 115a. Using the resist 48 as a mask, anisotropic etching is applied to the control gate electrode layer 115a, insulating film layer 114a and floating gate electrode layer 113a. Thereby, the first gate oxide film 112, floating gate electrode 113, insulating film 114 and control gate electrode 115 are formed as shown in FIG. 85.

Figure 86:
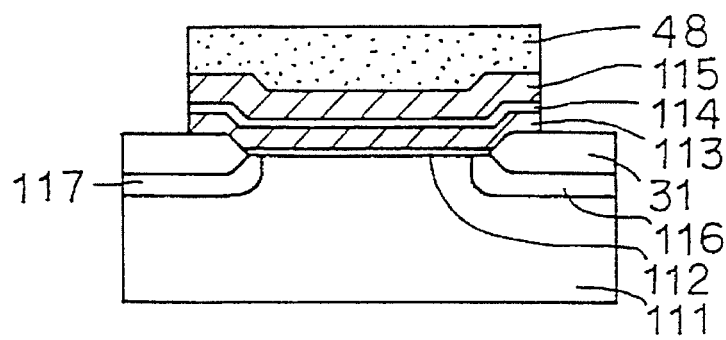
Figure 87:
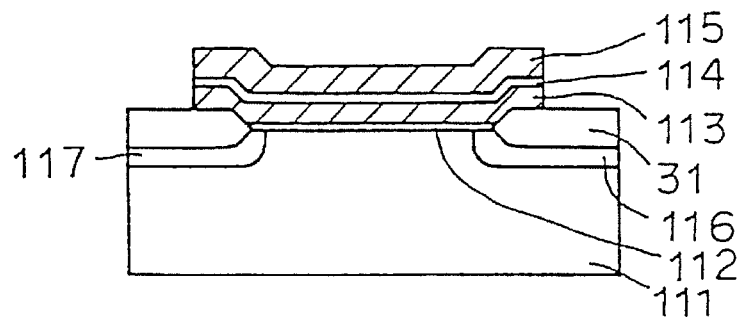
Figure 88:
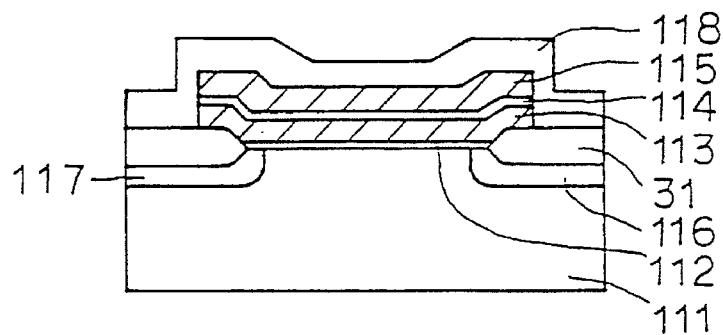
Figure 89:
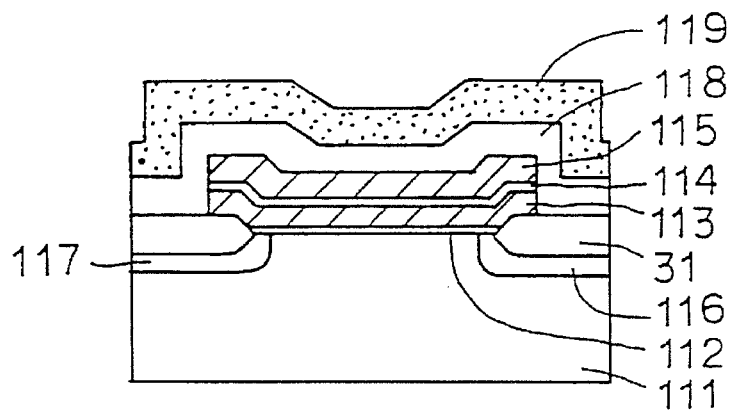

As shown in FIG. 86, using the resist 48 as a mask, As ion is implanted through the thermal oxide films 31 into the semiconductor substrate 111 under the implantation condition of about $3 \times 10^{15}/cm^2$. Thereafter, the thermal diffusion technique is used to thermally diffuse the impurity. Thereby, the drain impurity diffusion layer 116 and source impurity diffusion layer 117 are formed. Thereafter, the resist 48 is removed, and the configuration shown in FIG. 87 is formed Then, as shown in FIG. 88, the thermal oxide films 31, floating gate electrode 113 and control gate electrode 115 are covered with the interlayer thermal oxide film 118. Thereafter, as shown in FIG. 89, the interlayer thermal oxide film 118 is covered with the interlayer insulating film 119 containing phosphorus or boron.

Figure 90:
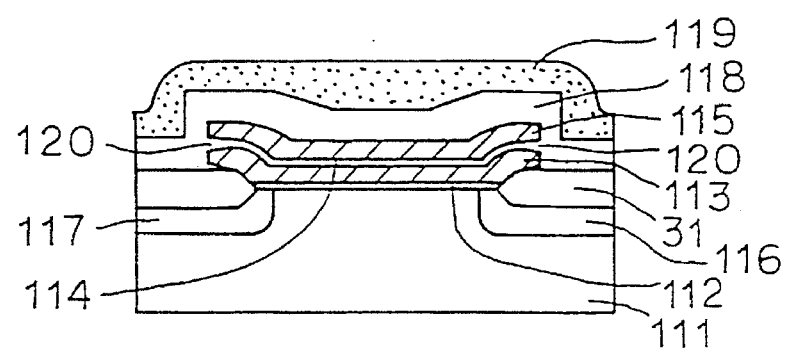

Finally, as shown in FIG. 90, the interlayer insulating film 119 is flattened by the heat treatment in the reflow method. Due to this heat treatment, the oxidizer ($H_2O$) moves through the interlayer thermal oxide film 118 to the vicinities of the semiconductor substrate 111, floating gate electrode 113 and control gate electrode 115. Thereby, the gate bird's beak oxide films 120 are formed between the thermal oxide films 31 and the lower ends of the floating gate electrode 113, and between the upper ends of the floating gate electrode 113 and the lower ends of the control gate electrode 115. As described above, the gate bird's beak oxide films 120, which are formed at the lower ends of the floating gate electrode 113, are located on the thermal oxide films 31, so that the gate bird's beak oxide films 120 are not formed at the opposite ends of the first gate oxide film 112. Thereby, the good writing and erasing characteristics can be obtained.

Figure 91:
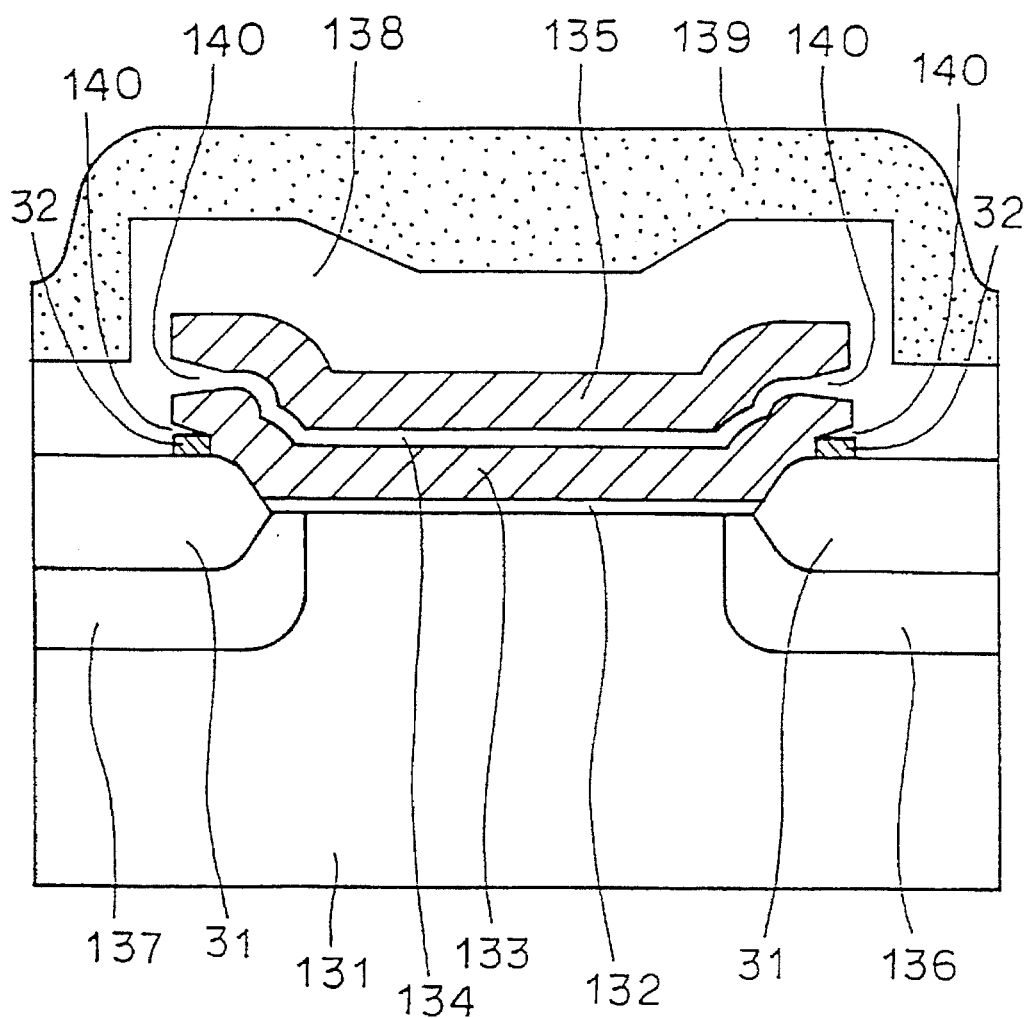
FIG. 91 is a cross section of a Flash EEPROM of a fourteenth embodiment of the invention.

Referring to FIG. 91, the Flash EEPROM of the fourteenth embodiment includes a semiconductor substrate 131 formed of silicon, as well as a drain impurity diffusion layer 136 and a source impurity diffusion layer 137, which are formed on a main surface of the semiconductor substrate 131 and are spaced from each other by a predetermined distance with a channel region therebetween. The Flash EEPROM also includes a first gate oxide film 132 which is formed to a thickness of about 120 Å on the channel region, a predetermined region of the drain impurity diffusion layer 136 and a predetermined region of the source impurity diffusion layer 137, as well as the thermal oxide films 31, which surround the first gate oxide film 132 and have a thickness of about 2000 Å. The Flash EEPROM further includes nitride films 32 formed on predetermined regions of the thermal oxide films 31 and having a thickness of about 1000 Å, a floating gate electrode 133 formed on and along the first gate oxide film 132, thermal oxide films 31 and nitride films 32, a control gate electrode 135 formed on the floating gate electrode 133 with an insulating film 134 therebetween, an interlayer thermal oxide film 138 covering the floating gate electrode 113 and thermal oxide film 31, and an interlayer insulating film 139 covering the interlayer thermal oxide film 138 and containing the impurity such as phosphorus. Gate bird's beak oxide films 140, which are formed by the entry of oxidizer ($H_2O$) during the heat treatment of the interlayer insulating film 139, are located between the upper surfaces of the nitride films 32 and the lower ends of the floating gate electrode 133, and between the upper ends of the floating gate electrode 133 and the lower ends of the control gate electrode 135.

In this embodiment, the thermal oxide films 31 surround the first gate oxide film 132, and the nitride films 32 are formed on the thermal oxide films 31. The floating gate electrode 133 has the opposite ends protruded over the thermal oxide films 31 and nitride films 32. Owing to this construction, the gate bird's beak oxide films 140, which are formed at the lower ends of the floating gate electrode 133, are located on the upper surfaces of the nitride films 32. Thereby, it is possible to effectively prevent the formation of the gate bird's beak oxide film 140 at the regions of the first gate oxide film 132, which are located on the drain impurity diffusion layer 136 and the source impurity diffusion layer 137. Thereby, the over-erased state, which may be caused in the data erasing operation, and the drain disturb phenomenon, which may be caused in the data writing operation, are suppressed. The thermal oxide films 31 have the molecular density and inter-molecular force higher than those of a conventional CVD oxide film, and thus have a property that the oxidizer cannot easily pass therethrough. Also, the nitride films 32 have a property that the oxidizer cannot easily pass therethrough. Therefore, it is possible to effectively prevent the oxidizer from moving into the opposite ends of the first gate oxide film 132 during the heat treatment of the interlayer insulating film 139.

Referring to FIGS. 92–98, a manufacturing process of the Flash EEPROM of the fourteenth embodiment will be described below.

Figure 92:
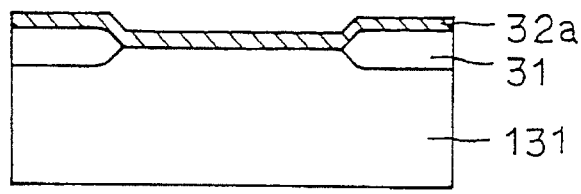
FIGS. 92–98 are cross sections showing first to seventh steps of a manufacturing process of a Flash EEPROM of a fourteenth embodiment shown in FIG. 91, respectively.
Figure 93:
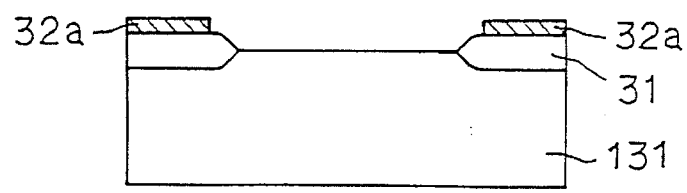
Figure 94:
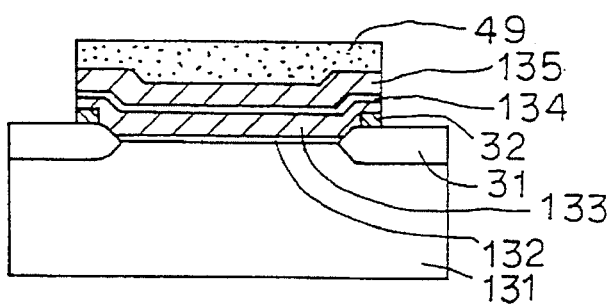

A process similar to the manufacturing process of the thirteenth embodiment, which has been already described with reference to FIGS. 73–79, is used to form the thermal oxide films 31 shown in FIG. 92. Thereafter, a nitride film layer 32a having a thickness of about 1000 Å is formed on the whole surface by the CVD method. As shown in FIG. 93, the photolithography and dry etching are used to pattern the nitride film layer 32a. Then, a process similar to the manufacturing process of the thirteenth embodiment, which has been already described with reference to FIGS. 80–85, is used to complete the construction of the fourteenth embodiment shown in FIG. 94.

Figure 95:
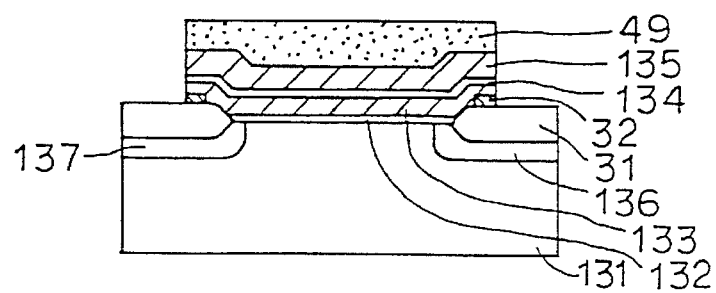

Then, as shown in FIG. 95, using the resist 49 as a mask, As ion is implanted through the thermal oxide films 31 into the semiconductor substrate 131 under the implantation condition of about $3 \times 10^{15}/cm^2$. Thereafter, the thermal diffusion technique is used to diffuse the impurity. Thereby, the drain impurity diffusion layer 136 and source impurity diffusion layer 137 are formed.

Figure 96:
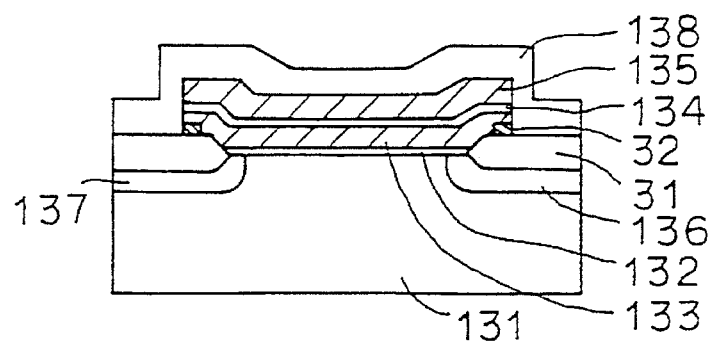
Figure 97:
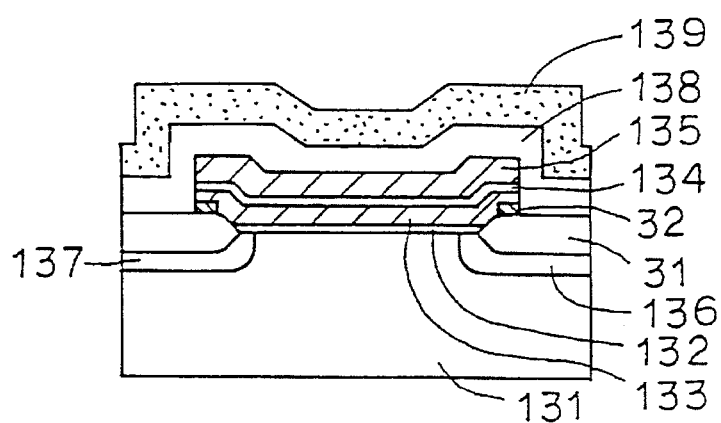

As shown in FIG. 96, the thermal oxide films 31, floating gate electrode 133 and control gate electrode 135 are covered with the interlayer thermal oxide film 138. As shown in FIG. 97, the interlayer thermal oxide film 118 is covered with the interlayer insulating film 119 containing the impurity such as phosphorus.

Figure 98:
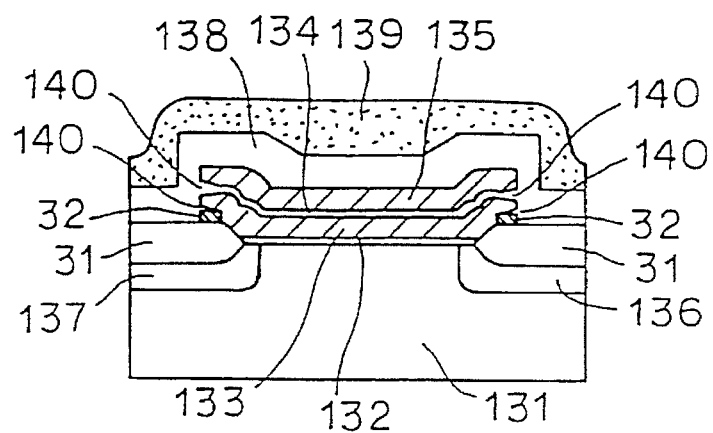

Finally, as shown in FIG. 98, the interlayer insulating film 139 is flattened by the heat treatment in the reflow method. Due to the heat treatment in the reflow method, the oxidizer ($H_2O$) moves through the interlayer thermal oxide film 138 into the semiconductor substrate 131, floating gate electrode 133 and control gate electrode 135. Thereby, the gate bird's beak oxide films 140 are formed between the upper surfaces of the nitride films 32 and the lower ends of the floating gate electrode 133, and between the upper ends of the floating gate electrode 133 and the lower ends of the control gate electrode 135, respectively.

Figure 99:
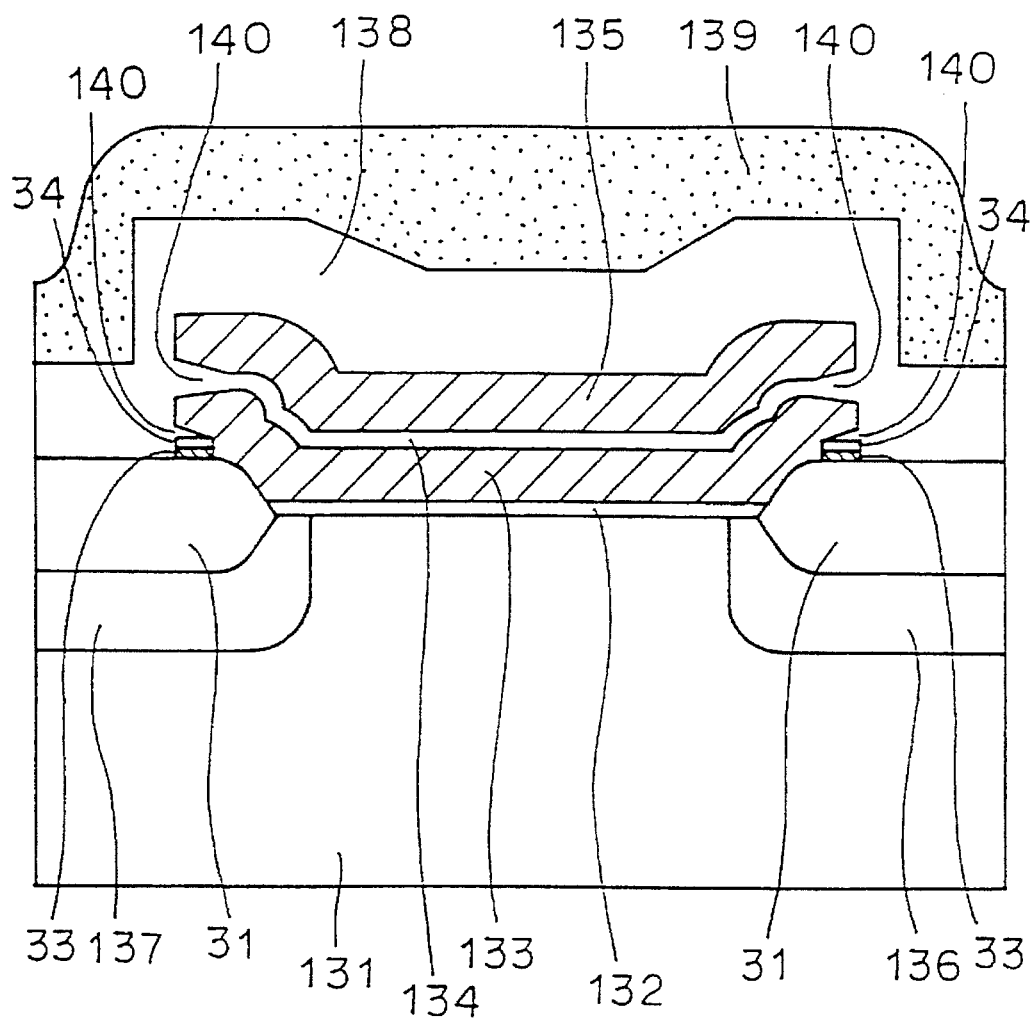
FIG. 99 is a cross section of a Flash EEPROM of a fifteenth embodiment of the invention.

Referring to FIG. 99, the Flash EEPROM of the fifteenth embodiment includes the semiconductor substrate 131 formed of silicon, as well as the drain impurity diffusion layer 136 and the source impurity diffusion layer 137, which are formed on the main surface of the semiconductor substrate 131 and are spaced from each other by a predetermined distance with the channel region therebetween. The Flash EEPROM also includes the first gate oxide film 132 which is formed to a thickness of about 120 Å on the channel region, a predetermined region of the drain impurity diffusion layer 136 and a predetermined region of the source impurity diffusion layer 137, the thermal oxide films 31, which surround the first gate oxide film 132 and have a thickness of about 2000 Å. The Flash EEPROM further includes the nitride films 33 formed on predetermined regions of the thermal oxide films 31 and having a thickness of about 500 Å, oxide films 34 formed on the nitride films 33 and having a thickness of about 500 Å, a floating gate electrode 133 formed on and along the first gate oxide film 132, thermal oxide films 31, nitride films 33 and the oxide films 34, a control gate electrode 135 formed on the floating gate electrode 133 with the insulating film 134 therebetween, the interlayer thermal oxide film 138 covering the control gate electrode 135, floating gate electrode 133 and thermal oxide films 31, and the interlayer insulating film 139 covering the interlayer thermal oxide film 138 and containing the impurity such as phosphorus. Gate bird's beak oxide films 140, which are formed by the entry of oxidizer ($H_2O$) during the heat treatment of the interlayer insulating film 139, are located between the upper surfaces of the oxide films 34 and the lower ends of the floating gate electrode 133, and between the upper ends of the floating gate electrode 133 and the lower ends of the control gate electrode 135.

In this fifteenth embodiment, the floating gate electrode 133 has the opposite ends protruded over and along the thermal oxide films 31, nitride films 33 and oxide films 34. Owing to this construction, the gate bird's beak oxide films 140, which are formed at the lower ends of the floating gate electrode 133, are located on the oxide films 34. This construction effectively prevents the formation of the gate bird's beak oxide film 140 at the regions of the first gate oxide film 132, which are located above the drain impurity diffusion layer 136 and source impurity diffusion layer 137. Therefore, the over-erased state in the data erasing operation and the drain disturb phenomenon in the data writing operation, can be suppressed. Thereby, the Flash EEPROM has the good writing and erasing characteristics. The thermal oxide films 31 have the molecular density and intermolecular force higher than those of a conventional CVD oxide film, and thus have a property that the oxidizer cannot easily pass therethrough. The nitride films 33 also have the property that the oxidizer cannot easily pass therethrough. The oxide films 34 serve to improve the adherence between the nitride films 34 and the floating gate electrode 133.

Referring to FIGS. 100–105, a manufacturing process of the Flash EEPROM of the fifteenth embodiment will be described below.

Figure 100:
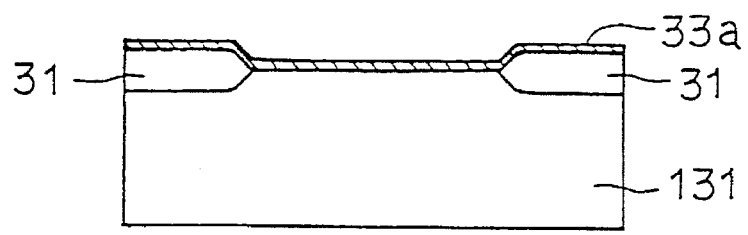
FIGS. 100–105 are cross sections showing first to sixth steps of a manufacturing process of a Flash EEPROM of a fifteenth embodiment shown in FIG. 99, respectively.

A process similar to the manufacturing process of the thirteenth embodiment, which has been already described with reference to FIGS. 73–79, is used to form the thermal oxide films 31 shown in FIG. 100. Thereafter, a nitride film layer 33a having a thickness of about 500 Å is formed by the CVD method.

Figure 101:
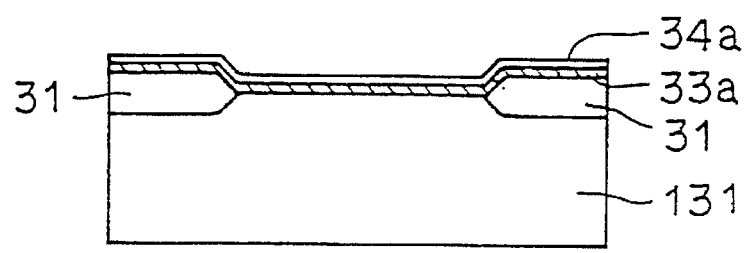
Figure 102:
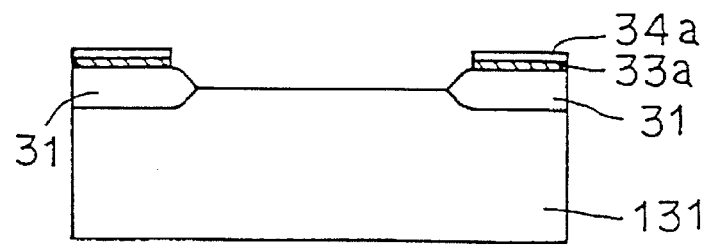
Figure 103:
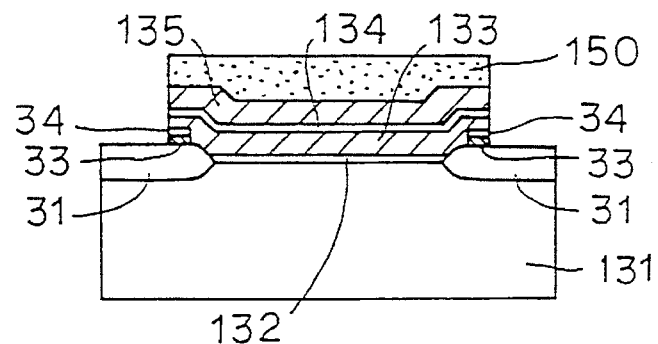
Figure 104:
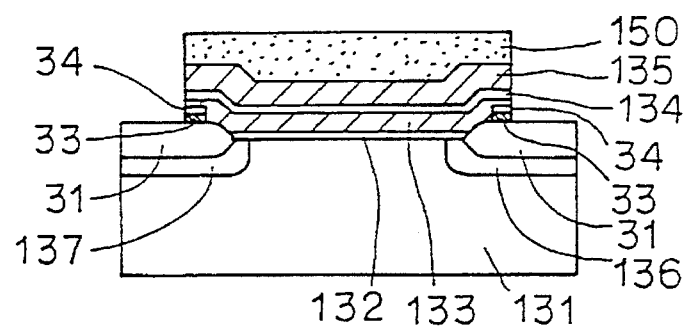
Figure 105:
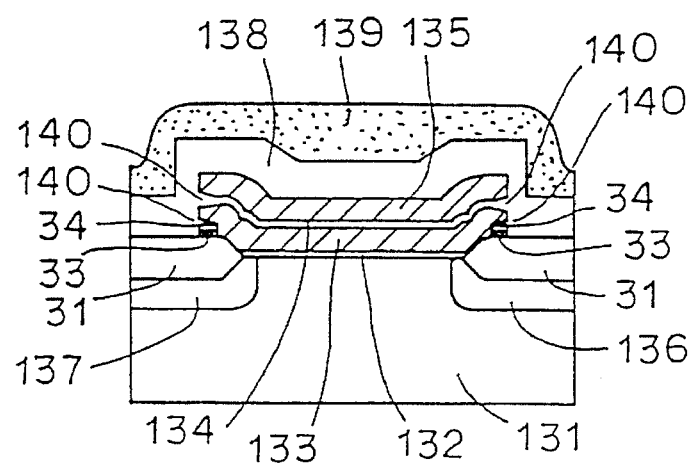
Figure 106:
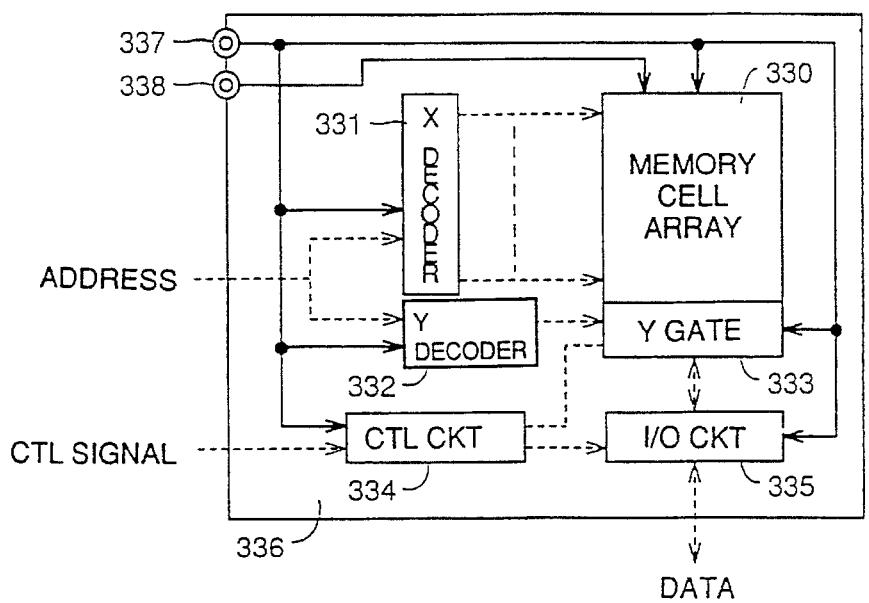
FIG. 106 is a block diagram showing a general structure of a conventional Flash EEPROM.
Figure 107:
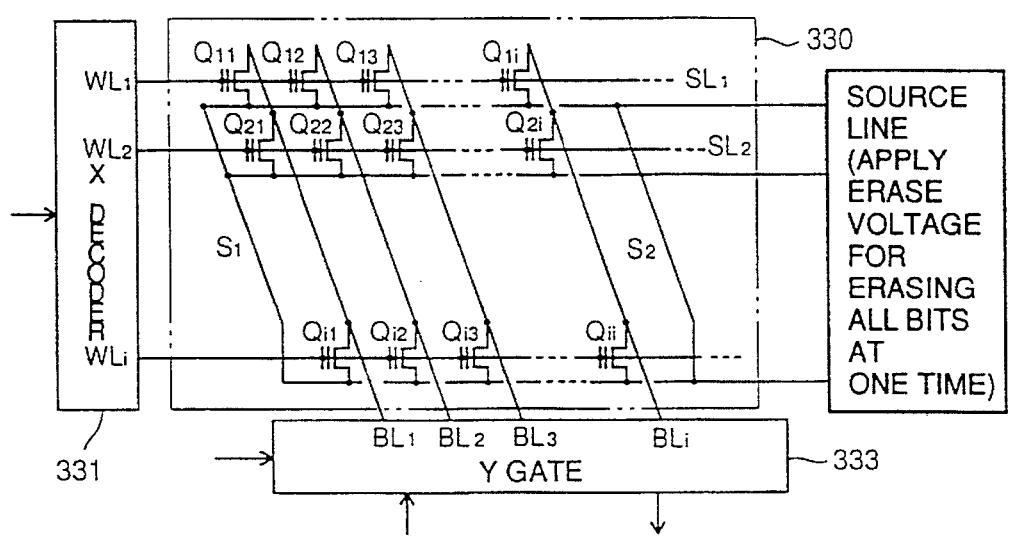
FIG. 107 is an equivalent circuit diagram showing a schematic structure of a conventional memory cell array 330 shown in FIG. 106.
Figure 108:
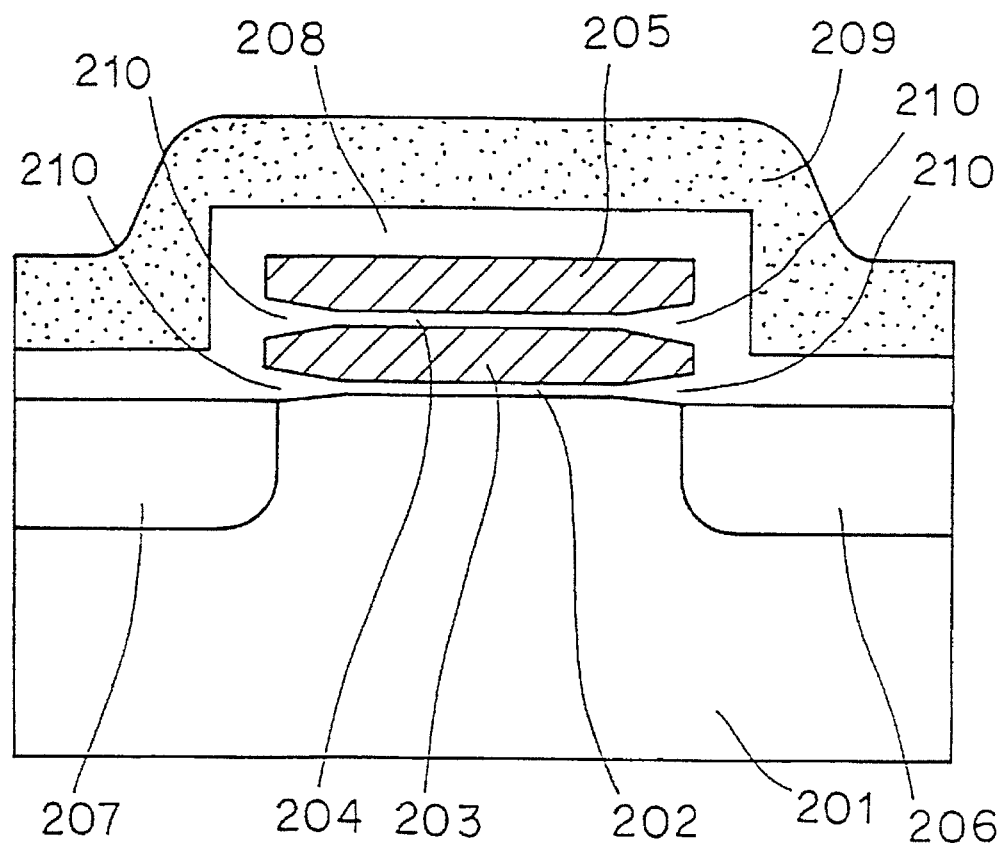
FIG. 108 is a cross section of a Flash EEPROM in the prior art.
Figure 109:
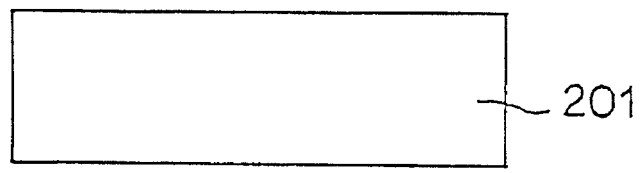
FIGS. 109–118 are cross sections showing first to tenth steps of a manufacturing process of a Flash EEPROM in the prior art shown in FIG. 108, respectively.
Figure 110:
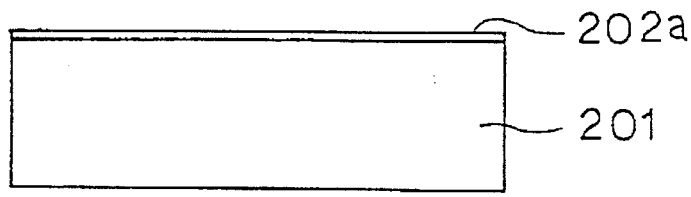
Figure 111:
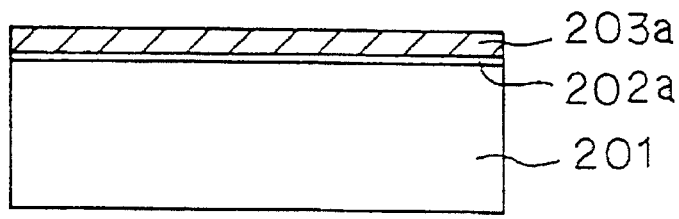
Figure 112:
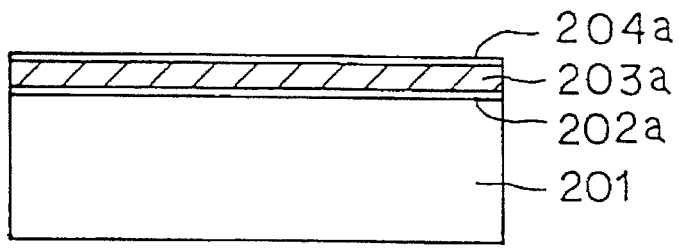
Figure 113:
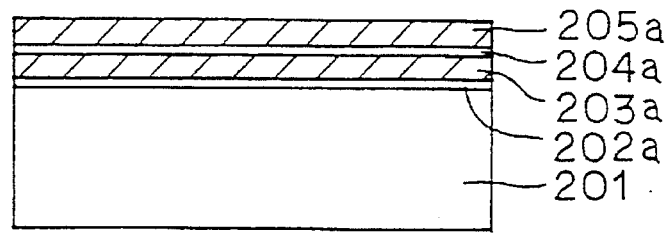
Figure 114:
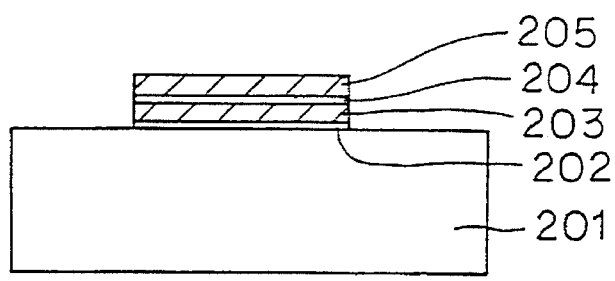
Figure 115:
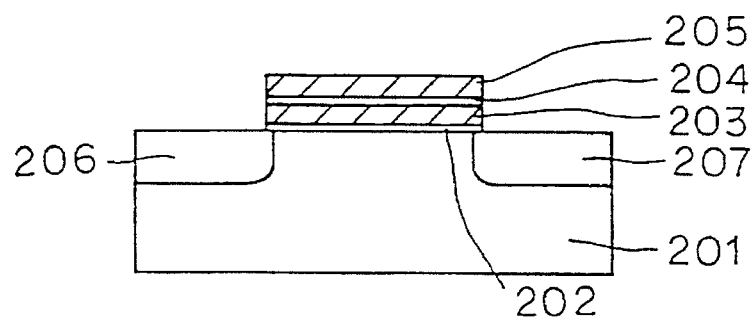
Figure 116:
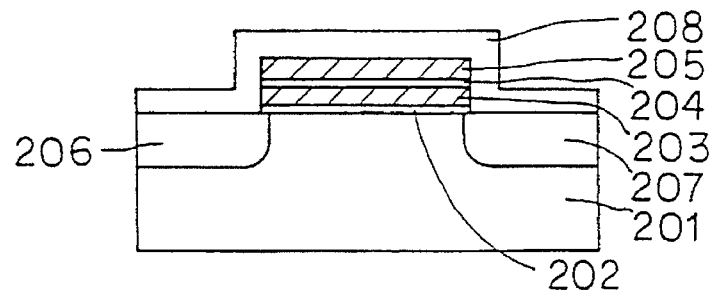
Figure 117:
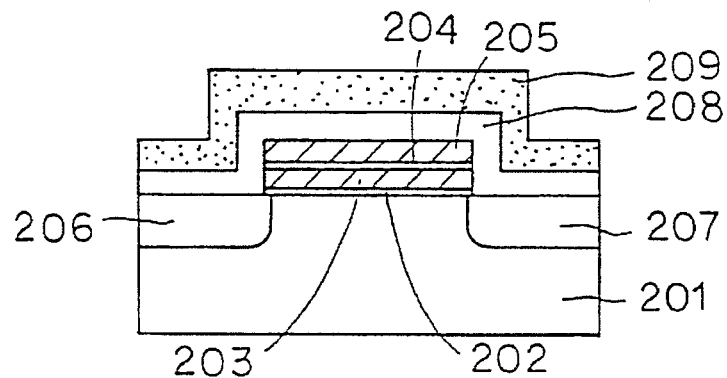
Figure 118:
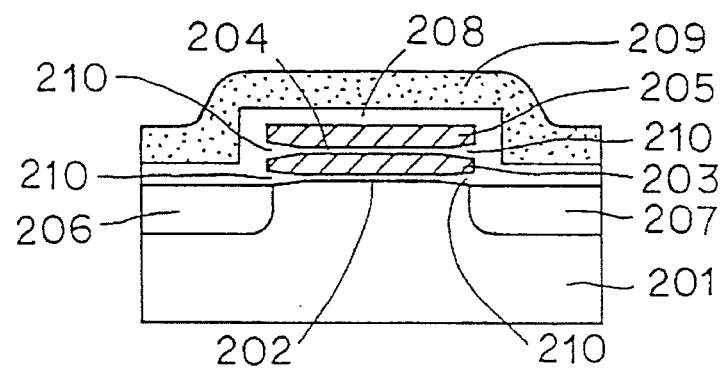
Figure 119:
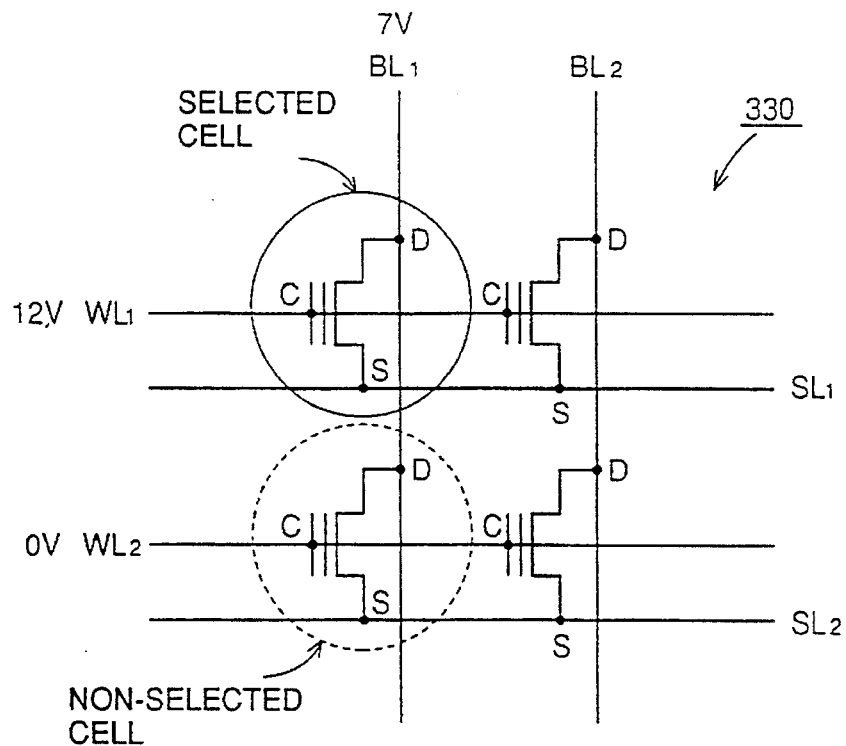
FIG. 119 is an equivalent circuit diagram for explaining the drain disturb phenomenon in a conventional Flash EEPROM.
Figure 120:
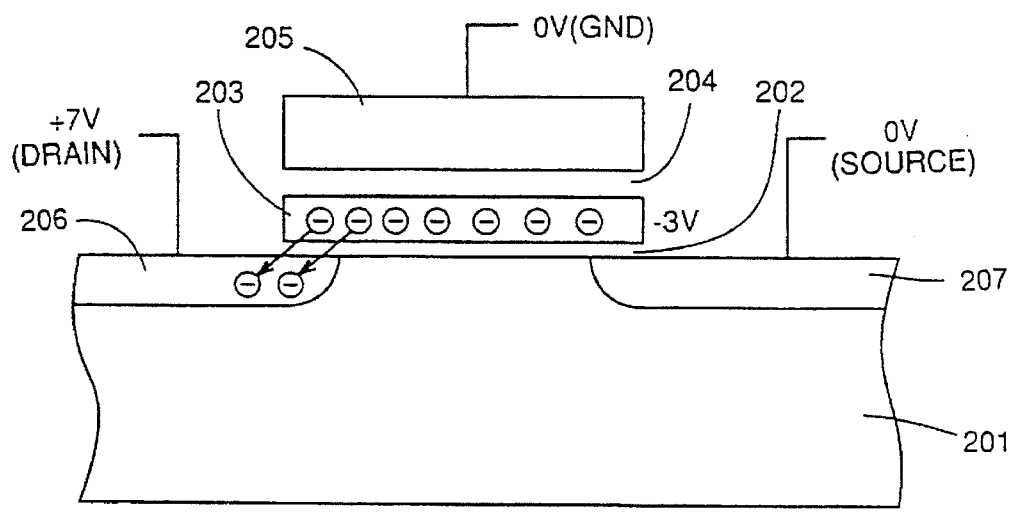
FIG. 120 is a cross section for explaining the drain disturb phenomenon of conventional FN tunneling.
Figure 121:
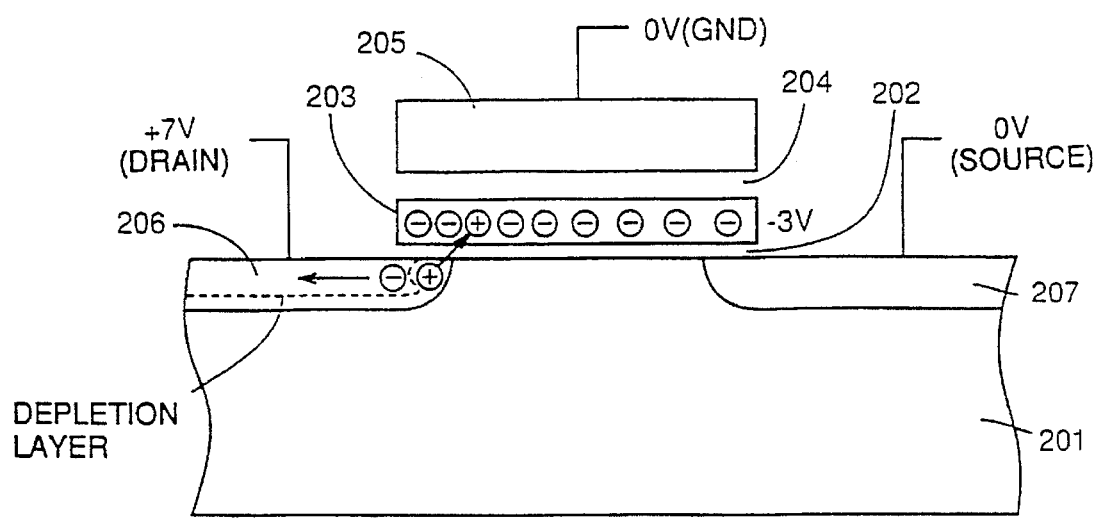
FIG. 121 is a cross section for explaining the conventional drain disturb phenomenon by tunneling between bands.

As shown in FIG. 101, a nitride film layer 34a having a thickness of about 500 Å is formed on the oxide film layer 33a by the CVD method. The photolithography and dry etching are used to pattern the nitride film layer 33a and oxide film layer 34a to obtain the pattern shown in FIG. 102. Then, a process similar to the manufacturing process of the thirteenth embodiment, which has been already described with reference to FIGS. 80–85, is used to obtain the construction of the Flash EEPROM of the fifteenth embodiment shown in FIG. 103.

Then, as shown in FIG. 204, using a resist 150 as a mask. As ion is implanted into the semiconductor substrate 131 under the implantation condition of about $3\times10^{15}/cm^2$. Thereafter, the thermal diffusion technique is used to diffuse the impurity. Thereby, the drain impurity diffusion layer 136 and source impurity diffusion layer 137 are formed. Then, a process similar to the manufacturing process of the thirteenth embodiment, which has been already described with reference to FIGS. 87–90, is used to complete the Flash EEPROM of the fifteenth embodiment shown in FIG. 105.

In the second to fifteenth embodiment described above, nitride films and the like are formed on both of the drain and source impurity diffusion layers. However, the present invention is not limited thereto and nitride film or the like may be formed only on the drain impurity diffusion layers such as shown in the modification of the first embodiment of FIG. 14, or the nitride film or the like may be formed only on the source impurity diffusion layer.

According to the semiconductor memory device of the invention, one pair of the impurity regions of a second conductivity type, which are spaced from each other by the predetermined distance with the channel region therebetween, are formed on the main surface of the semiconductor substrate, the first insulating film having the first thickness is formed at least on the channel region, the second insulating film having the second thickness larger than the first thickness is formed at least on the predetermined region of one of the impurity regions, and the charge accumulating electrode is formed on the first insulating film and the second insulating film. Therefore, the gate bird's beak oxide film formed by the entry of the oxidizer during the heat treatment of the interlayer insulating film, which is formed in the later step, are located between the upper surface of the second insulating film and the lower end of the charge accumulating electrode. Thereby, it is possible to prevent the formation of the gate bird's beak oxide film at the region of the first insulating film through which the electrons move in the data erasing and writing operations. Consequently, the good writing and erasing characteristics can be obtained. Further, the second insulating film may have the tapered shape converging toward the channel region, in which case the field concentration at the boundary region between the first insulating film and the second insulating film can be suppressed. Further, the second insulating film may be formed of the first film, which serves to prevent entry of the oxidizer, and the second film, which serves to improve the adherence of the first film with respect to at least one of the charge accumulating electrode and the semiconductor substrate, in which case the movement of the oxidizer into the first insulating film can be prevented more effectively, and the formation of the gate bird's beak oxide film at the first insulating film can be prevented more effectively.

According to the semiconductor memory device of another aspect of the invention, one pair of the impurity regions of the second conductivity type, which are spaced from each other by the predetermined distance with the channel region therebetween, are formed on the main surface of the semiconductor substrate, the first insulating film is formed at least on the channel region, the oxidizer entry preventing film for intercepting passage of electrons between the charge storage electrode and a pair of impurity regions at the time of writing and erasing of information and for preventing entrance of oxidizer is formed at least on the predetermined region of one of the impurity regions, and the charge accumulating electrode is formed on the first insulating film and the oxidizer entry preventing film. Therefore, the oxidizer entry preventing film prevents the movement of the oxidizer into the first insulating film during the heat treatment of the interlayer insulating film in the later step. Thereby, it is possible to prevent the formation of the gate bird's beak oxide film at the region of the first insulating film through which the electrons move in the data erasing and writing operations. Consequently, the good writing and erasing characteristics can be obtained.

According to the manufacturing method of the semiconductor memory device of the invention, the first insulating layer having the first thickness is formed at least on that region on which the channel region is formed, of the main surface of the semiconductor substrate, the second insulating layer having the second thickness larger than the first thickness is formed at least on the predetermined region of that region on which one of the impurity regions is formed, of the main surface of the semiconductor substrate, the charge accumulating electrode is formed on the first insulating layer and the second insulating layer, and the control electrode layer is formed on the charge accumulating electrode layer with the third insulating layer therebetween. The control electrode layer, third insulating layer, charge accumulating electrode layer and second insulating layer are patterned to form the control electrode and the charge accumulating electroder the impurity is implanted into the semiconductor substrate to form a pair of the impurity regions of the second conductivity type in the self-alignment manner, using the control electrode and charge accumulating electrode as a mask. Thereby, the gate bird's beak oxide film formed by the entry of the oxidizer during the heat treatment of the interlayer insulating film, which is formed in the later step, is located between the upper surface of the second insulating layer and the lower end of the charge accumulating electrode. Thereby, it is possible to effectively prevent the formation of the gate bird's beak oxide film at the region of the first insulating film through which the electron moves in the data erasing and writing operations. Further, the control electrode layer, third insulating layer, charge accumulating electrode layer and second insulating layer are patterned collectively and simultaneously, and then are used as a mask for forming the paired impurity diffusion regions in the self-alignment manner. Therefore, a pair of the impurity diffusion regions can be easily formed.

According to the manufacturing method of the semiconductor memory device of further another aspect of the invention, the first insulating layer is formed at least on that region on which the channel region is formed, of the main surface of the semiconductor substrate, the oxidizer entry preventing layer for intercepting passage of electrons between the charge storage electrode and a pair of impurity regions at the time of writing and erasing of information and for preventing entrance of oxidizer is formed on the predetermined region of that region on which one of the impurity regions is formed, of the main surface of the semiconductor substrate, the charge accumulating electrode layer is formed on the first insulating layer and the oxidizer entry preventing layer, the control electrode layer is formed on the charge accumulating electrode layer with the second insulating layer therebetween, the control electrode layer, second insulating layer, charge accumulating electrode layer and oxidizer entry preventing layer are patterned to form the control electrode and the charge accumulating electrode, and a pair of the impurity regions of the second conductivity type is formed, using the control electrode and charge accumulating electrode as a mask. Therefore, the oxidizer entry preventing layer prevents the movement of the oxidizer into the first insulating layer during the heat treatment of the interlayer insulating layer, which is formed in the later step. Thereby, it is possible to effectively prevent the formation of the gate bird's beak oxide film at the region of the first insulating layer through which the electrons move in the data erasing and writing operations.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor memory device including a semiconductor substrate of a first conductivity type having a main surface, a pair of impurity regions of a second conductivity type formed on said main surface of said semiconductor substrate and spaced from each other by a distance with a channel region therebetween, a charge accumulating electrode, and a control electrode, comprising the steps of:

forming a first insulating layer having a first thickness and formed at least on that region of said main surface of said semiconductor substrate on which said channel region is formed;

forming a second insulating layer having a second thickness larger than said first thickness at least on a region, on which one of said impurity regions is formed, of said main surface of said semiconductor substrate;

forming a charge accumulating electrode layer on said first insulating layer and said second insulating layer;

forming a control electrode layer on said charge accumulating electrode layer with a third insulating layer therebetween;

patterning said control electrode layer, said third insulating layer, said charge accumulating electrode layer and said second insulating layer to form said control electrode and said charge accumulating electrode; and implanting impurity into said semiconductor substrate, using said control electrode and said charge accumulating electrode as a mask, to form said pair of impurity regions of said second conductivity type.

2. A manufacturing method of a semiconductor memory device according to claim 1, wherein said step of forming said second insulating layer includes the step of forming said second insulating layer to surround said first insulating layer.

3. A manufacturing method of a semiconductor memory device according to claim 1, wherein said step of forming said second insulating layer includes the step of forming said second insulating film which has a tapered shape of which thickness reduces toward said channel region.

4. A manufacturing method of a semiconductor memory device according to claim 1, wherein said second insulating film is formed of a first film for preventing entry of oxidizer and a second film for improving an adherence between said first film and at least one of said charge accumulating electrode and said semiconductor substrate.

5. A manufacturing method of a semiconductor memory device according to claim 1, wherein said second insulating layer includes at least one film selected from the group consisting of a nitride film, and a CVD oxide film or a thermal oxide film.

6. A manufacturing method of a semiconductor memory device including a semiconductor substrate of a first conductivity type having a main surface, a pair of impurity regions of a second conductivity type formed on said semiconductor substrate with a channel region therebetween, a charge accumulating electrode, and a control electrode, comprising the steps of:

forming a first insulating layer at least on that region of said main surface of said semiconductor substrate on which said channel region is formed;

forming an oxidizer entry preventing layer for intercepting passage of electrons between said charge storage electrode and said pair of impurity regions at the time of writing and erasing of information and for preventing entrance of oxidizer at least on a region on which one of said impurity regions is formed, of said main surface of said semiconductor substrate;

forming said charge accumulating electrode layer on said first insulating layer and said oxidizer entry preventing layer;

forming said control electrode layer on said charge accumulating electrode layer with a second insulating layer therebetween;

patterning said control electrode layer, said second insulating layer, said charge accumulating electrode layer and said oxidizer entry preventing layer to form said control electrode and said charge accumulating electrode; and implanting impurity into said semiconductor substrate, using said control electrode and said charge accumulating electrode as a mask, to form said pair of impurity regions of said second conductivity type.

7. A manufacturing method of a semiconductor memory device according to claim 6, wherein said step of forming said oxidizer entry preventing layer includes the step of forming said oxidizer entry preventing layer to surround said first insulating layer.

8. A manufacturing method of a semiconductor memory device according to claim 6, wherein said oxidizer entry preventing layer has a thickness larger than that of said first insulating layer.

9. A manufacturing method of a semiconductor memory device according to claim 6, wherein said oxidizer entry preventing layer has a tapered shape of which thickness reduces toward said channel region.

10. A manufacturing method of a semiconductor memory device according to claim 4, wherein said oxidizer entry preventing layer includes at least one film selected from the group consisting of a nitride film and a thermal oxide film.

11. A manufacturing method of a semiconductor memory device including a semiconductor substrate of a first conductivity type having a main surface, a pair of impurity regions of a second conductivity type formed on said main surface of said semiconductor substrate and spaced from each other by a distance with a channel region therebetween, a charge accumulating electrode, and a control electrode, comprising the steps of:

forming a first insulating layer having a first thickness at least on a first region on which one of said impurity regions is to be formed in said main surface of said semiconductor substrate;

forming a second insulating layer having a second thickness smaller than the first thickness and formed at least on a second region of said main surface of said semiconductor substrate on which said channel region is formed, said second insulating layer being of a different material than said first insulating layer;

forming a charge accumulating electrode layer on said first insulating layer and said second insulating layer;

forming a control electrode layer on said charge accumulating electrode layer with a third insulating layer therebetween;

patterning said control electrode layer, said third insulating layer, said charge accumulating electrode layer and said second insulating layer to form said control electrode and said charge accumulating electrode; and implanting impurity into said semiconductor substrate, using said control electrode and said charge accumulating electrode as a mask, to form said pair of impurity regions of said second conductivity type.

12. A manufacturing method of a semiconductor memory device including a semiconductor substrate of a first conductivity type having a main surface, a pair of impurity regions of a second conductivity type formed on said main surface of said semiconductor substrate and spaced from each other by a distance with a channel region therebetween, a charge accumulating electrode, and a control electrode, comprising the steps of:

forming a first insulating layer having a first thickness at least on a first region on which one of said impurity regions is to be formed in said main surface of said semiconductor substrate;

forming a second insulating layer having a second thickness smaller than the first thickness and formed at least on a second region of said main surface of said semiconductor substrate on which said channel region is formed, said second insulating layer being separately formed as a separate process step than said step of forming said first insulating layer;

forming a charge accumulating electrode layer on said first insulating layer and said second insulating layer;

forming a control electrode layer on said charge accumulating electrode layer with a third insulating layer therebetween;

patterning said control electrode layer, said third insulating layer, said charge accumulating electrode layer and said second insulating layer to form said control electrode and said charge accumulating electrode; and implanting impurity into said semiconductor substrate, using said control electrode and said charge accumulating electrode as a mask, to form said pair of impurity regions of said second conductivity type.

13. A manufacturing method of a semiconductor memory device according to claim 12, wherein said step of forming said second insulating layer further comprises the step of forming said second insulating layer of a different material than said first insulating layer.

14. A manufacturing method of a semiconductor memory device according to claim 13, wherein said step of implanting impurity into said semiconductor substrate further comprises the step of implanting impurity into said semiconductor substrate only after said step of patterning said control electrode layer, using said control electrode and said charge accumulating electrode as a mask, to form said pair of impurity regions of said second conductivity type.

15. A manufacturing method of a semiconductor memory device including a semiconductor substrate of a first conductivity type having a main surface, a pair of impurity regions of a second conductivity type formed on said main surface of said semiconductor substrate and spaced from each other by a distance with a channel region therebetween, a charge accumulating electrode, and a control electrode, comprising the steps of:

forming a first insulating layer having a first thickness at least on a first region on which one of said impurity regions is to be formed in said main surface of said semiconductor substrate;

forming a second insulating layer having a second thickness smaller than the first thickness and formed at least on a second region of said main surface of said semiconductor substrate on which said channel region is formed, said second insulating layer being of a different material than said first insulating layer;

forming a charge accumulating electrode layer on said first insulating layer and said second insulating layer;

forming a control electrode layer on said charge accumulating electrode layer with a third insulating layer therebetween;

patterning said control electrode layer, said third insulating layer, said charge accumulating electrode layer and said second insulating layer to form said control electrode and said charge accumulating electrode; and implanting impurity into said semiconductor substrate only after said step of patterning said control electrode layer, using said control electrode and said charge accumulating electrode as a mask, to form said pair of impurity regions of said second conductivity type.

16. A manufacturing method of a semiconductor memory device including a semiconductor substrate of a first conductivity type having a main surface, a pair of impurity regions of a second conductivity type formed on said semiconductor substrate with a channel region therebetween, a charge accumulating electrode, and a control electrode, comprising the steps of:

forming a first insulating layer at least on that region of said main surface of said semiconductor substrate on which said channel region is formed;

forming an oxidizer entry preventing layer for intercepting passage of electrons between said charge storage electrode and said pair of impurity regions at the time of writing and erasing of information and for preventing entrance of oxidizer at least on a region on which one of said impurity regions is formed, of said main surface of said semiconductor substrate;

forming said charge accumulating electrode layer on said first insulating layer and said oxidizer entry preventing layer;

forming said control electrode layer on said charge accumulating electrode layer with a second insulating layer therebetween, said second insulating layer being of a different material than said first insulating layer;

patterning said control electrode layer, said second insulating layer, said charge accumulating electrode layer and said oxidizer entry preventing layer to form said control electrode and said charge accumulating electrode; and implanting impurity into said semiconductor substrate, using said control electrode and said charge accumulating electrode as a mask, to form said pair of impurity regions of said second conductivity type.

17. A manufacturing method of a semiconductor memory device including a semiconductor substrate of a first conductivity type having a main surface, a pair of impurity regions of a second conductivity type formed on said semiconductor substrate with a channel region therebetween, a charge accumulating electrode, and a control electrode, comprising the steps of:

forming a first insulating layer at least on that region of said main surface of said semiconductor substrate on which said channel region is formed;

forming an oxidizer entry preventing layer for intercepting passage of electrons between said charge storage electrode and said pair of impurity regions at the time of writing and erasing of information and for preventing entrance of oxidizer at least on a region on which one of said impurity regions is formed, of said main surface of said semiconductor substrate;

forming said charge accumulating electrode layer on said first insulating layer and said oxidizer entry preventing layer;

forming said control electrode layer on said charge accumulating electrode layer with a second insulating layer therebetween, said second insulating layer being separately formed as a separate process step than said step of forming said first insulating layer;

patterning said control electrode layer, said second insulating layer, said charge accumulating electrode layer and said oxidizer entry preventing layer to form said control electrode and said charge accumulating electrode; and implanting impurity into said semiconductor substrate, using said control electrode and said charge accumulating electrode as a mask, to form said pair of impurity regions of said second conductivity type.

18. A manufacturing method of a semiconductor memory device according to claim 17, wherein said step of forming said second insulating layer further comprises the step of forming said second insulating layer of a different material than said first insulating layer.

19. A manufacturing method of a semiconductor memory device according to claim 18, wherein said step of implanting impurity into said semiconductor substrate further comprises the step of implanting impurity into said semiconductor substrate only after said step of patterning said control electrode layer, using said control electrode and said charge accumulating electrode as a mask, to form said pair of impurity regions of said second conductivity type.

20. A manufacturing method of a semiconductor memory device including a semiconductor substrate of a first conductivity type having a main surface, a pair of impurity regions of a second conductivity type formed on said semiconductor substrate with a channel region therebetween, a charge accumulating electrode, and a control electrode, comprising the steps of:

forming a first insulating layer at least on that region of said main surface of said semiconductor substrate on which said channel region is formed;

forming an oxidizer entry preventing layer for intercepting passage of electrons between said charge storage electrode and said pair of impurity regions at the time of writing and erasing of information and for preventing entrance of oxidizer at least on a region on which one of said impurity regions is formed, of said main surface of said semiconductor substrate;

forming said charge accumulating electrode layer on said first insulating layer and said oxidizer entry preventing layer;

forming said control electrode layer on said charge accumulating electrode layer with a second insulating layer therebetween, said second insulating layer being separately formed as a separate process step than said step of forming said first insulating layer;

patterning said control electrode layer, said second insulating layer, said charge accumulating electrode layer and said oxidizer entry preventing layer to form said control electrode and said charge accumulating electrode; and implanting impurity into said semiconductor substrate only after said step of patterning said control electrode layer, using said control electrode and said charge accumulating electrode as a mask, to form said pair of impurity regions of said second conductivity type.

* * * * *